(12) United States Patent
Park et al.

(10) Patent No.: US 12,302,659 B2
(45) Date of Patent: May 13, 2025

(54) PIXEL ARRAY AND AN IMAGE SENSOR INCLUDING THE SAME

(71) Applicant: SAMSUNG ELECTRONICS CO., LTD., Suwon-si (KR)

(72) Inventors: Jonghoon Park, Seoul (KR); Bumsuk Kim, Hwaseong-si (KR); Yunki Lee, Hwaseong-si (KR); Bomi Kim, Yeongju-si (KR); Kwanhee Lee, Hwaseong-si (KR); Yoongi Joung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 755 days.

(21) Appl. No.: 17/402,756

(22) Filed: Aug. 16, 2021

(65) Prior Publication Data

US 2022/0130876 A1 Apr. 28, 2022

(30) Foreign Application Priority Data

Oct. 23, 2020 (KR) .................... 10-2020-0138411
Dec. 2, 2020 (KR) .................... 10-2020-0166867

(51) Int. Cl.
*H01L 23/58* (2006.01)
*H10F 39/00* (2025.01)
(Continued)

(52) U.S. Cl.
CPC ......... *H10F 39/807* (2025.01); *H10F 39/182* (2025.01); *H10F 39/8063* (2025.01);
(Continued)

(58) Field of Classification Search
CPC ........... H01L 27/1463; H01L 27/14627; H01L 27/14645; H01L 27/14621;
(Continued)

(56) References Cited

U.S. PATENT DOCUMENTS 7,745,779 B2 6/2010 Conners
8,976,283 B2 * 3/2015 Ishiwata ........... H01L 27/14645
348/340
(Continued)

FOREIGN PATENT DOCUMENTS

CN 2019-10115397 2/2019

OTHER PUBLICATIONS

US8941766B2 Solid-State Imaging Device, Manufacturing Method Thereof, and Camera With Alternately Arranged Pixel Combinations . . . Hiroaki Ishiwata, Sony Corp; 2015 [Patent not issued, withdrawn Feb. 15, 2015, see attached documentation "8941766 Ishiwata IDS Documentation"] (Year: 2015).*

*Primary Examiner* — Samuel Park
(74) *Attorney, Agent, or Firm* — MORGAN, LEWIS & BOCKIUS LLP

(57) ABSTRACT

A pixel array including: a plurality of pixel groups, each pixel group including: a plurality of unit pixels respectively including photoelectric conversion elements disposed in a semiconductor substrate; trench structures disposed in the semiconductor substrate and extending in a vertical direction from a first surface of the semiconductor substrate to a second surface of the semiconductor substrate to electrically and optically separate the photoelectric conversion elements from each other; and a microlens disposed above or below the semiconductor substrate, the microlens covering all of the photoelectric conversion elements in the plurality of unit pixels to focus an incident light to the photoelectric conversion elements.

14 Claims, 39 Drawing Sheets

(51) Int. Cl.
*H10F 39/18* (2025.01)
*H04N 25/71* (2023.01)
*H04N 25/75* (2023.01)
*H04N 25/77* (2023.01)

(52) U.S. Cl.
CPC .......... *H04N 25/745* (2023.01); *H04N 25/75* (2023.01); *H04N 25/77* (2023.01); *H10F 39/8053* (2025.01); *H10F 39/813* (2025.01)

(58) Field of Classification Search
CPC ......... H01L 27/14641; H01L 27/14605; H01L 27/14612; H01L 27/1464; H04N 25/745; H04N 25/75; H04N 25/77; H04N 25/76; H04N 25/7795; H04N 25/78
See application file for complete search history.

(56) References Cited

U.S. PATENT DOCUMENTS

| | | | |
|---|---|---|---|
| 9,549,157 B2 | 1/2017 | Shinozaki | |
| 9,818,781 B2 | 11/2017 | Lee et al. | |
| 9,911,777 B2 | 3/2018 | Lee et al. | |
| 10,461,109 B2 | 10/2019 | Wu et al. | |
| 10,567,636 B2 | 2/2020 | Galor Gluskin | |
| 2007/0145273 A1* | 6/2007 | Chang | H04N 23/12 348/E9.003 |
| 2015/0243696 A1* | 8/2015 | Chien | H01L 27/14685 257/435 |
| 2015/0350583 A1* | 12/2015 | Mauritzson | H01L 27/14647 257/432 |
| 2016/0043119 A1* | 2/2016 | Lee | H01L 27/1464 257/446 |
| 2016/0043120 A1* | 2/2016 | Ahn | H01L 27/14614 257/229 |
| 2016/0056200 A1* | 2/2016 | Lee | H01L 27/1464 257/292 |
| 2016/0064430 A1* | 3/2016 | Lee | H01L 27/14623 257/292 |
| 2017/0330906 A1* | 11/2017 | Korobov | H01L 27/14689 |
| 2017/0366770 A1* | 12/2017 | Yokogawa | H04N 25/134 |
| 2018/0160067 A1* | 6/2018 | Sakioka | H04N 25/46 |
| 2019/0019835 A1* | 1/2019 | Tanaka | H04N 25/136 |
| 2019/0115388 A1* | 4/2019 | Jung | H10F 39/014 |
| 2019/0165026 A1* | 5/2019 | Kuo | H01L 27/1463 |
| 2019/0371838 A1* | 12/2019 | Takahashi | H01L 27/1464 |
| 2020/0303434 A1* | 9/2020 | Shinohara | H01L 27/14685 |
| 2021/0074747 A1* | 3/2021 | Takahashi | H01L 27/14612 |
| 2022/0052096 A1* | 2/2022 | Lin | H01L 27/1463 |

* cited by examiner

PIXEL ARRAY AND AN IMAGE SENSOR INCLUDING THE SAME

CROSS-REFERENCE TO RELATED APPLICATION

This U.S. non-provisional application claims priority under 35 U.S.C. § 119 to Korean Patent Application No. 10-2020-0138411 filed on Oct. 23, 2020 in the Korean Intellectual Property Office (KIPO) and Korean Patent Application No. 10-2020-0166867 filed on Dec. 2, 2020 in the KIPO, the disclosures of which are incorporated by reference herein in their entireties.

TECHNICAL FIELD

Example embodiments of the present disclosure relate generally to semiconductor integrated circuits, and more particularly to a pixel array and an image sensor including the pixel array.

DISCUSSION OF THE RELATED ART

An image sensor is a sensor that detects and conveys information to make an image. Complementary metal oxide semiconductor (CMOS) image sensors are solid-state sensing devices that use complementary metal oxide semiconductors. CMOS image sensors have lower manufacturing costs and lower power consumption compared with charge-coupled device (CCD) image sensors. For example, CMOS image sensors can be implemented with fewer components than CCD image sensors. In addition, CMOS image sensors may provide faster readout than CCD sensors. Thus CMOS image sensors are used for various electronic appliances including portable devices such as, for example, smart-phones and digital cameras.

A pixel array included in a CMOS image sensor may include a photoelectric conversion element in each pixel. The photoelectric conversion element generates an electrical signal that varies based on the quantity of incident light. The CMOS image sensor processes these electrical signals to synthesize an image. With the recent proliferation of high-resolution images, pixels included in the CMOS image sensor are becoming much smaller. However, when the pixels get smaller, incident light may not be properly sensed or noise may occur due to interference between highly integrated elements.

SUMMARY

Some example embodiments of the present disclosure may provide a pixel array having enhanced optical characteristics and an image sensor including the pixel array.

According to example embodiments of the present disclosure, there is provided a pixel array including: a plurality of pixel groups, each pixel group including: a plurality of unit pixels respectively including photoelectric conversion elements disposed in a semiconductor substrate; trench structures disposed in the semiconductor substrate and extending in a vertical direction from a first surface of the semiconductor substrate to a second surface of the semiconductor substrate to electrically and optically separate the photoelectric conversion elements from each other; and a microlens disposed above or below the semiconductor substrate, the microlens covering all of the photoelectric conversion elements in the plurality of unit pixels to focus an incident light to the photoelectric conversion elements.

According to example embodiments of the present disclosure, there is provided a pixel array including: a plurality of pixel groups, each pixel group including: a plurality of unit pixels respectively including photoelectric conversion elements disposed in a semiconductor substrate; trench structures disposed in the semiconductor substrate and extending in a vertical direction from an upper surface of the semiconductor substrate to a lower surface of the semiconductor substrate to electrically and optically separate the photoelectric conversion elements from each other; a microlens overlapping the semiconductor substrate, the microlens covering all of the photoelectric conversion elements in the plurality of unit pixels; and a color filter disposed between the semiconductor substrate and the microlens and shared by the plurality of unit pixels.

According to example embodiments of the present disclosure, there is provided an image sensor including: a pixel array including a plurality of pixel groups configured to collect photo charges generated by an incident light; a row driver configured to drive the pixel array row by row; and a controller configured to control the pixel array and the row driver, each pixel group including: a plurality of unit pixels respectively including photoelectric conversion elements disposed in a semiconductor substrate; trench structures disposed in the semiconductor substrate and extending in a vertical direction from an upper surface of the semiconductor substrate to a lower surface of the semiconductor substrate to separate the photoelectric conversion elements from each other, and a microlens overlapping the semiconductor substrate, the microlens covering all of the photoelectric conversion elements in the plurality of unit pixels.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
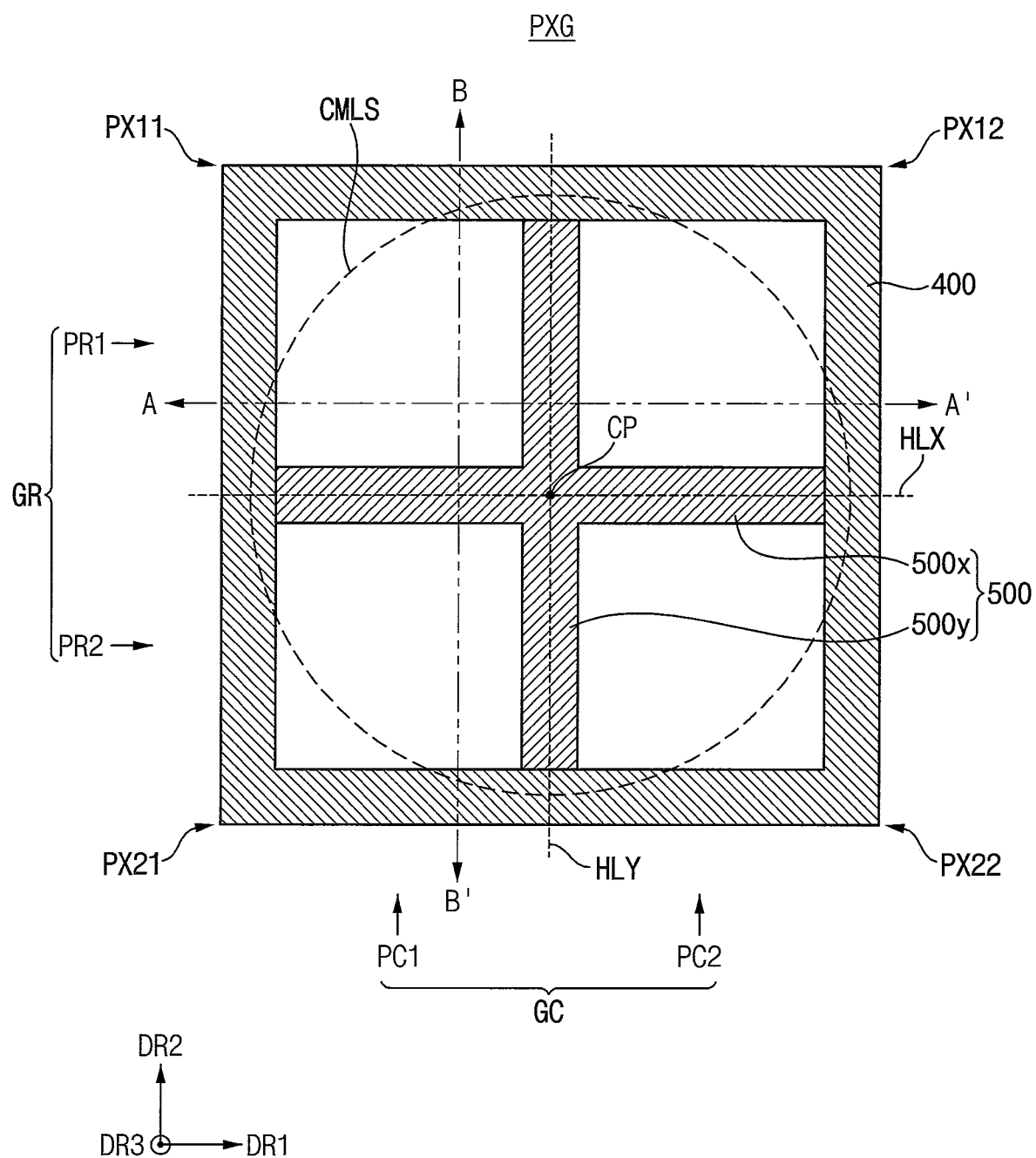
FIG. 1 is a plane view illustrating a layout of a pixel group included in an image sensor according to example embodiments of the present disclosure.

Various example embodiments of the present disclosure will be described more fully hereinafter with reference to the accompanying drawings. In the drawings, like numerals may refer to like elements throughout. The repeated descriptions may be omitted.

Hereinafter, structures according to example embodiments of the present disclosure are described using a first horizontal direction DR1, a second horizontal direction DR2, and a vertical direction DR3 in a three-dimensional space. The first horizontal direction DR1 and the second horizontal direction DR2 may be substantially parallel with an upper surface of a semiconductor substrate and substantially perpendicular to each other. The vertical direction DR3 may be substantially perpendicular to the upper surface of the semiconductor substrate. The first direction DR1 may be a row direction and the second direction DR2 may be a column direction.

A pixel array of an image sensor according to example embodiments of the present disclosure may include a plurality of pixel groups which are formed in a semiconductor substrate. In this disclosure, for convenience of illustration and description, example embodiments are described based on structures corresponding to a back-side illumination (BSI) image sensor such that a light is incident through a lower surface of a semiconductor substrate. However it will be understood that example embodiments of the present disclosure may be applied to structures corresponding to a front-side illumination (FSI) image sensor such that a light is incident through an upper surface of a semiconductor substrate.

Figure 2A:
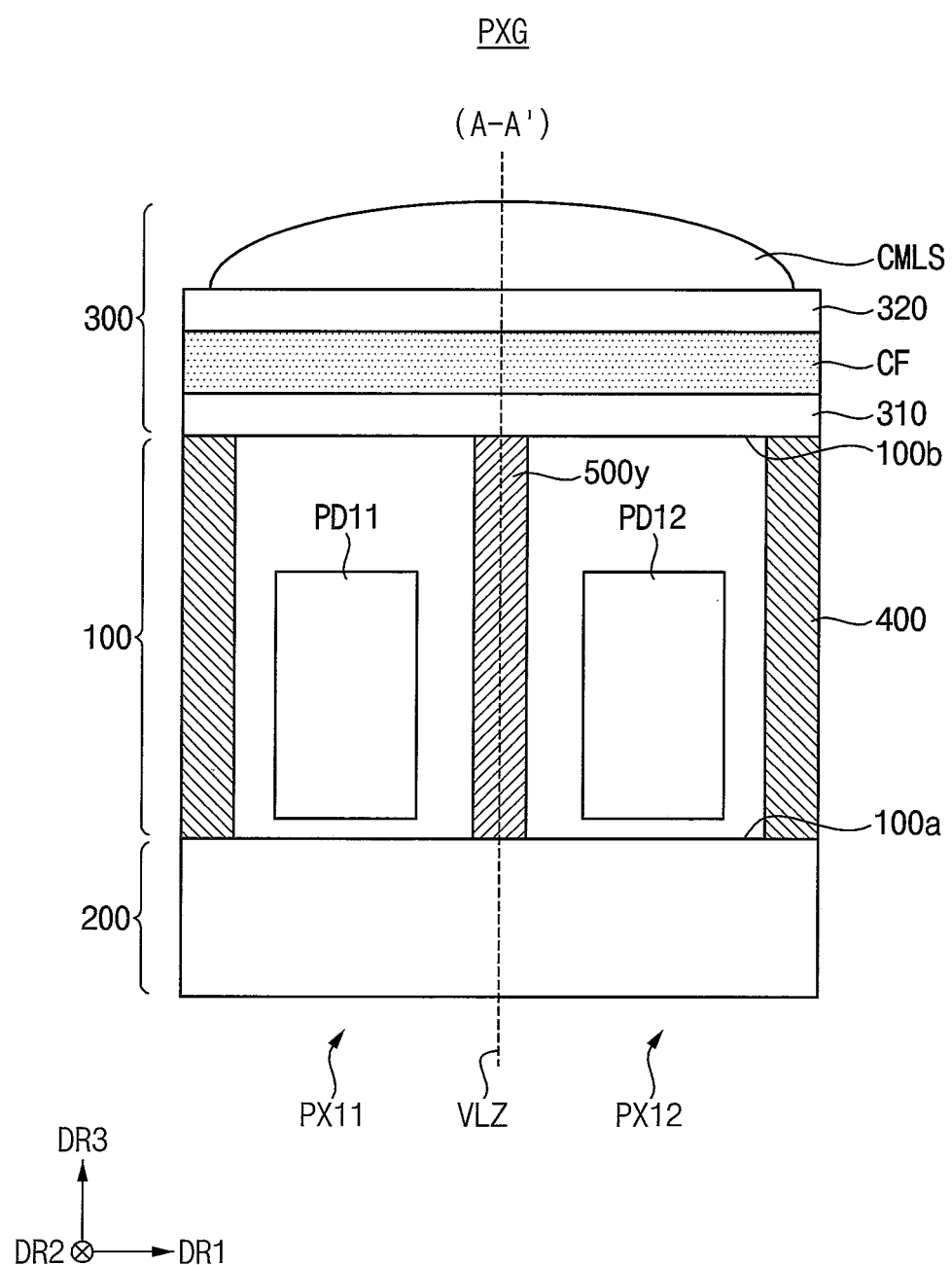
FIGS. 2A, 2B, 2C and 2D are cross-sectional views illustrating vertical structures of a pixel group included in an image sensor according to example embodiments of the present disclosure.
Figure 2B:
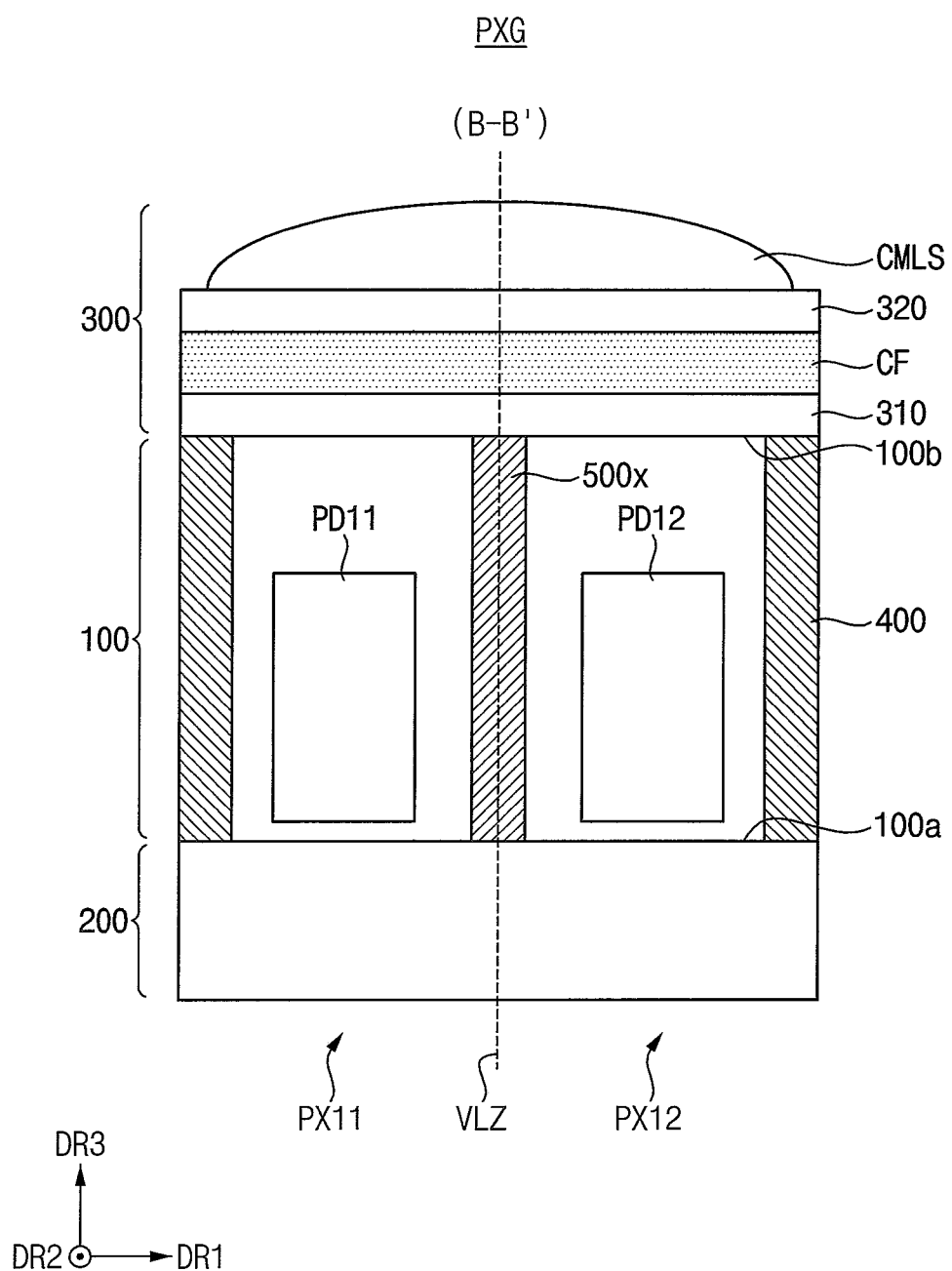
Figure 2C:
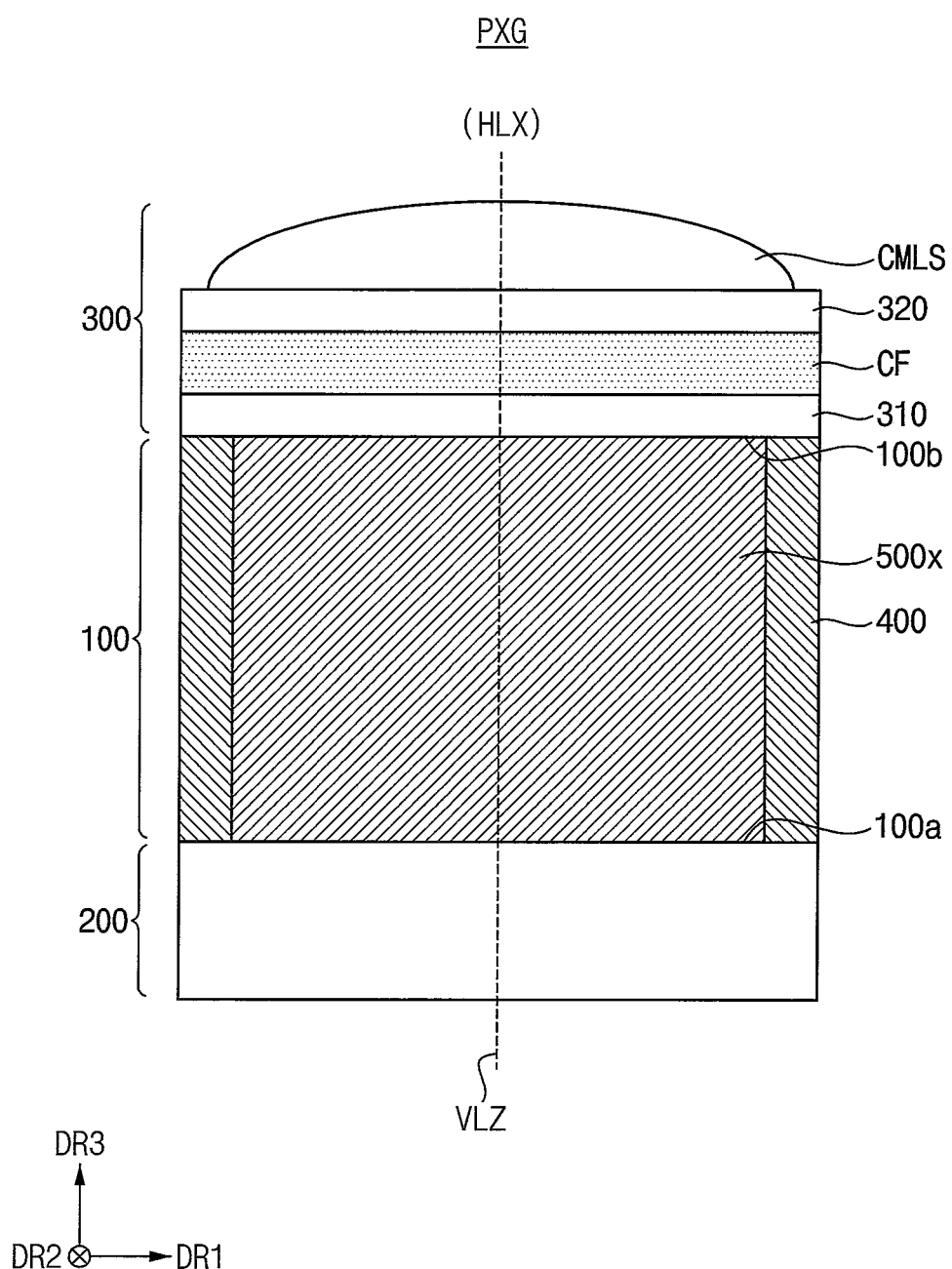
Figure 2D:
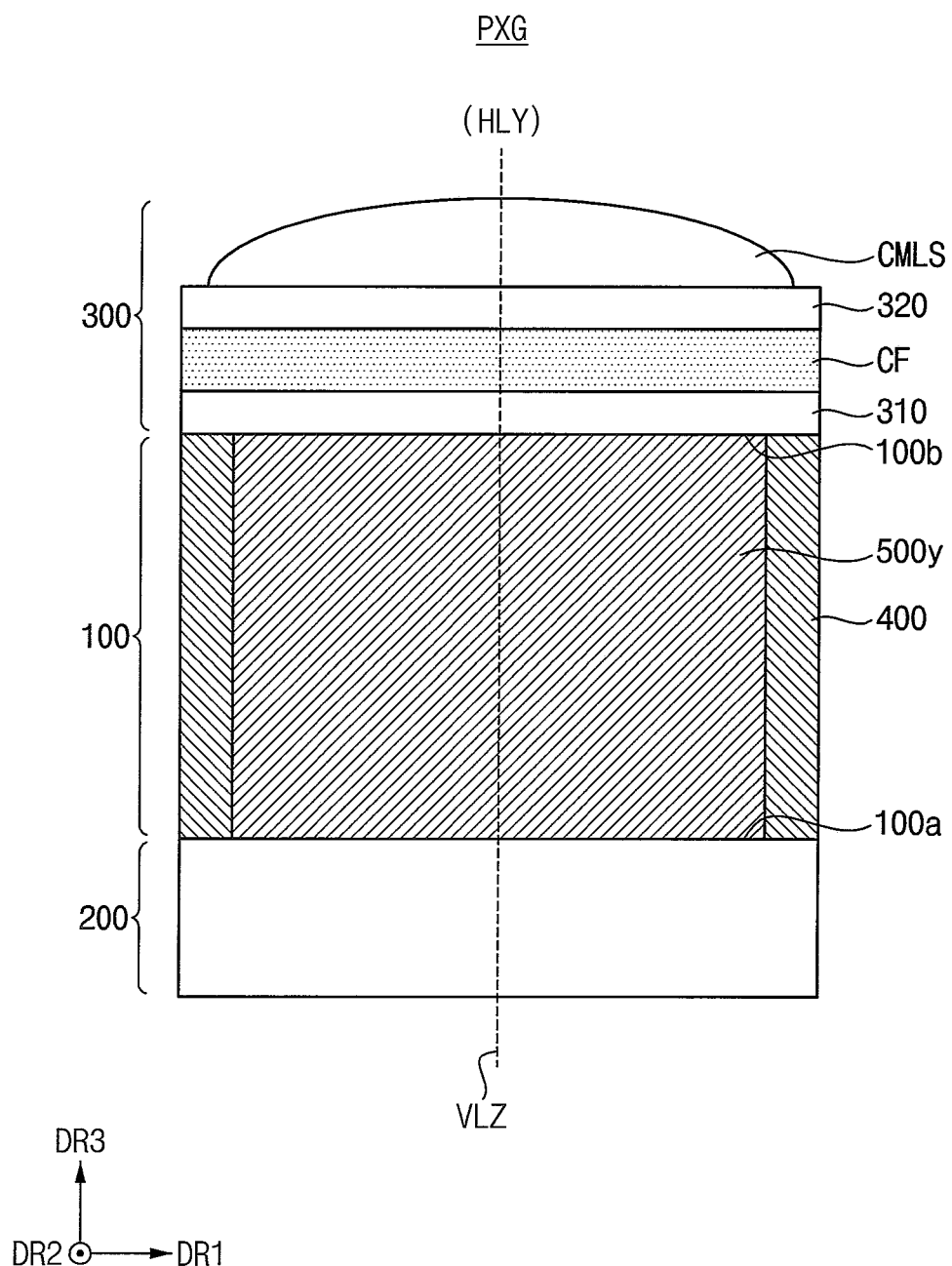

FIG. 1 is a plane view illustrating a layout of a pixel group included in an image sensor according to example embodiments of the present disclosure, and FIGS. 2A through 2D are cross-sectional views illustrating vertical structures of a pixel group included in an image sensor according to example embodiments of the present disclosure. FIG. 2A is a cross-sectional view of the pixel group of FIG. 1 along line A-A', FIG. 2B is a cross-sectional view of the pixel group of FIG. 1 along line B-B', FIG. 2C is a cross-sectional view of the pixel group of FIG. 1 along line HLX, and FIG. 2D is a cross-sectional view of the pixel group of FIG. 1 along line HLY.

Referring to FIGS. 1 through 2D, a pixel array may include a semiconductor substrate 100, an interconnection layer 200 and an optically-transparent layer 300. In case of the BSI structure, the semiconductor substrate 100 may be disposed between the interconnection layer 200 and the optically-transparent layer 300. For example, the semiconductor substrate 100 may have an upper surface 100a and a lower surface 100b on opposite sides thereof. The interconnection layer 200 may be disposed on the upper surface 100a of the semiconductor substrate 100, and the optically-transparent layer 300 may be disposed on the second surface 100b of the semiconductor substrate 100.

A pixel group PXG may include a plurality of unit pixels PX11, PX12, PX21 and PX22 (hereinafter, the unit pixels may be referenced as PX11~PX22), trench structures 400 and 500, and a common microlens CMLS. The pixel group PXG may be symmetrical with respect to a first horizontal line HLX passing through a center CP of the pixel group PXG and extending in the first horizontal direction DR1. In addition, the pixel group PXG may be symmetrical with respect to a second horizontal line HLY passing through the center CP of the pixel group PXG and extending in the second horizontal direction DR2. According to example embodiments of the present disclosure, the pixel group PXG may be symmetrical with a vertical line VLZ passing through the center CP of the pixel group PXG and extending in the vertical direction DR3.

FIG. 1 illustrates the pixel group PXG including the four unit pixels PX11~PX22 arranged in a matrix form of two pixel rows PR1 and PR2 and two pixel columns PC1 and PC2 for convenience of illustration and description. According to example embodiments of the present disclosure, the number of unit pixels included in the pixel group PXG, in other words, the number of the pixel rows corresponding to one group row GR and the number of the pixel columns corresponding to one group column GC may vary. For example, more than two pixel rows may be present in one group row and more than two pixel columns may be present in one group column.

The unit pixels PX11~PX22 may respectively include photoelectric conversion elements PD11, PD12, PD21 and PD22 (hereinafter, the photoelectric conversion elements may be referenced as PD11~PD22) disposed in the semiconductor substrate 100. An incident light from the outside may be converted to electrical signals in the photoelectric conversion elements PD11~PD22.

The trench structures 400 and 500 may be disposed in the semiconductor substrate 100 and extend in the vertical direction DR3 from the upper surface 100a of the semiconductor substrate 100 and to the lower surface 100b of the semiconductor substrate 100 to electrically and optically separate the photoelectric conversion elements PD11~PD22 from each other. The trench structures 400 and 500 may include inter-group trench structures 400 separating the pixel group PXG from other pixel groups and inter-pixel trench structures 500 separating the unit pixels PX11~PX22 included in the pixel group PXG from each other. For example, the inter-group trench structure 400 may surround the pixel group PXG and the inter-pixel trench structure 500 may surround each of the unit pixels PX11~PX22 included in the pixel group PXG.

The inter-pixel trench structures 500 may include a first inter-pixel trench structure 500x and a second inter-pixel trench structure 500y. The first inter-pixel trench structure 500x may extend in the first horizontal direction DR1 to be connected to the inter-group trench structures 400 disposed at both sides of the pixel group PXG in the first horizontal direction DR1 and extend in the vertical direction DR3 from the upper surface 100a of the semiconductor substrate 100 to the lower surface 100b of the semiconductor substrate 100. The second inter-pixel trench structure 500y may extend in the second horizontal direction DR2 to be connected to the inter-group trench structures 400 disposed at both sides of the pixel group PXG in the second horizontal direction DR2 and extend in the vertical direction DR3 from the upper surface 100a of the semiconductor substrate 100 to the lower surface 100b of the semiconductor substrate 100.

The inter-pixel trench structure 500 may reduce or prevent the photo charges generated by adjacent unit pixels from being transferred to each unit pixel. In other words, the inter-pixel trench structure 500 may reduce or prevent cross-talk between the photoelectric conversion elements PD11~PD22. In addition, the inter-group trench structure 400 may reduce or prevent cross-talk between adjacent pixel groups.

The optically-transparent layer 300 may include a color filter CF and the common microlens CMLS. The optically-transparent layer 300 may be configured to allow external incident light to be filtered and focused on the semiconductor substrate 100. The color filter CF and the common microlens CMLS may be provided on the lower surface 100b of the semiconductor substrate 100. A first flattening layer 310 may be disposed between the lower surface of the semiconductor substrate 100 and the color filter CF, and a second flattening layer 320 may be disposed between the color filter CF and the common microlens CMLS.

The color filter CF may include one of red, green, and blue filters. In some example embodiments of the present disclosure, the color filter CF may include one of cyan, magenta, and yellow filters. When the unit pixels PX11~PX22 in the pixel group PXG correspond to the same color, the unit pixels PX11~PX22 may share the single color filter CF.

The common microlens CMLS may be disposed above or below the semiconductor substrate 100. The common microlens CMLS may cover all of the photoelectric conversion elements PD11~PD22 in the unit pixels PX11~PX22 to focus the incident light to the photoelectric conversion elements PD11~PD22.

The interconnection layer 200 may include logic transistors, which are electrically connected to the photoelectric conversion elements PD11~PD22, and interconnection lines, which are connected to the logic transistors. The electrical signals converted in the first and second photoelectric conversion elements PD11~PD22 may be transmitted to other circuitry (e.g., one of the logic transistors) through the interconnection layer 200. The interconnection layer 200 may include interlayered insulating layers, which are stacked in the vertical direction DR3, and interconnection lines, which are interposed between the interlayered insulating layers. In some example embodiments of the present disclosure, the arrangement of the interconnection lines may be independent of the arrangement of the photoelectric conversion elements PD11~PD22. For example, the interconnection lines may be arranged to cross over the photoelectric conversion elements PD11~PD22.

The semiconductor substrate 100 may be formed from a bulk silicon wafer of a first conductivity type (e.g., p-type), on which an epitaxial layer of the first conductivity type is formed. In some example embodiments of the present disclosure, the bulk silicon substrate may be removed during a process of fabricating the image sensor, and in this case, the p-type epitaxial layer may be used as the semiconductor substrate 100. In some example embodiments of the present disclosure, the semiconductor substrate 100 may include a bulk semiconductor wafer, in which a well of the first conductivity type is formed. Various kinds of substrates (e.g., an n-type epitaxial layer, a bulk silicon wafer, and a silicon-on-insulator (SOI) wafer) may be used as the semiconductor substrate 100.

In some example embodiments of the present disclosure, the semiconductor substrate 100 may include a plurality of unit pixel regions, which are defined by a device separation layer. The unit pixel regions may be arranged in the first and second directions D1 and D2 crossing each other to form a matrix-shaped arrangement. As an example, the unit pixel regions may include the first to third pixel regions, each of which is configured to receive light in a specific wavelength range. For example, the first pixel regions may be configured to selectively receive light with a wavelength within a first wavelength range, and the second pixel regions may be configured to selectively receive light with wavelength within a second wavelength range longer than the first wavelength range. The third pixel regions may be configured to selectively receive light with a wavelength within a third wavelength range shorter than the first wavelength range. For example, the unit pixel regions may be configured in such a way that green light is incident into the first pixel regions, red light is incident into the second pixel regions, and blue light is incident into the third pixel regions.

At least one floating diffusion region may be formed in the semiconductor substrate 100, and transfer gates may be disposed on the upper surface 100a of the semiconductor substrate 100 between the floating diffusion region and each of the photoelectric conversion elements PD11~PD22.

The photoelectric conversion elements PD11~PD22 may be impurity regions that are doped with impurities and may have a second conductivity type (e.g., n-type) different from that of the semiconductor substrate 100. In some example embodiments of the present disclosure, the photoelectric conversion elements PD11~PD22 may be adjacent to the upper surface 100a of the semiconductor substrate 100 and may be spaced apart from the lower surface 100b of the semiconductor substrate 100. For example, a distance between the photoelectric conversion elements PD11~PD22 and the upper surface 100a of the semiconductor substrate 100 may be less than a distance between the photoelectric conversion elements PD11~PD22 and the lower surface 100b of the semiconductor substrate 100. For example, the photoelectric conversion elements PD11~PD22 may be formed by injecting impurities of the second conductivity type (e.g., n-type) into the upper surface 100a of the semiconductor substrate 100. The photoelectric conversion elements PD11~PD22 may have a difference in doping concentration between regions adjacent to the upper and lower surfaces 100a and 100b, and thus, the semiconductor substrate 100 may have a potential difference between the first surface 100a and the second surface 100b.

In some example embodiments of the present disclosure, the semiconductor substrate 100 of the first conductivity type and each of the photoelectric conversion elements PD11~PD22 may form a photodiode. In other words, a junction serving as a photodiode may be formed between the semiconductor substrate 100 of the first conductivity type and each of the photoelectric conversion elements PD11~PD22. In the case where light is incident into the photoelectric conversion elements PD11~PD22, photocharges may be generated and stored in proportion to an intensity of the incident light. Furthermore, the photodiode may further include a p-type impurity region, which is doped with p-type impurities and is shallowly formed near the surfaces of the photoelectric conversion elements PD11~PD22.

When focusing is not implemented in an image sensor, the incident light through the common microlens CMLS may not be uniformly transferred to the photoelectric conversion elements PD11~PD22 and the electrical signals output from the photoelectric conversion elements PD11~PD22 may not reflect the captured image correctly. The image sensor may perform auto focusing to adjust a focus of a device including the image sensor based on a difference between the electrical signals from the photoelectric conversion elements PD11~PD22 that share the common microlens CMLS.

As such, the pixel array and the image sensor according to example embodiments of the present disclosure may implement an auto focusing function and also enhance image quality by reducing cross-talk between the unit pixels by using the plurality of unit pixels PX11~PX22 sharing the common microlens CMLS and trench structures 400 and 500 extending from the upper surface 100a of the semiconductor substrate 100 to the lower surface 100b of the semiconductor substrate 100.

Figure 3A:
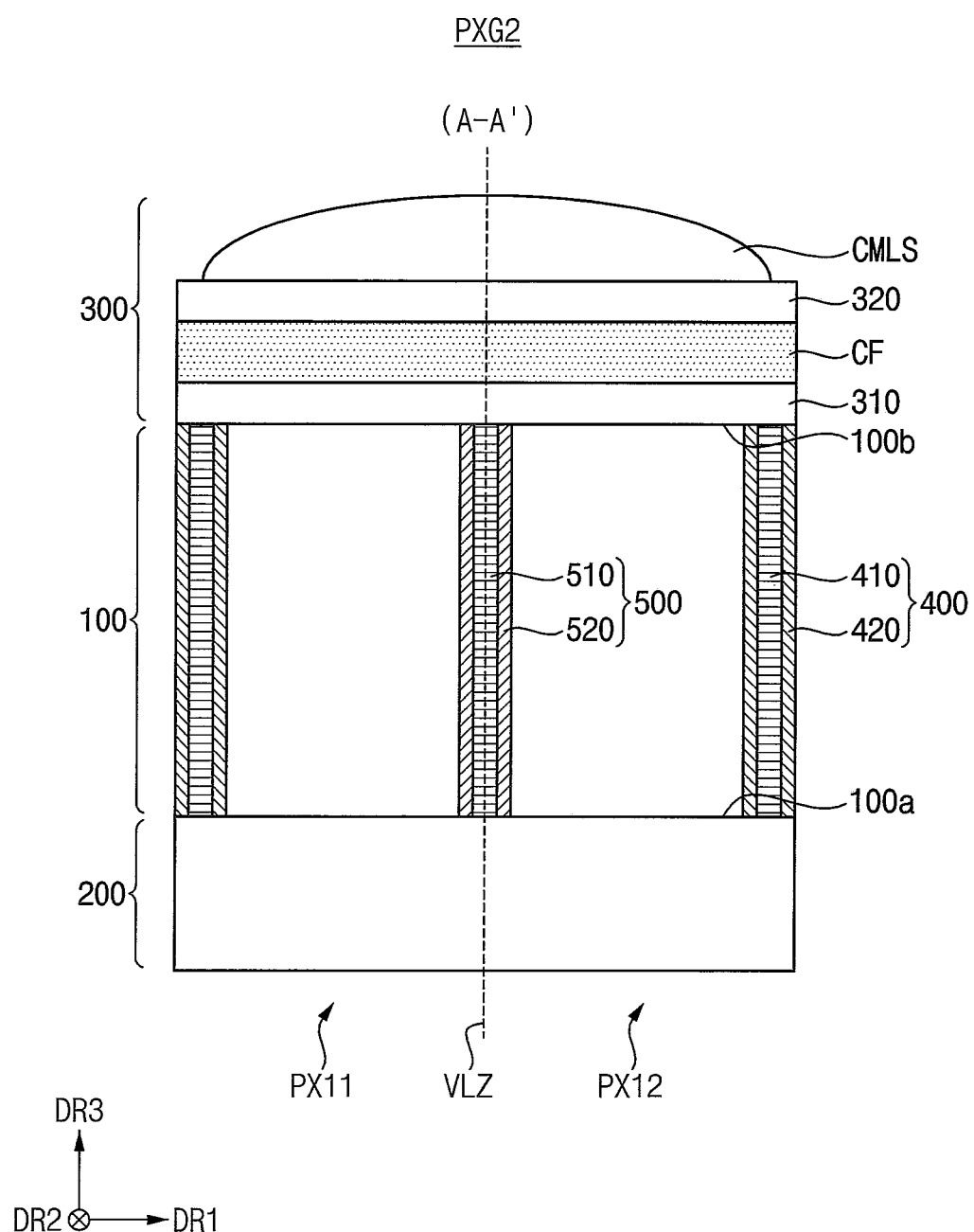
FIGS. 3A and 3B are cross-sectional views illustrating a trench structure of a pixel group included in an image sensor according to example embodiments of the present disclosure.
Figure 3B:
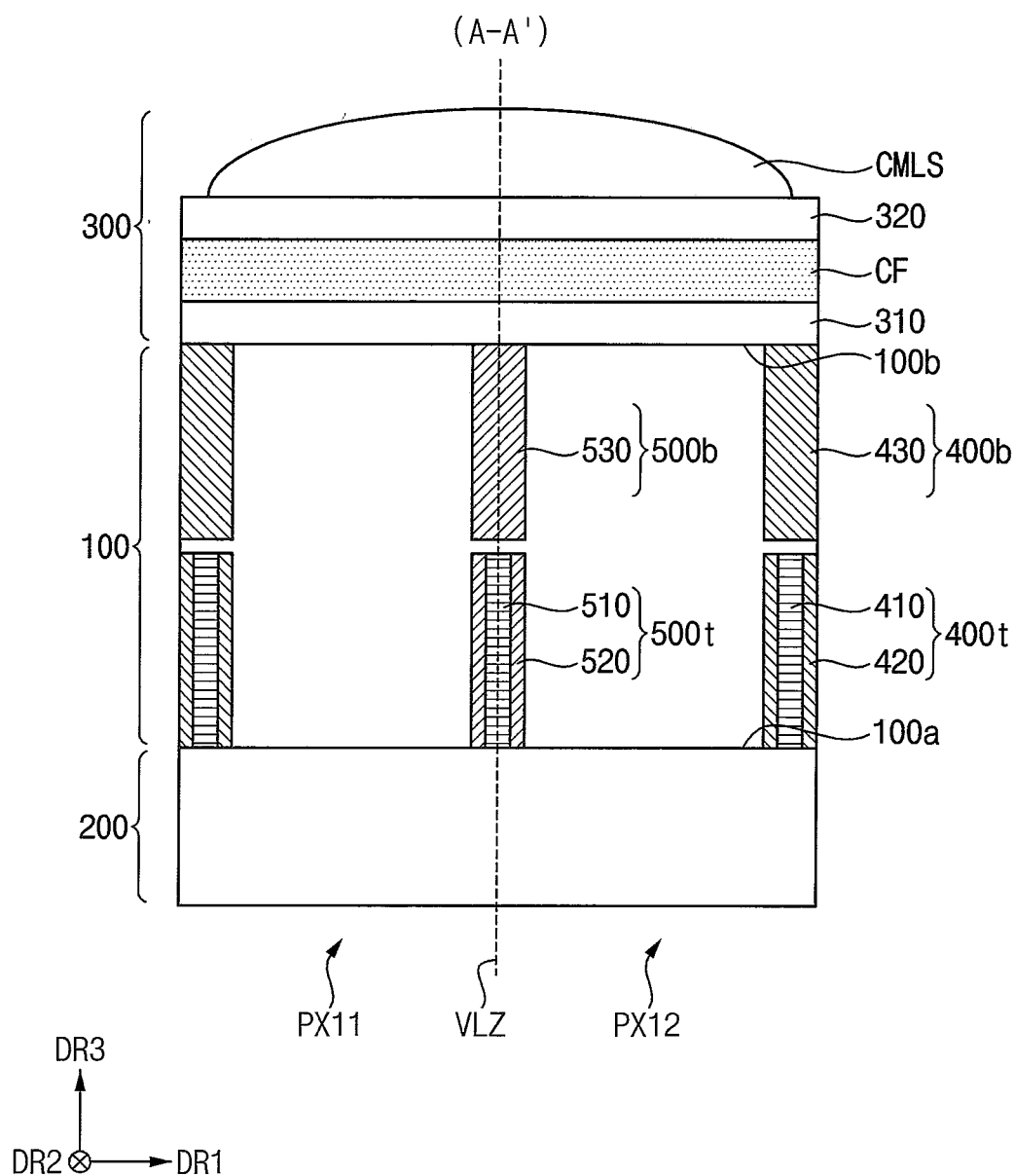

FIGS. 3A and 3B are cross-sectional views illustrating a trench structure of a pixel group included in an image sensor according to example embodiments of the present disclosure. FIGS. 3A and 3B are cross-sectional views of the pixel group PXG of FIG. 1 along the line A-A'. The vertical structure along the line B-B' may be substantially the same as shown in FIGS. 3A and 3B. The description repeated with FIGS. 1 through 2D may be omitted.

The trench structures 400 and 500 may be formed of an insulating material having a refractive index lower than that of the semiconductor substrate 100 (e.g., of silicon), and may include one or more insulating layers. For example, the trench structures 400 and 500 may be formed of or include at least one of a silicon oxide layer, a silicon nitride layer, an undoped poly-silicon layer, air, or combinations thereof. The formation of the trench structures 400 and 500 may include removing portions of the upper surface 100a and/or the lower surface 100b of the semiconductor substrate 100 to form a deep trench and filling the deep trench with an insulating material.

As described above, the trench structures 400 and 500 may be disposed in the semiconductor substrate 100 and extend in the vertical direction DR3 from the upper surface 100a of the semiconductor substrate 100 and to the lower surface 100b of the semiconductor substrate 100 to electrically and optically separate the photoelectric conversion elements PD11~PD22 from each other.

In some example embodiments of the present disclosure, as illustrated in FIG. 3A, each of the trench structures 400 and 500 may include a trench such that inner surfaces of the trench are coated with a transparent dielectric material 410 and 510 and an inner space of the trench is filled with a material 420 and 520 different from the transparent dielectric material 410 and 510. For example, the transparent dielectric material 410 and 510 may be an oxide and the material 420 and 520 may be a nitride. In other words, the trench structures 400 and 500 may have ONO (oxide-nitride-oxide) structure in the horizontal directions DR1 and DR2. In some example embodiments of the present disclosure, each of the trench structures 400 and 500 may include a trench such that the trench is filled with the transparent dielectric material 410 and 510.

In some example embodiments of the present disclosure, as a pixel group PXG PXG3 illustrated in FIG. 3B, each of the trench structures 400 and 500 may include an upper trench structure 400t and 500t formed by a front trench process from the upper surface 100a of the semiconductor substrate 100, and a lower trench structure 400b and 500b formed by a back trench process from the lower surface 100b of the semiconductor substrate 100.

In some example embodiments of the present disclosure, the upper trench structure 400t and 500t has a structure or a composition different from the lower trench structure 400b and 500b. For example, as the pixel group PXG3 illustrated in FIG. 3B, the upper trench structure 400t and 500t may include a trench such that inner surfaces of the trench are coated with a transparent dielectric material 410 and 510 and an inner space of the trench is filled with a material 420 and 520 different from the transparent dielectric material 410 and 510, whereas the lower trench structure 400b and 500b includes a trench that is filled with a transparent dielectric material 430 and 530.

Figure 4:
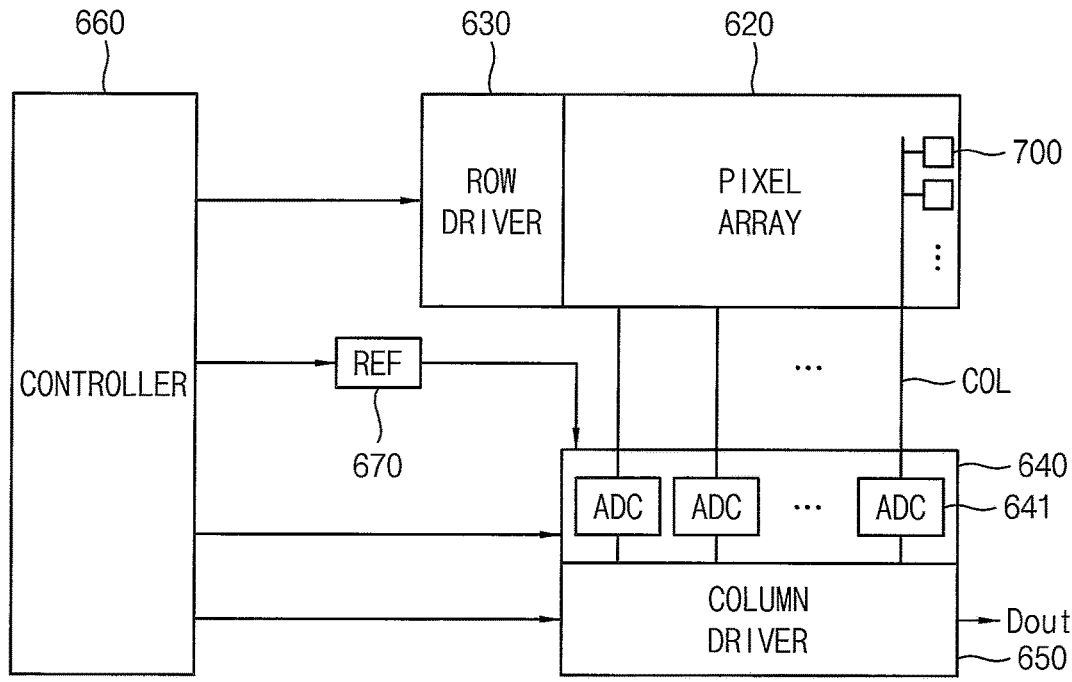
FIG. 4 is a block diagram illustrating an image sensor according to example embodiments of the present disclosure.

FIG. 4 is a block diagram illustrating an image sensor according to example embodiments of the present disclosure.

Referring to FIG. 4, an image sensor 600 may include a pixel array 620, a row driver 630, an analog-to-digital conversion circuit 640, a column driver 650, a controller 660, and a reference signal generator REF 670.

The pixel array 620 includes a plurality of pixels 700 coupled to column lines COL, respectively, and the plurality of pixels 700 senses incident light to generate analog signals through the column lines COL. The plurality of pixels 700 may be arranged in matrix form with a plurality of rows and a plurality of columns. The pixel array 620 may have a structure that various unit patterns, which will be described below with reference to FIGS. 15 through 20C, are arranged repeatedly in the first horizontal direction DR1 and the second horizontal direction DR2.

The row driver 630 may be coupled to the rows of the pixel array 620 to generate signals for driving the rows. For example, the row driver 630 may drive the pixels in the pixel array 620 row by row.

The analog-to-digital conversion circuit 640 may be coupled to the columns of the pixel array 620 to convert the analog signals from the pixel array 620 to digital signals. As illustrated in FIG. 4, the analog-to-digital conversion circuit 640 may include a plurality of analog-to-digital converters (ADC) 641 to perform analog-to-digital conversion of the analog signals output from the column lines COL in parallel or simultaneously.

The analog-to-digital conversion circuit 640 may include a correlated double sampling (CDS) unit. In some example embodiments of the present disclosure, the CDS unit may perform an analog double sampling by extracting a valid image component based on a difference between an analog reset signal and an analog image signal. In some example embodiments of the present disclosure, the CDS unit may perform a digital double sampling by converting the analog reset signal and the analog image signal to two digital signals and extracting a difference between the two digital signals as the valid image component. In some example embodiments of the present disclosure, the CDS unit may perform a dual CDS by performing both the analog double sampling and digital double sampling.

The column driver 650 may output the digital signals from the analog-to-digital conversion circuit 40 sequentially as output data Dout.

The controller 660 may control the row driver 630, the analog-to-digital conversion circuit 640, the column driver 650, and the reference signal generator 670. The controller 660 may provide control signals such as clock signals, timing control signals, etc. required for the operations of the row driver 630, the analog-to-digital conversion circuit 640, the column driver 650, and the reference signal generator 670. The controller 660 may include a control logic circuit, a phase-locked loop, a timing control circuit, a communication interface circuit, etc.

The reference signal generator 670 may generate a reference signal or a ramp signal that increases or decreases gradually and provide the ramp signal to the analog-to-digital conversion circuit 630.

Figure 5:
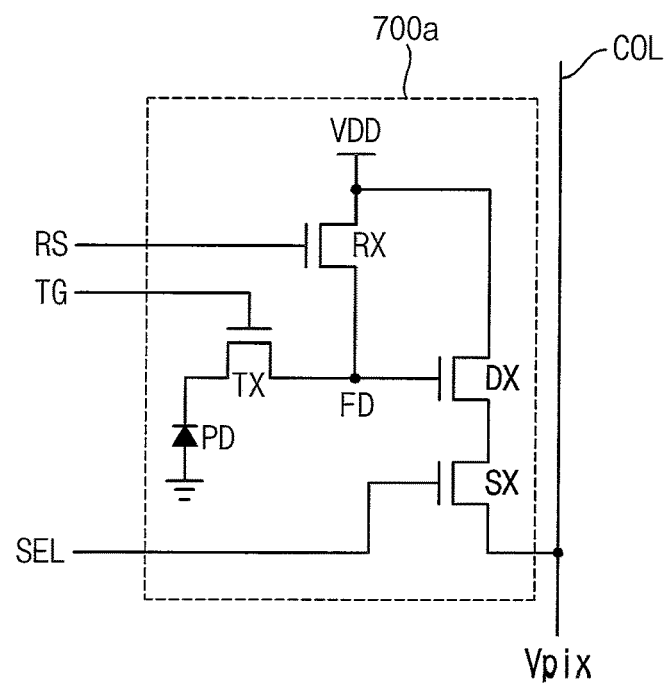
FIG. 5 is a circuit diagram illustrating a pixel included in an image sensor according to example embodiments of the present disclosure.

FIG. 5 is a circuit diagram illustrating an example of a pixel included in an image sensor according to example embodiments of the present disclosure.

Referring to FIG. 5, a unit pixel 700a may include a photo-sensitive element such as a photodiode PD, and a readout circuit including a transfer transistor TX, a reset transistor RX, a drive transistor DX and/or a selection transistor SX.

For example, the photodiode PD may include an n-type region in a p-type substrate such that the n-type region and the p-type substrate form a p-n conjunction diode. The photodiode PD receives the incident light and generates a photo-charge based on the incident light. In some example embodiments of the present disclosure, the unit pixel 600a may include a phototransistor, a photogate, and/or a pinned photodiode, etc. instead of, or in addition to, the photodiode PD.

The photo-charge generated in the photodiode PD may be transferred to a floating diffusion node FD through the transfer transistor TX. The transfer transistor TX may be turned on in response to a transfer control signal TG.

The drive transistor DX functions as a source follower amplifier that amplifies a signal corresponding to the charge on the floating diffusion node FD. The selection transistor SX may transfer the pixel signal Vpix to a column line COL in response to a selection signal SEL.

The floating diffusion node FD may be reset by the reset transistor RX. For example, the reset transistor RX may discharge the floating diffusion node FD in response to a reset signal RS for correlated double sampling (CDS).

FIG. 5 illustrates the unit pixel 700a of the four-transistor configuration including the four transistors TX, RX, DX and SX. The configuration of the unit pixel may be variously changed and the pixel structure is not limited to that of FIG. 5.

Figure 6:
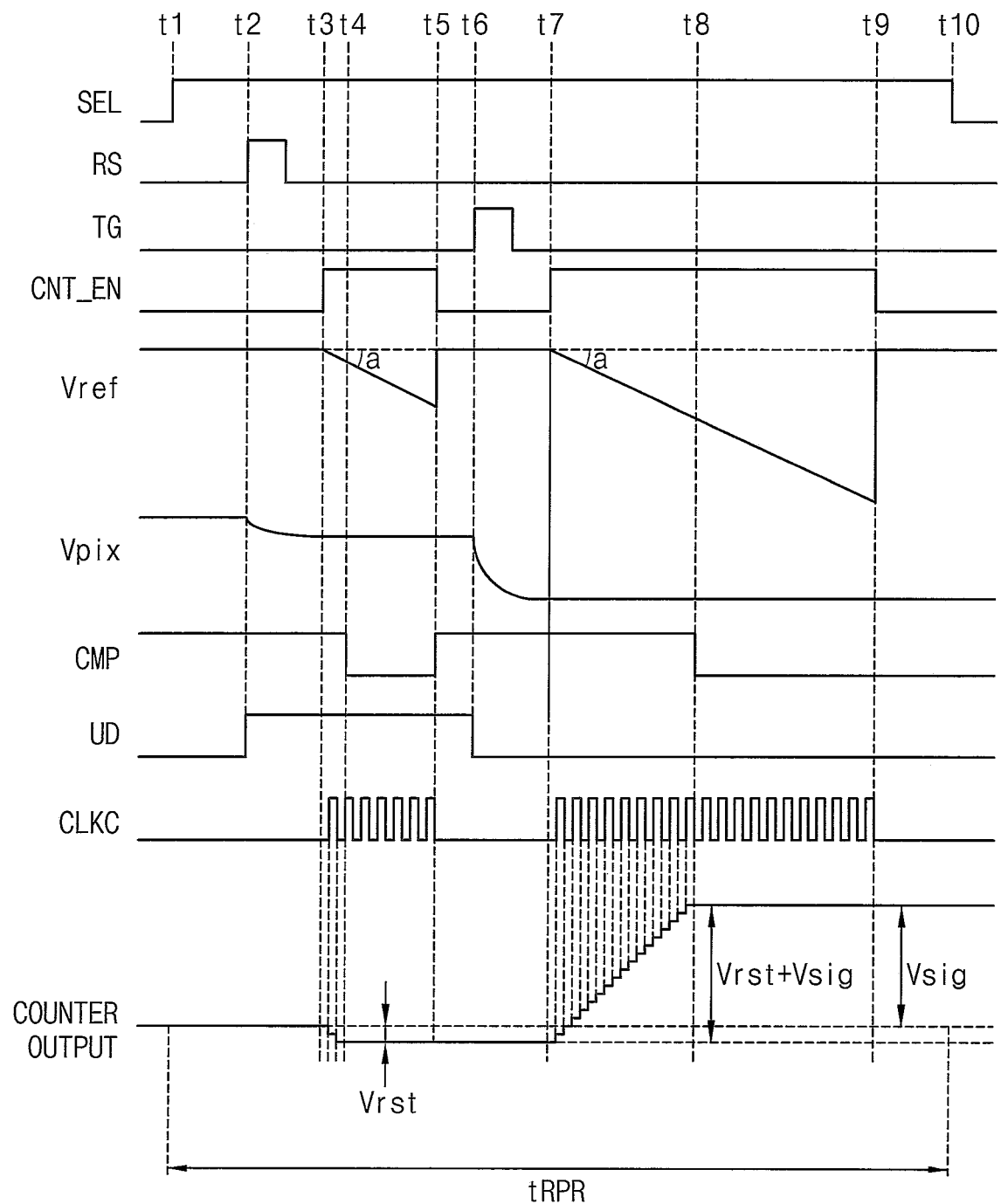
FIG. 6 is a timing diagram illustrating an operation of an image sensor according to example embodiments of the present disclosure.

FIG. 6 is a timing diagram illustrating an operation of an image sensor according to example embodiments of the present disclosure.

FIG. 6 illustrates a sensing period tRPR corresponding to a sensing operation of a pixel. The sensing operation may be performed simultaneously with respect to pixels corresponding to the same transfer control signal TG.

Referring to FIGS. 4, 5 and 6, at a time t1, the row driver 630 may select one of rows included in the pixel array 620 by providing an activated row selection signal SEL to the selected row of the pixel array 620. Here, for example, the row selection signal SEL may transition from low to high.

At a time t2, the row driver 630 may provide an activated reset control signal RS to the selected row, and the controller 660 may provide an up-down control signal UD having a logic high level to a counter included in the ADC 641. From the time t2, the pixel array 620 may output a first analog signal corresponding to a reset component Vrst as the pixel voltage Vpix.

At a time t3, the controller 660 may provide a count enable signal CNT_EN having a logic high level to the reference signal generator 670, and the reference signal generator 670 may start to decrease the reference signal Vref at the constant rate, e.g., a slope of 'a'. The controller 660 may provide a count clock signal CLKC to the counter included in the ADC 641, and the counter may perform down-counting from zero in synchronization with the count clock signal CLKC.

At a time t4, a magnitude of the reference signal Vref may become smaller than a magnitude of the pixel voltage Vpix, and a comparator included in the ADC 641 may provide a comparison signal CMP having a logic low level to the counter so that the counter stops performing the down-counting. At the time t4, a counter output of the counter may be the first counting value that corresponds to the reset component Vrst. In the example of FIG. 6, the counter output of the counter at the time t4 may be −2.

At a time t5, the controller 660 may provide the count enable signal CNT_EN having a logic low level to the reference signal generator 670, and the reference signal generator 670 may stop generating the reference signal Vref.

A period from the time t3 to the time t5 corresponds to a maximum time for detecting the reset component Vrst. A length of the period from the time t3 to the time 15 may be determined as a certain number of the count clock signal CLKC according to a characteristic of the image sensor 700.

At a time t6, the row driver 630 may provide an activated transfer control signal TG (e.g., the transfer control signal TG having a logic high level) to the selected row, and the controller 660 may provide the up-down control signal UD having a logic low level to the counter. From the time t6, the pixel array 620 may output a second analog signal corresponding to a detected incident light Vrst+Vsig as the pixel voltage Vpix.

At a time t7, the controller 660 may provide the count enable signal CNT_EN having a logic high level to the reference signal generator 670, and the reference signal generator 670 may start to decrease the reference signal Vref at the same constant rate as at the time t3, e.g., a slope of 'a'. The comparator in the ADC 641 may provide the comparison signal CMP having a logic high level to the counter since the pixel voltage Vpix is smaller than the reference signal Vref. The controller 660 may provide the count clock signal CLKC to the counter, and the counter may perform an up-counting from the first counting value, which corresponds to the reset component Vrst, in synchronization with the count clock signal CLKC.

At a time t8, the magnitude of the reference signal Vref may become smaller than the magnitude of the pixel voltage Vpix, and the comparator may provide the comparison signal CMP having a logic low level to the counter so that the counter stops performing the up-counting. At the time t8, the counter output of the counter may correspond to a difference between the first analog signal representing the reset component Vrst (e.g., −2 in the example of FIG. 6) and the second analog signal representing the detected incident light Vrst+Vsig (e.g., 17 in the example of FIG. 6). The difference may be an effective intensity of incident light Vsig (e.g., 15 in the example of FIG. 6). The counter may output the effective intensity of incident light Vsig as the digital signal.

At a time t9, the controller 660 may provide the count enable signal CNT_EN having a logic low level to the reference signal generator 670, and the reference signal generator 670 may stop generating the reference voltage Vref.

A period from the time t7 to the time t9 corresponds to a maximum time for detecting the detected incident light Vrst+Vsig. A length of the period from the time t7 to the time t9 may be determined as a certain number of the count clock signal CLKC according to a characteristic of the image sensor 700.

At a time t10, the row driver 630 may provide a deactivated row selection signal SEL (e.g., the row selection signal having a low level) to the selected row of the pixel array 620, and the counter may reset the counter output to zero.

After that, the image sensor 700 may repeat above described operations on each row to generate the digital signals row by row.

The present disclosure is not limited to the example configuration and operation described with reference to FIGS. 4, 5 and 6.

Figure 7:
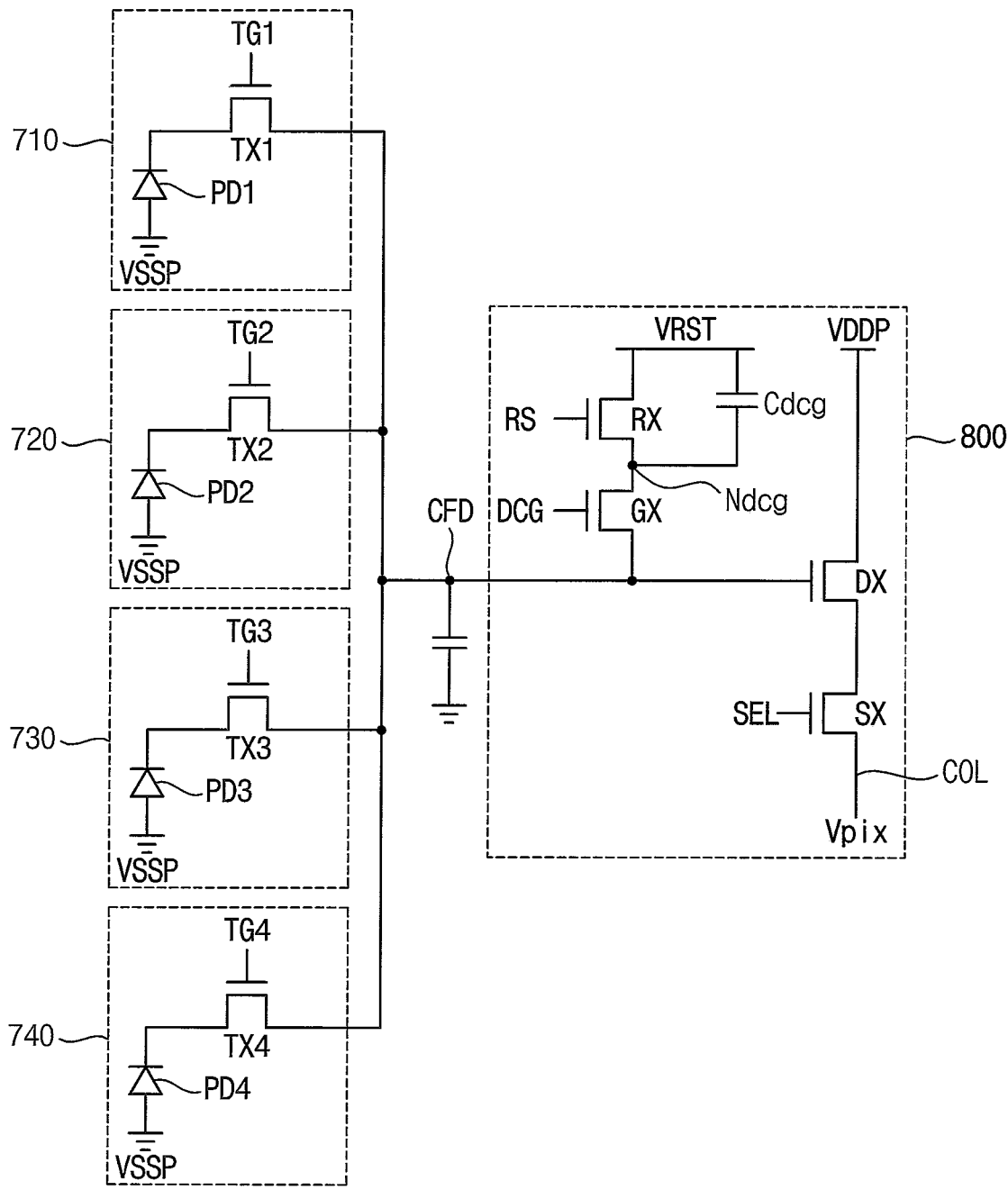
FIG. 7 is a circuit diagram illustrating a shared structure of a pixel group sharing a floating diffusion region included in an image sensor according to example embodiments of the present disclosure.
Figure 8:
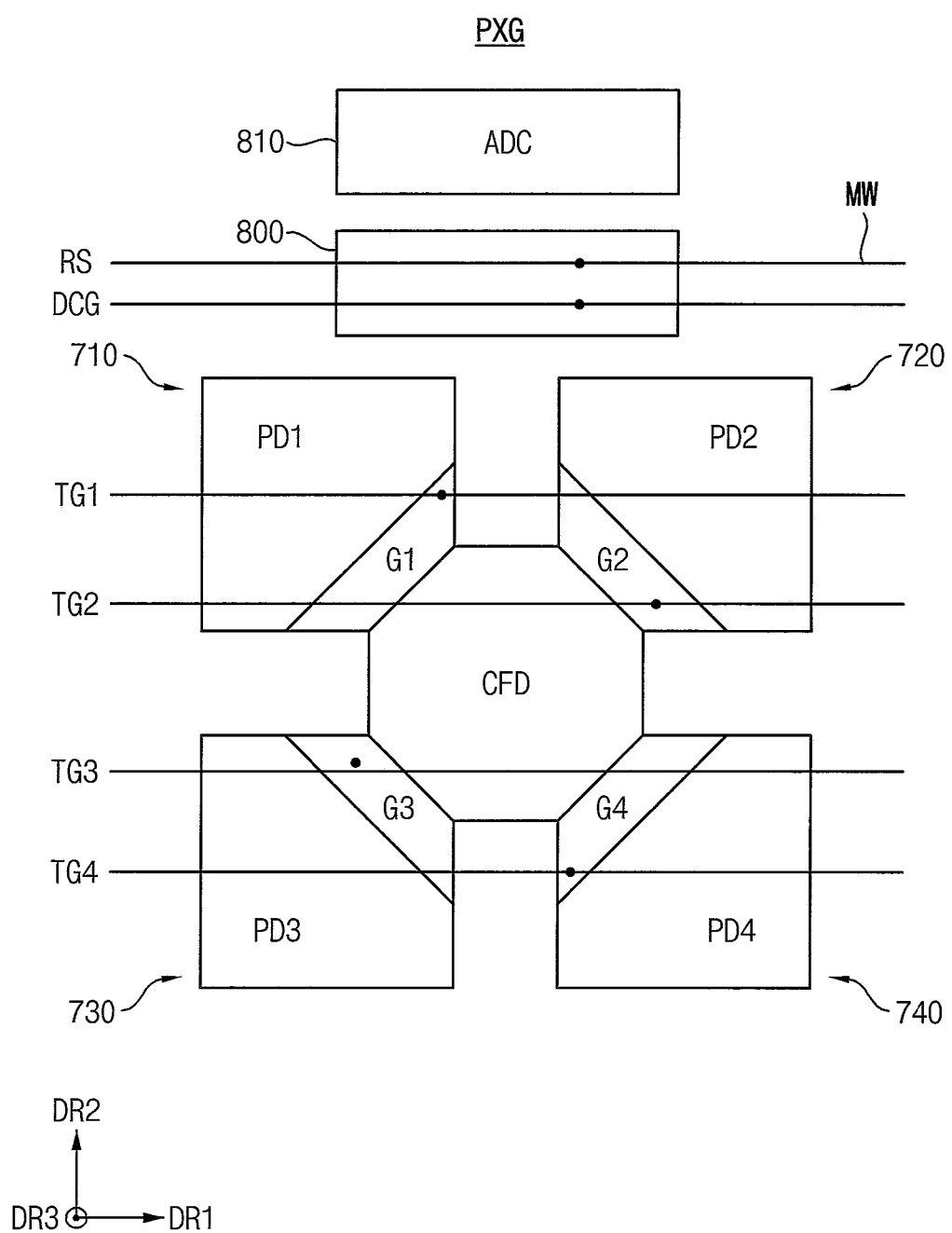
FIG. 8 is a top view illustrating an example layout of the shared structure of FIG. 7.

FIG. 7 is a circuit diagram illustrating a shared structure of a pixel group sharing a floating diffusion region included in an image sensor according to example embodiments of the present disclosure, and FIG. 8 is a top view illustrating an example layout of the shared structure of FIG. 7.

Referring to FIGS. 7 and 8, a pixel group PXG may include a common floating diffusion region CFD, a first pixel 710, a second pixel 720, a third pixel 730, a fourth pixel 740, a readout circuit 800 and/or an analog-to-digital conversion unit 810. The first pixel 710, the second pixel 720, the third pixel 730, and the fourth pixel 740 may be commonly connected to the common floating diffusion region CFD. The pixel group PXG, as illustrated in FIGS. 7 and 8, may be arranged repeatedly in the first horizontal direction DR1 and the second horizontal direction DR2 in a pixel array.

Control signals TG1, TG2, TG3, TG4, RS and DCG may be provided from the row driver (e.g., the row driver 630 in FIG. 4) to the pixel group PXG through wires MW extended in the first horizontal direction DR1.

The first pixel 710 may include a first photodiode PD1 and a first transfer transistor TX1. The second pixel 720 may include a second photodiode PD2 and a second transfer transistor TX2. The third pixel 730 may include a third photodiode PD3 and a third transfer transistor TX3. The fourth pixel 740 may include a fourth photodiode PD4 and a fourth transfer transistor TX4. In FIG. 8, G1~G4 indicate transfer gates of the first through fourth transfer transistors TX1~TX4, respectively.

The readout circuit 800 may include a reset transistor RX, a gain adjusting transistor GX, a capacitor Cdcg, a source follower transistor or a driving transistor DX, and/or a selection transistor SX. FIG. 7 illustrates a non-limiting example where each pixel includes one transistor and the readout circuit includes four transistors, but example embodiments of the present disclosure may be applied to operate an image sensor of various configurations other than that of FIG. 7.

The reset transistor RX may be connected between a reset voltage VRST and a gain adjusting node Ndcg and the reset transistor RX may be turned on and off in response to a reset signal RS. The gain adjusting transistor GX may be connected between the gain adjusting node Ndcg and the common floating diffusion node FD and the gain adjusting transistor GX may be turned on and off in response to a gain adjusting signal DCG The capacitor Cdcg may be connected in parallel with the reset transistor RX between the reset voltage VRST and the gain adjusting node Ndcg. As will be described with reference to FIG. 9, different gains may be implemented using the gain adjusting transistor CX and the capacitor Cdcg.

Figure 9:
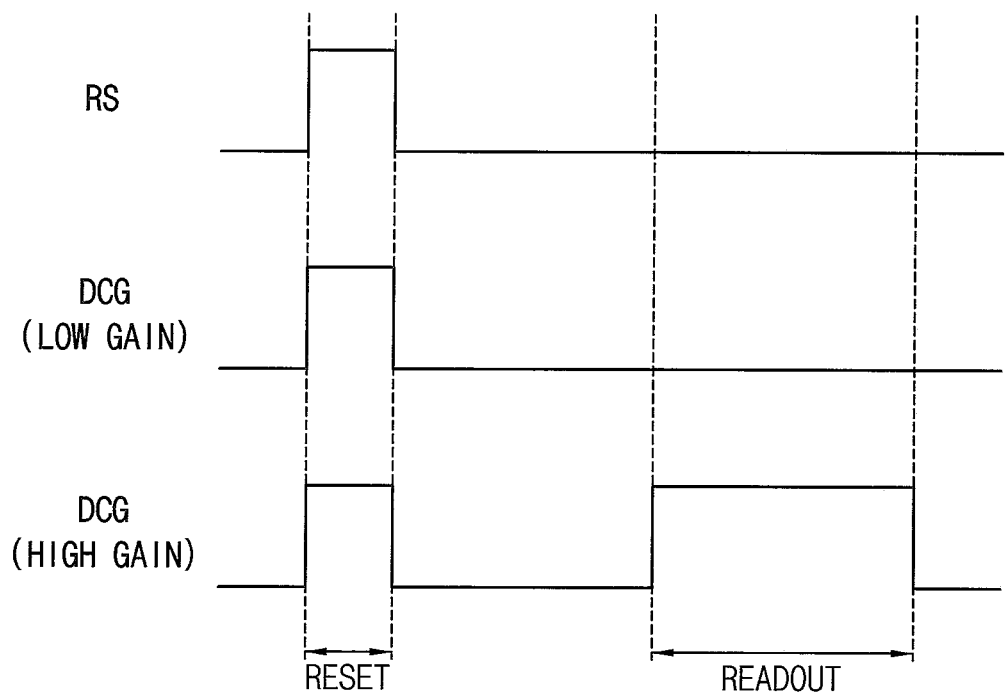
FIG. 9 is a timing diagram illustrating an example operation of the pixel group having the shared structure of FIG. 7.

FIG. 9 is a timing diagram illustrating an example operation of the pixel group having the shared structure of FIG. 7.

Referring to FIGS. 7, 8 and 9, the reset transistor RX and the gain adjusting transistor GX may be turned on when the common floating diffusion node FD is reset. For example, the reset transistor RX may be turned on when the reset signal RS is high. The reset transistor RX may be turned off and the gain adjusting transistor GX may be turned on when a voltage of the common floating diffusion node FD is read out with a first gain (e.g., low gain). The reset transistor RX and the gain adjusting transistor GX may be turned off when the voltage of the common floating diffusion node FD is read out with a second gain (e.g., high gain) higher than the first gain.

The pixel signal Vpix output from the pixel array 620 may include a shot noise that increases according to an ambient light and a circuit noise caused by characteristics of internal circuits of the pixel array 620. Even though the gain of the pixel is increased using the gain adjusting transistor GX and the capacitor Cdcg as illustrated in FIG. 9, and the noise is increased, the increase of the signal-to-noise ratio (SNR) is insignificant.

According to example embodiments of the present disclosure, the shot noise and/or the circuit noise of the target color pixels (e.g., the blue color pixels) may be reduced and the sensing sensitivity of the target color pixels may be enhanced.

Figure 10:
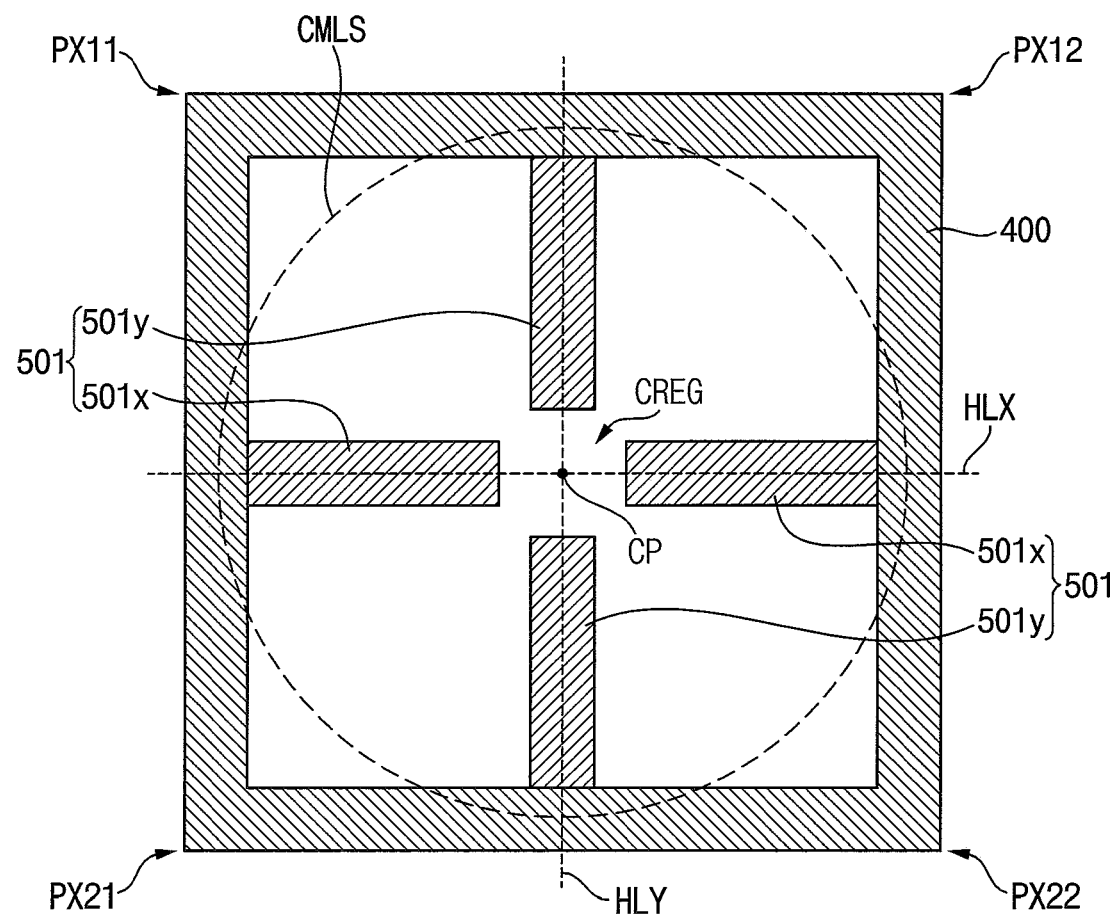
FIG. 10 is a plane view illustrating a layout of a pixel group included in an image sensor according to example embodiments of the present disclosure.
Figure 11A:
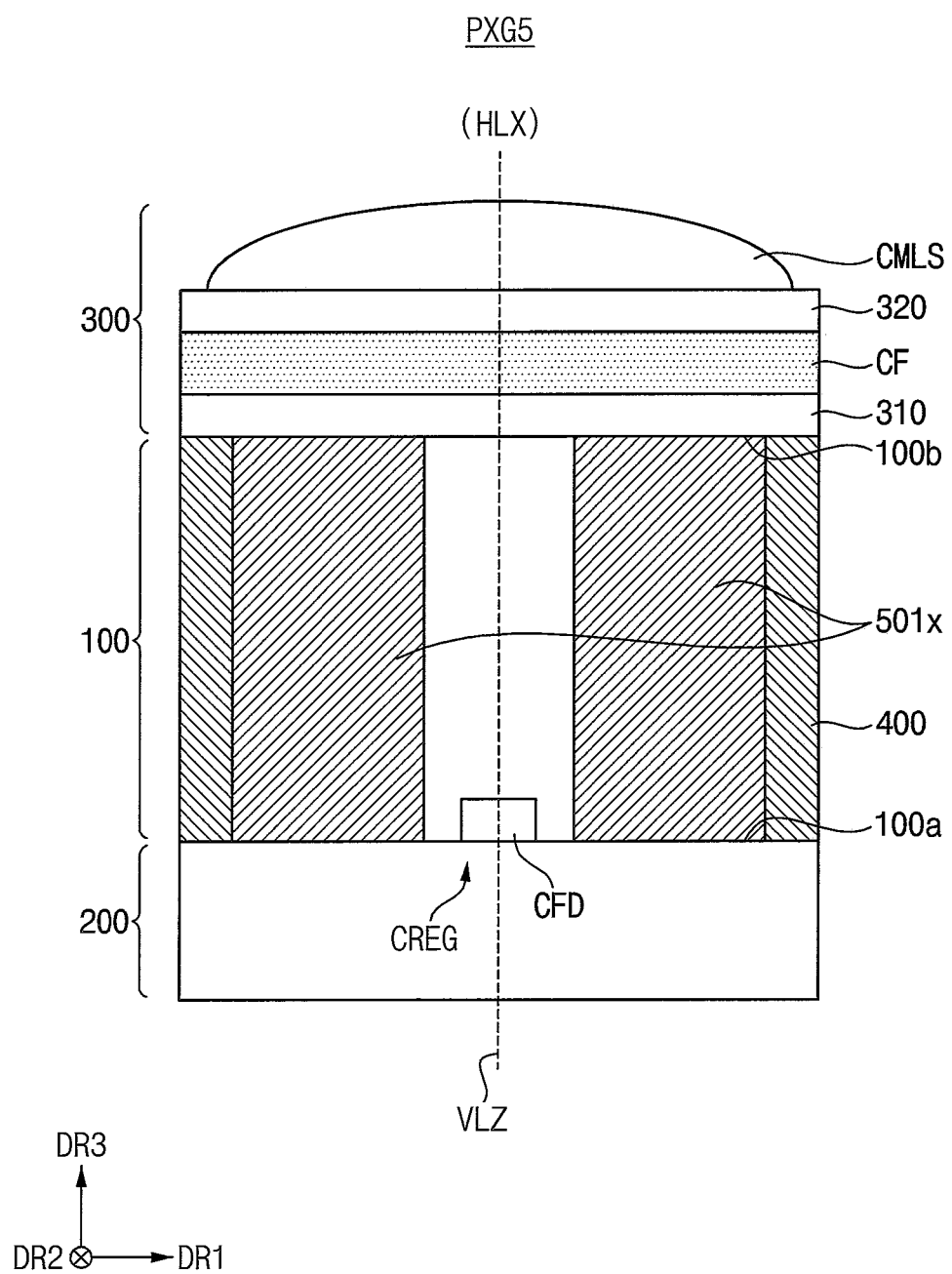
FIGS. 11A and 11B are cross-sectional views illustrating vertical structures of a pixel group included in an image sensor according to example embodiments of the present disclosure.
Figure 11B:
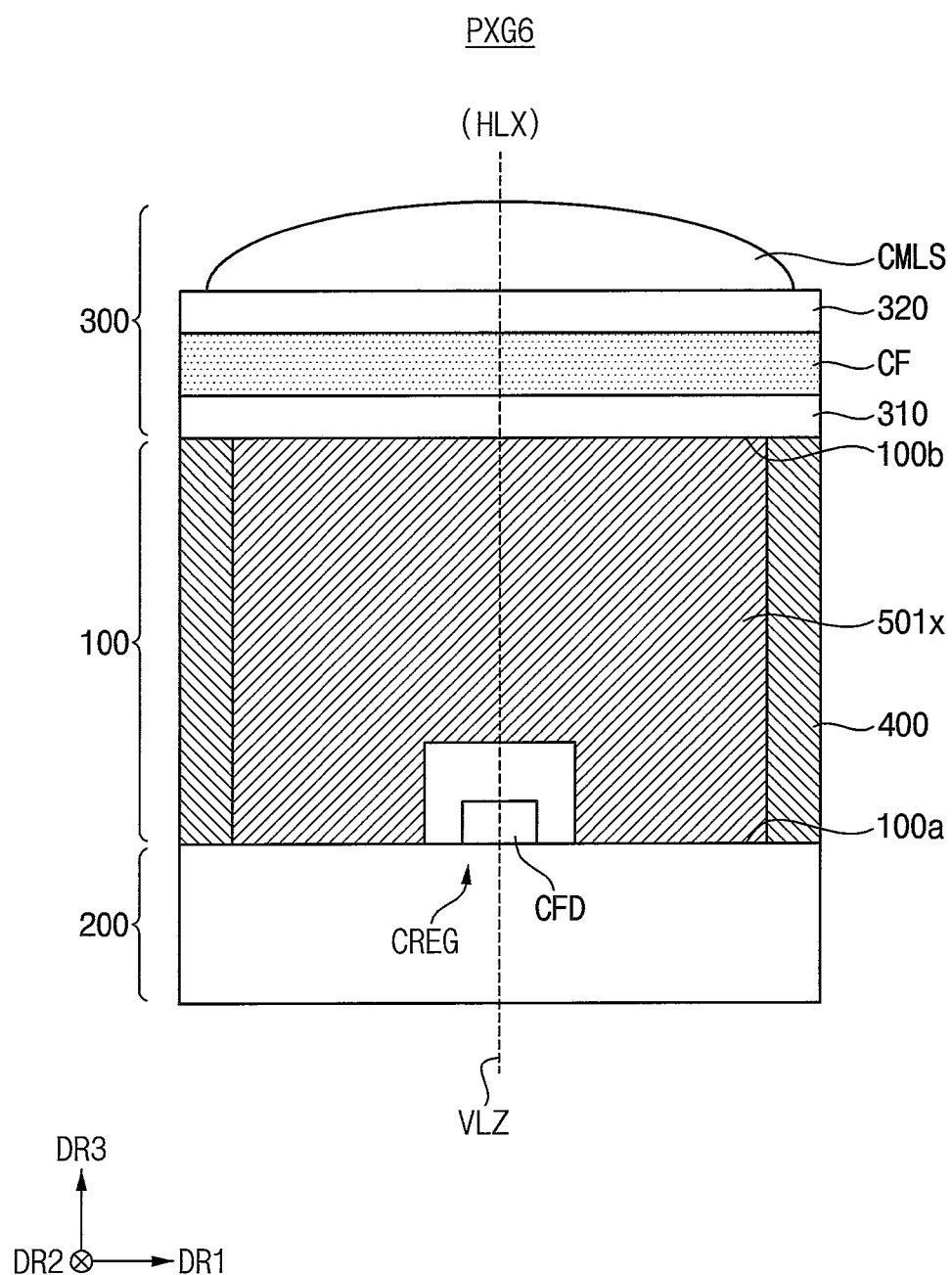

FIG. 10 is a plane view illustrating a layout of a pixel group included in an image sensor according to example embodiments of the present disclosure, and FIGS. 11A and 11B are cross-sectional views illustrating vertical structures of a pixel group included in an image sensor according to example embodiments of the present disclosure. FIGS. 11A and 11B are cross-sectional views of the pixel group PXG of FIG. 10 along the HLX line. The vertical structure along the HLY line may be substantially the same as shown in FIGS. 11A and 11B. The description repeated with FIGS. 1 through 2D may be omitted.

As described above, the inter-pixel trench structures 501 may include a first inter-pixel trench structure 501x and a second inter-pixel trench structure 501y. The first inter-pixel trench structure 501x may extend in the first horizontal direction DR1 to be connected to the inter-group trench structures 400 disposed at both sides of the pixel group PXG in the first horizontal direction DR1 and extend in the vertical direction DR3 from the upper surface 100a of the semiconductor substrate 100 to the lower surface 100b of the semiconductor substrate 100. The second inter-pixel trench structure 501y may extend in the second horizontal direction DR2 to be connected to the inter-group trench structures 400 disposed at both sides of the pixel group PXG in the second horizontal direction DR2 and extend in the vertical direction DR3 from the upper surface 100a of the semiconductor substrate 100 to the lower surface 100b of the semiconductor substrate 100.

Referring to FIG. 10, a pixel group PXG4 has a structure such that at least a portion of the first inter-pixel trench structure 501x and at least a portion of the second inter-pixel trench structure 501y may be removed in a cross region CREG of the first inter-pixel trench structure 501x and the second inter-pixel trench structure 501y. In other words, the first inter-pixel trench structure 501x and the second inter-pixel trench structure 501y may not overlap a center CP of the pixel group PXG4. For example, the ratio of the horizontal lengths of the removed portion of the first inter-pixel trench structure 501x and the second inter-pixel trench structure 501y may be 0.15 through 0.40. The electrons may overflow through the removed portion of the first inter-pixel trench structure 501x and the second inter-pixel trench structure 501y between the unit pixels PX11~PX22 and the amount of the overflowing electrons may be controlled by a potential profile in the semiconductor substrate 100. The potential profile may be determined by the removed portion of the first inter-pixel trench structure 501x and the second inter-pixel trench structure 501y and the manufacturing process.

In some example embodiments of the present disclosure, in a pixel group PXG5 illustrated in FIG. 11A, an entire portion of the first inter-pixel trench structure 501x corresponding to the cross region CREG and an entire portion of the second inter-pixel trench structure 501y corresponding the cross region CREG may be removed from the upper surface 100a of the semiconductor substrate 100 to the lower surface 100b of the semiconductor substrate 100. In other words, in the cross region CREG an empty space may be present due to the absence of the first and second inter-pixel trench structures 501x and 501y.

In some example embodiments of the present disclosure, in a pixel group PXG6 illustrated in FIG. 11B, only a portion of the first inter-pixel trench structure 501x corresponding to the cross region CREG and only a portion of the second inter-pixel trench structure 501y corresponding to the cross region CREG may be removed near the upper surface 100a of the semiconductor substrate 100.

Figure 12:
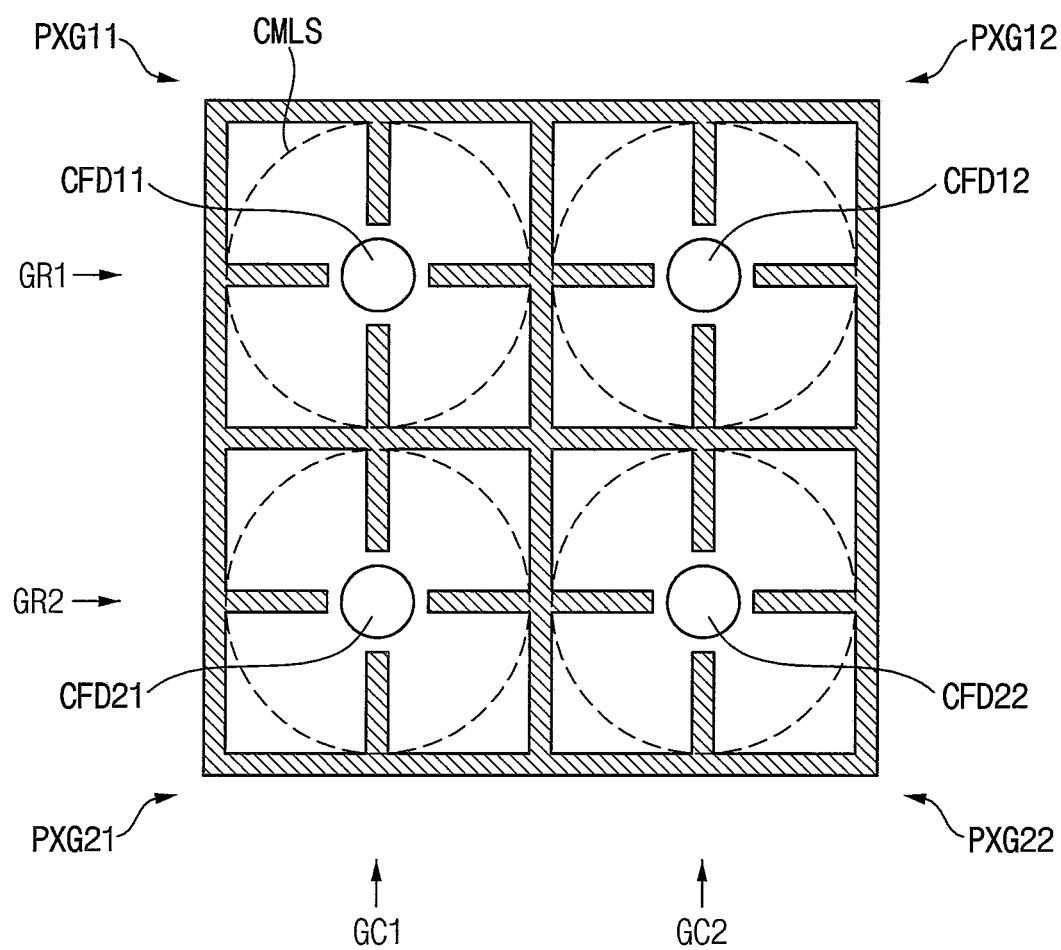
FIG. 12 is a plane view illustrating pixel groups adopting the shared structure of FIG. 7.

The common floating diffusion region CFD as described with reference to FIGS. 7 and 8, which are shared by the unit pixels PX11~PX22, may be disposed at the cross region CREG FIG. 12 is a plane view illustrating pixel groups adopting the shared structure of FIG. 7.

The dotted circles in FIG. 12 represent the common microlenses CMLS and each common microlens CMLS is shared by unit pixels in each pixel group. FIG. 12 illustrates four pixel groups PXG1~PXG22 arranged in a matrix form of two group rows GR1 and GR2 and two group columns GC1 and GC2 for convenience of illustration and description, and the various number of the pixel groups may be arranged repeatedly in the first horizontal direction DR1 and the second horizontal direction DR2. Each of the pixel groups PXG11~PXG22 may include four unit pixels arranged in a matrix form of two pixel rows and two pixel columns. Four common floating diffusion regions CFD11~CFD22 are provided in the four pixel groups PXG11~PXG22.

FIGS. 13A through 14B are diagrams illustrating example embodiments of the present disclosure electrically connecting common floating diffusion regions of the pixel groups of FIG. 12.

Figure 13A:
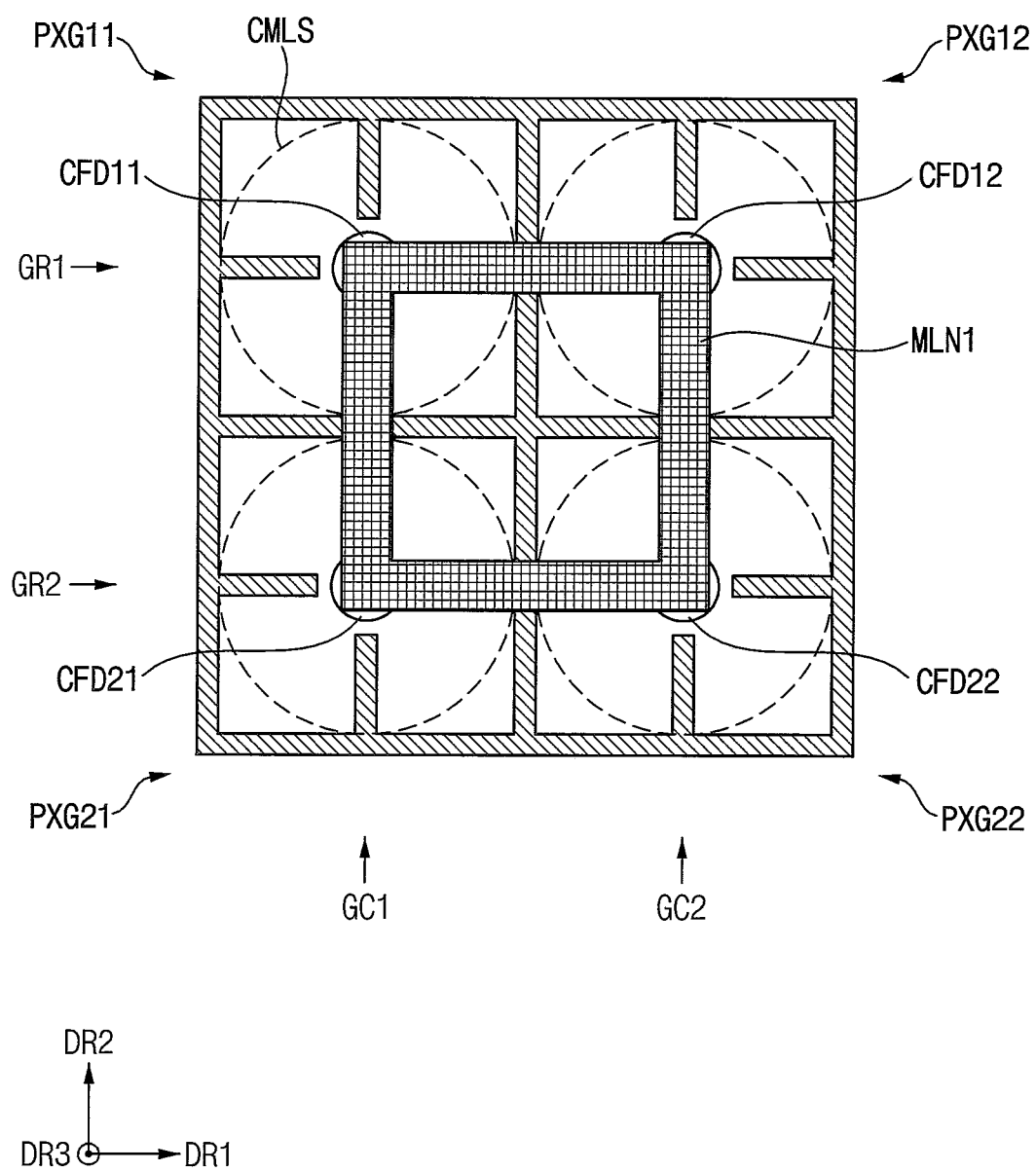
FIGS. 13A, 13B, 13C, 14A and 14B are diagrams illustrating example embodiments of the present disclosure electrically connecting common floating diffusion regions of the pixel groups of FIG. 12.
Figure 13B:
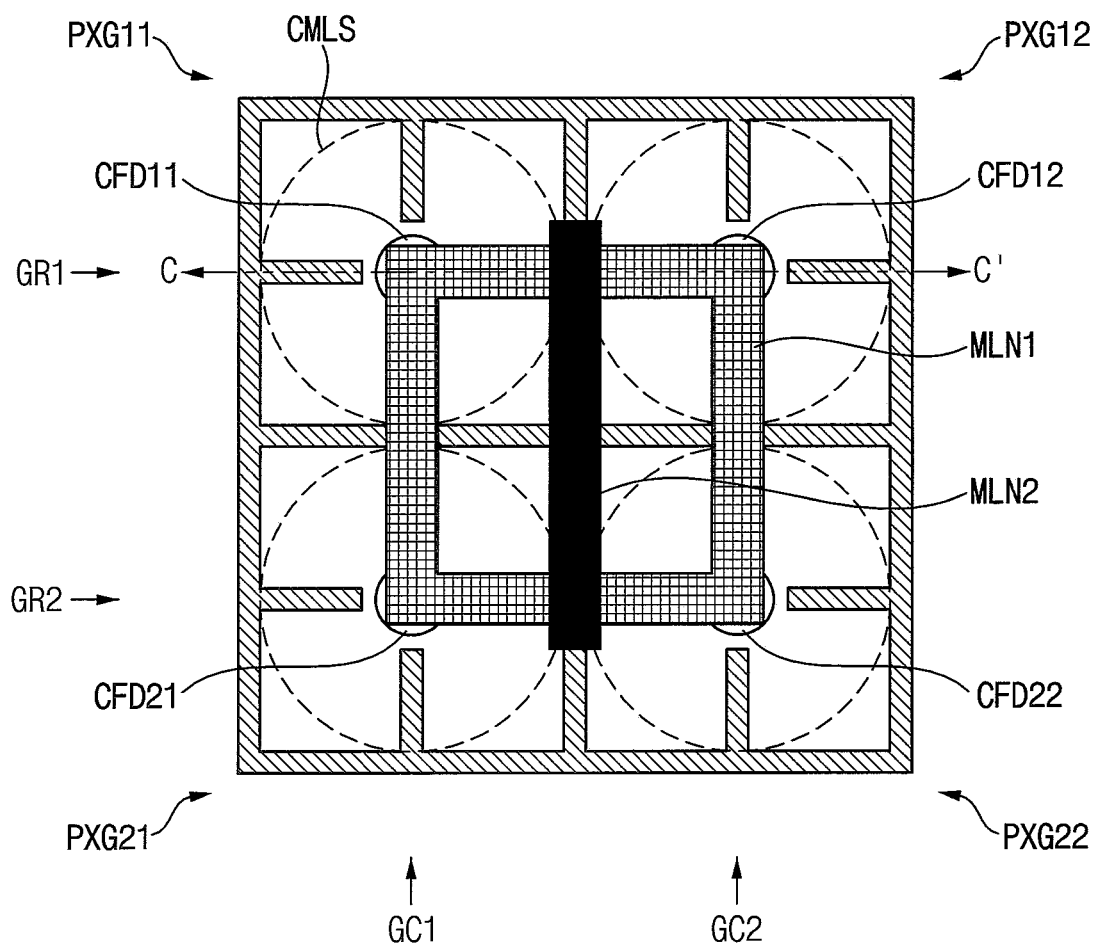
Figure 13B:
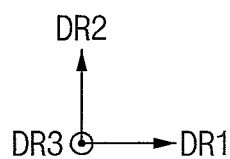

As illustrated in FIG. 13A, four common floating diffusion regions CFD11~CFD22 of the four pixel groups PXG11~PXG22 may be electrically connected by first conduction lines MLN1. In FIG. 13A, the first conduction lines MLN1 are illustrated as a square. In addition, as illustrated in FIG. 13B, at least two first conduction lines MLN1 may be electrically connected by at least one second conduction line MLN2. For example, the two opposite first conduction lines MLN1 may be connected to each other by one second conduction line MLN2.

Figure 13C:
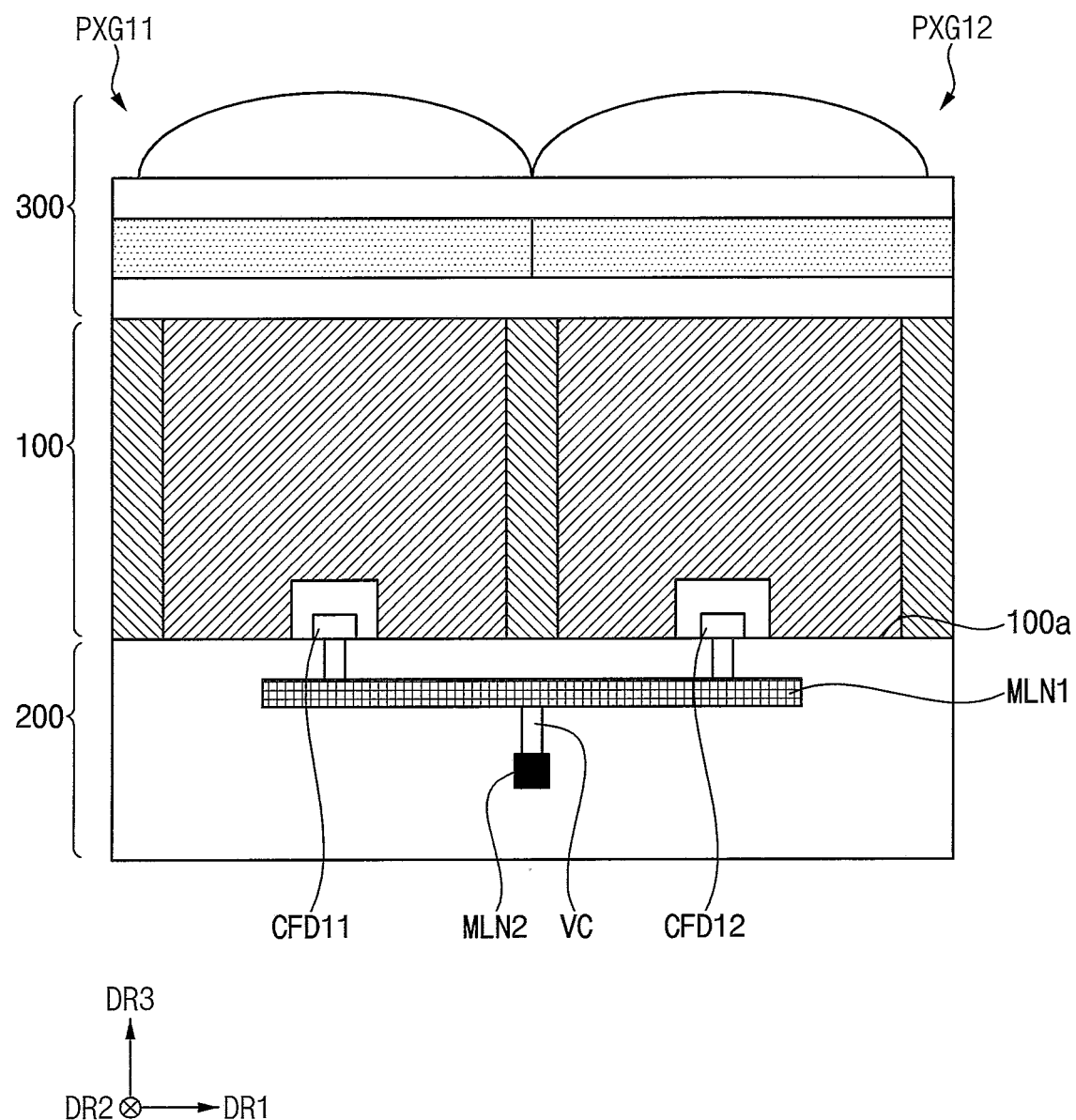

Referring to FIG. 13C, the first conduction lines MLN1 and the second conduction lines MLN2 may be disposed above the upper surface 100a of the semiconductor substrate 100, in other words, in the interconnection layer 200, and may be electrically connected to the common floating diffusion regions CFD11~CFD22 through vertical contacts VC. FIG. 13C illustrates a non-limiting example where the second conduction line MLN2 is disposed in a conduction layer different from the first conduction line MLN1. In some embodiments of the present disclosure, the first and second conduction lines MLN1 and MLN2 may be disposed in the same conduction layer.

Figure 14A:
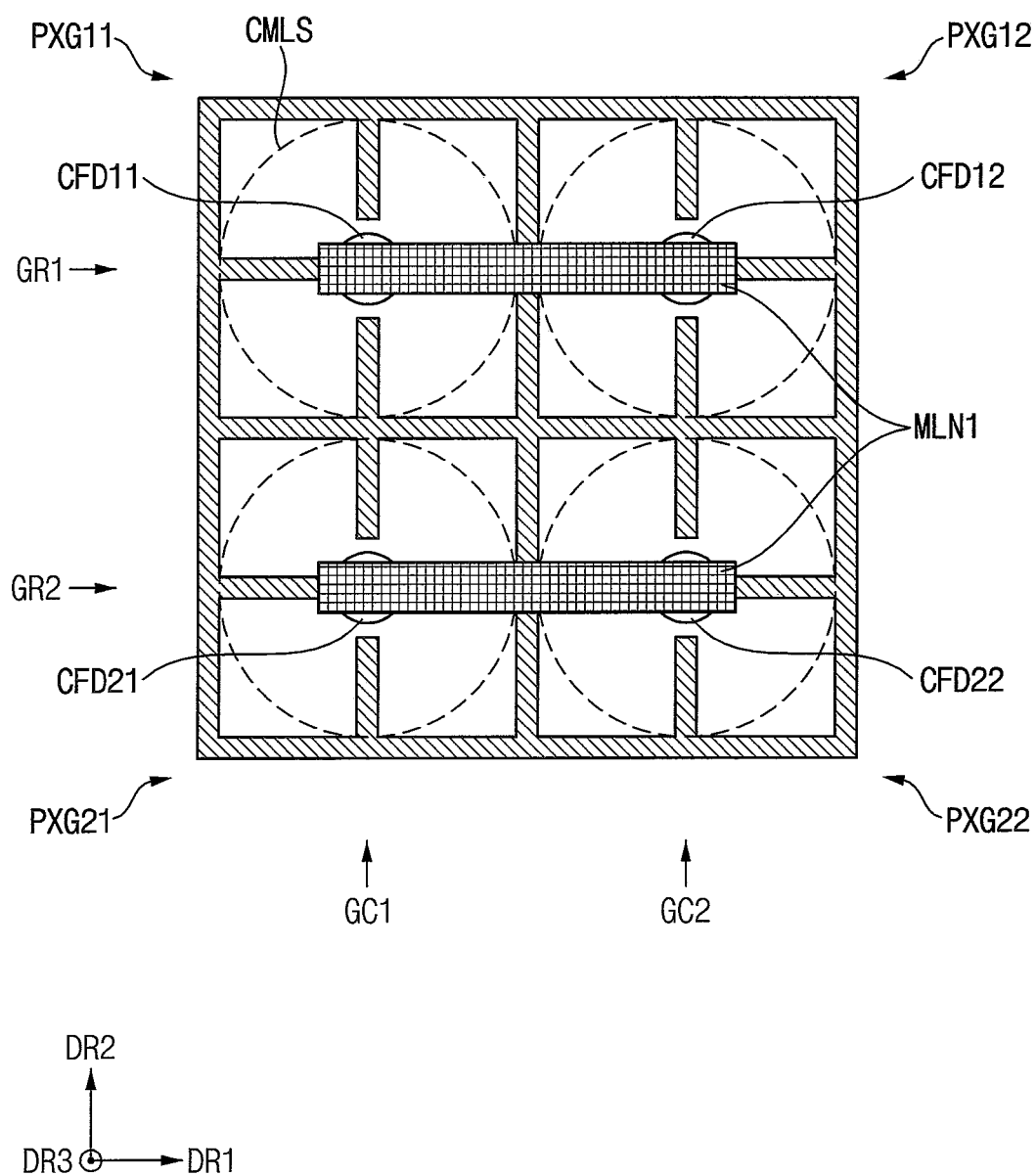
Figure 14B:
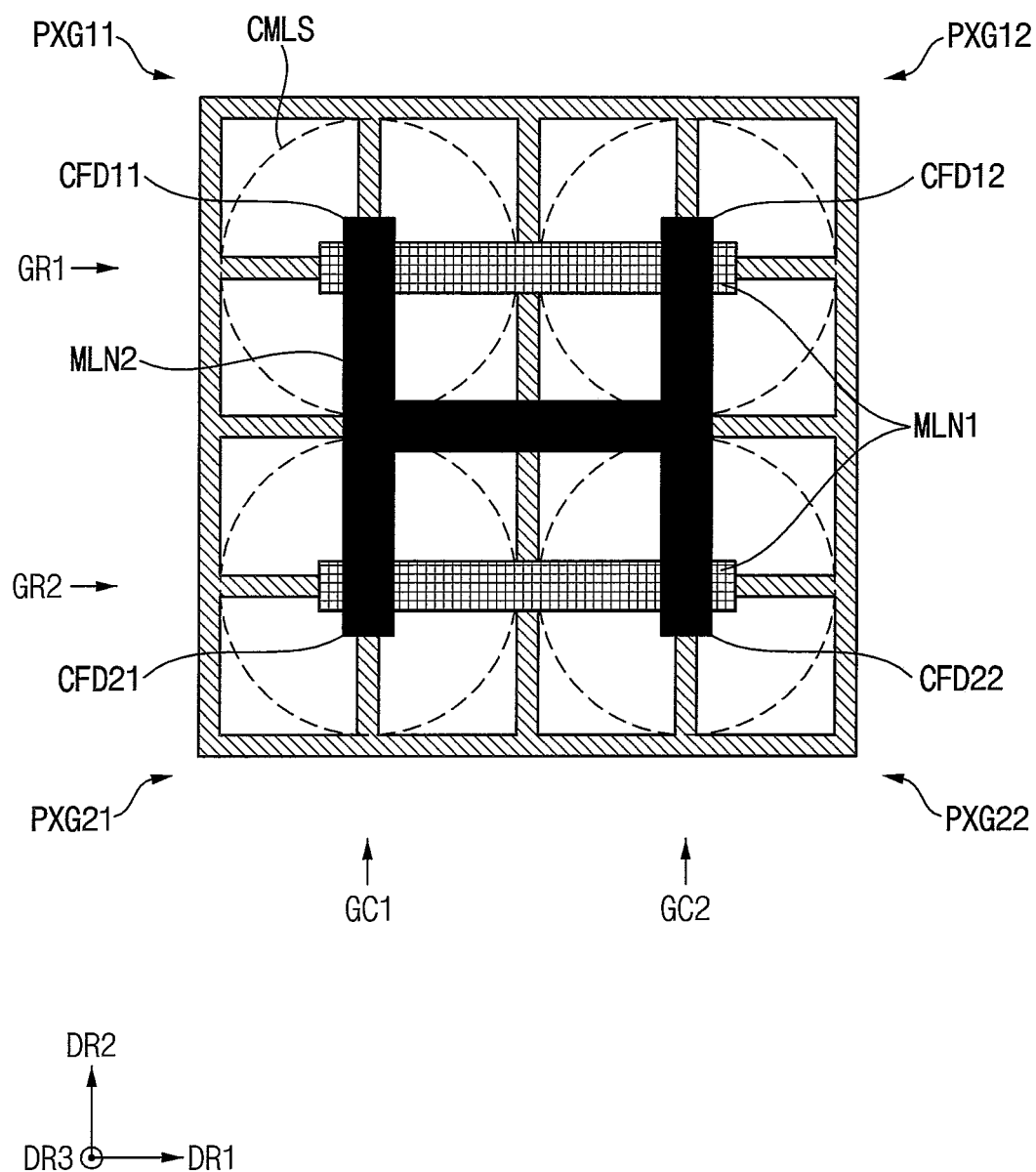

The electric connection between the common floating diffusion regions CFD11~CFD22 may be implemented variously. For example, the two common floating diffusion regions CFD11 and CD12 may be electrically connected by the one first conduction line MLN1 and the other two common floating diffusion regions CFD21 and CD22 may be electrically connected by the another first conduction line MLN1, as illustrated in FIG. 14A. The two first conduction lines MLN1 may be electrically connected by the second conduction line MLN2, as illustrated in FIG. 14B.

Figure 15:
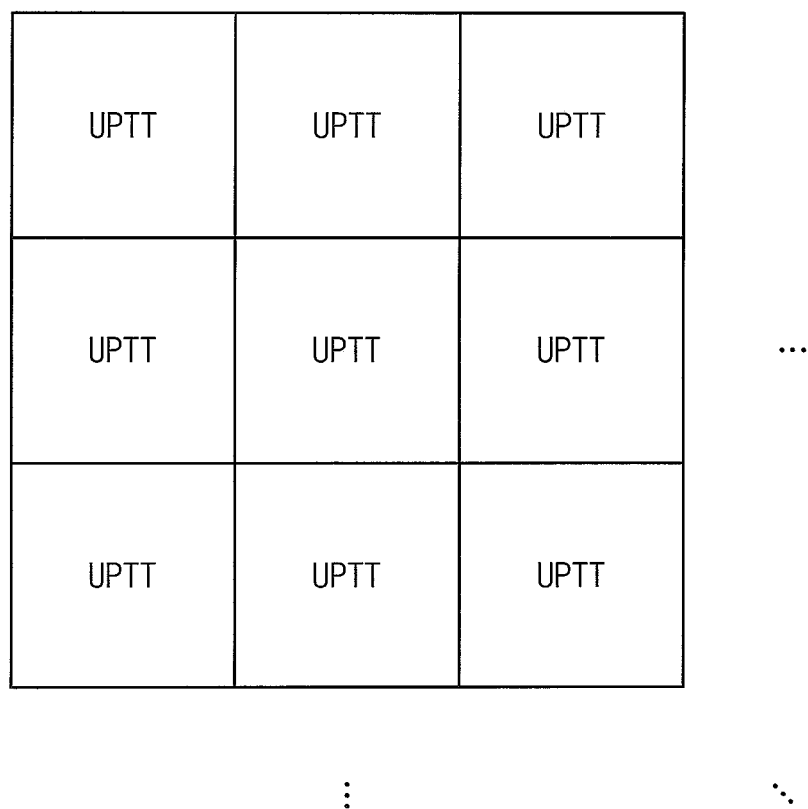
FIG. 15 is a diagram illustrating a layout of a pixel array according to example embodiments of the present disclosure.

FIG. 15 is a diagram illustrating a layout of a pixel array according to example embodiments of the present disclosure.

Referring to FIG. 15, the pixel array 620 in the image sensor 500 of FIG. 4 may be divided into unit patterns UPTT that are arranged repeatedly in the first horizontal direction DR1 and the second horizontal direction DR2. Each unit pattern UPTT may include two or more pixel groups where each pixel group may include a plurality of unit pixels sharing a common microlens CMLS as described above.

In some example embodiments of the present disclosure, all of the unit patterns UPTT in the pixel array 620 may be identical. In this case, the unit pattern UPTT is a minimum pattern that cannot be divided into smaller patterns. In some example embodiments of the present disclosure, the unit patterns UPTT in the pixel array 620 may include two or more different patterns such that the different patterns are arranged regularly in the first horizontal direction DR1 and/or the second horizontal direction DR2.

Hereinafter, various color filter array and unit patterns according to example embodiments of the present disclosure are described with reference to FIGS. 16A through 20C. The unit pattern may be inverted in the first horizontal direction DR1 and/or the second horizontal direction DR2, or the unit pattern may be rotated around the vertical direction by 90 degrees or 180 degrees.

In FIGS. 16A through 20C, a unit pixel corresponding to a red filter is referred to as a red pixel R, a unit pixel corresponding to a green filter is referred to as a green pixel G, a unit pixel corresponding to a blue filter is referred to as a blue pixel B, a unit pixel corresponding to a yellow filter is referred to as a yellow pixel Y, and a unit pixel corresponding to a cyan filter is referred to as a cyan pixel C. For a pixel group PXGij, i indicates an index of a corresponding group row, and j indicates an index of a corresponding group column. When the unit pixels in each pixel group correspond to the same color, the unit pixels in each pixel group may share a single color filter CF.

FIGS. 16A through 17B are plane views illustrating a unit pattern of a 4*4 size included in a pixel array according to example embodiments of the present disclosure.

Referring to FIGS. 16A through 17B, each of unit patterns UPTT1~UPTT7 having a 4*4 size may include first through fourth pixel groups PXG11~PXG22 arranged in a matrix form of two group rows GR1 and GR2 and two group columns GC1 and GC2. Each of the first through fourth pixel groups PXG11~PXG22 may include four unit pixels arranged in a matrix form of two pixel rows and two pixel columns.

Figure 16A:
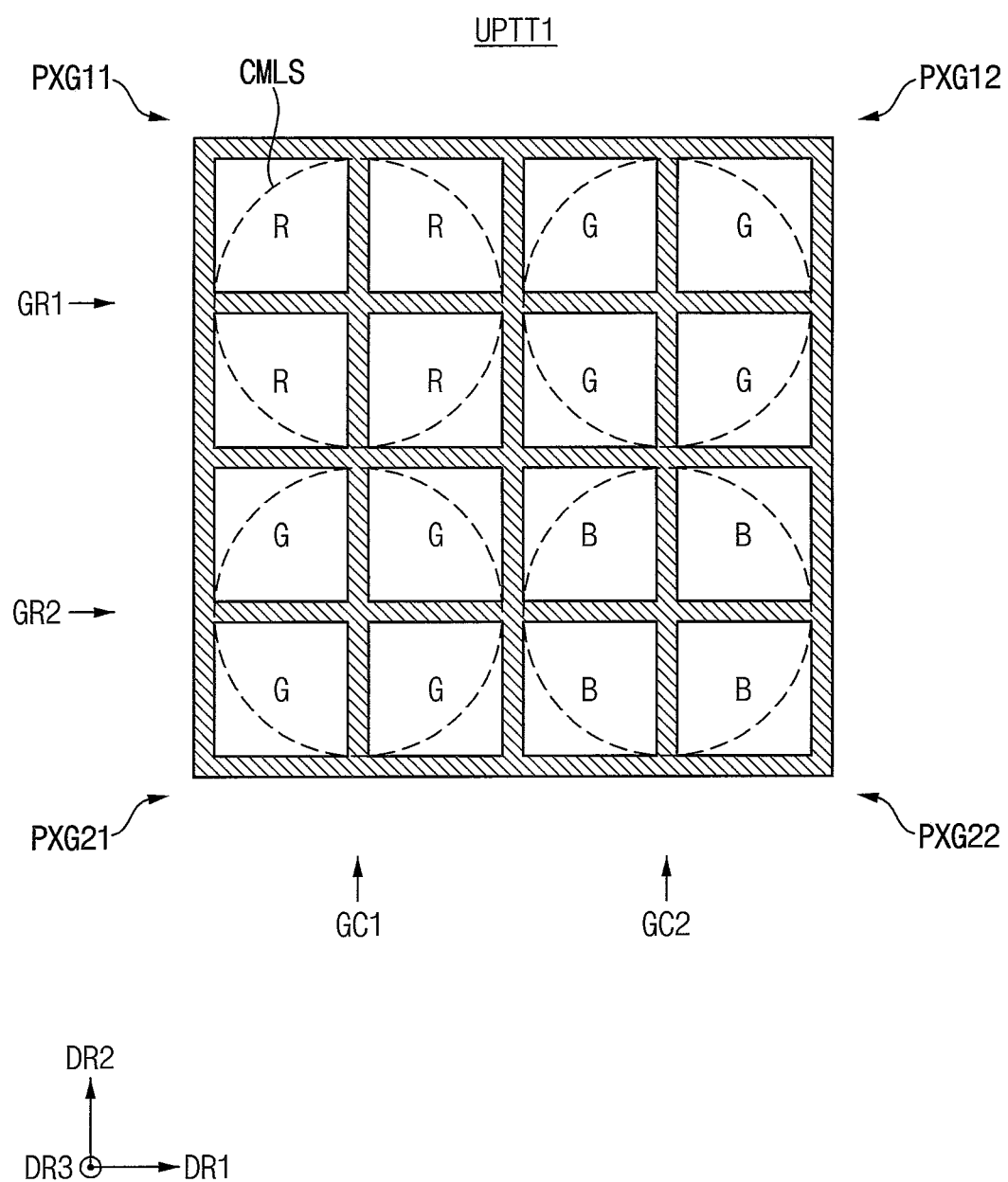
FIGS. 16A, 16B, 16C, 16D, 16E, 17A and 17B are plane views illustrating a unit pattern of a 4*4 size included in a pixel array according to example embodiments of the present disclosure.

In some example embodiments of the present disclosure, as the unit pattern UPTT1 illustrated in FIG. 16A, the first pixel group PXG11 may include four red pixels R, each of the second and third pixel groups PXG12 and PXG21 may include four green pixels C, and the fourth pixel group PXG22 may include four blue pixels B.

Figure 16B:
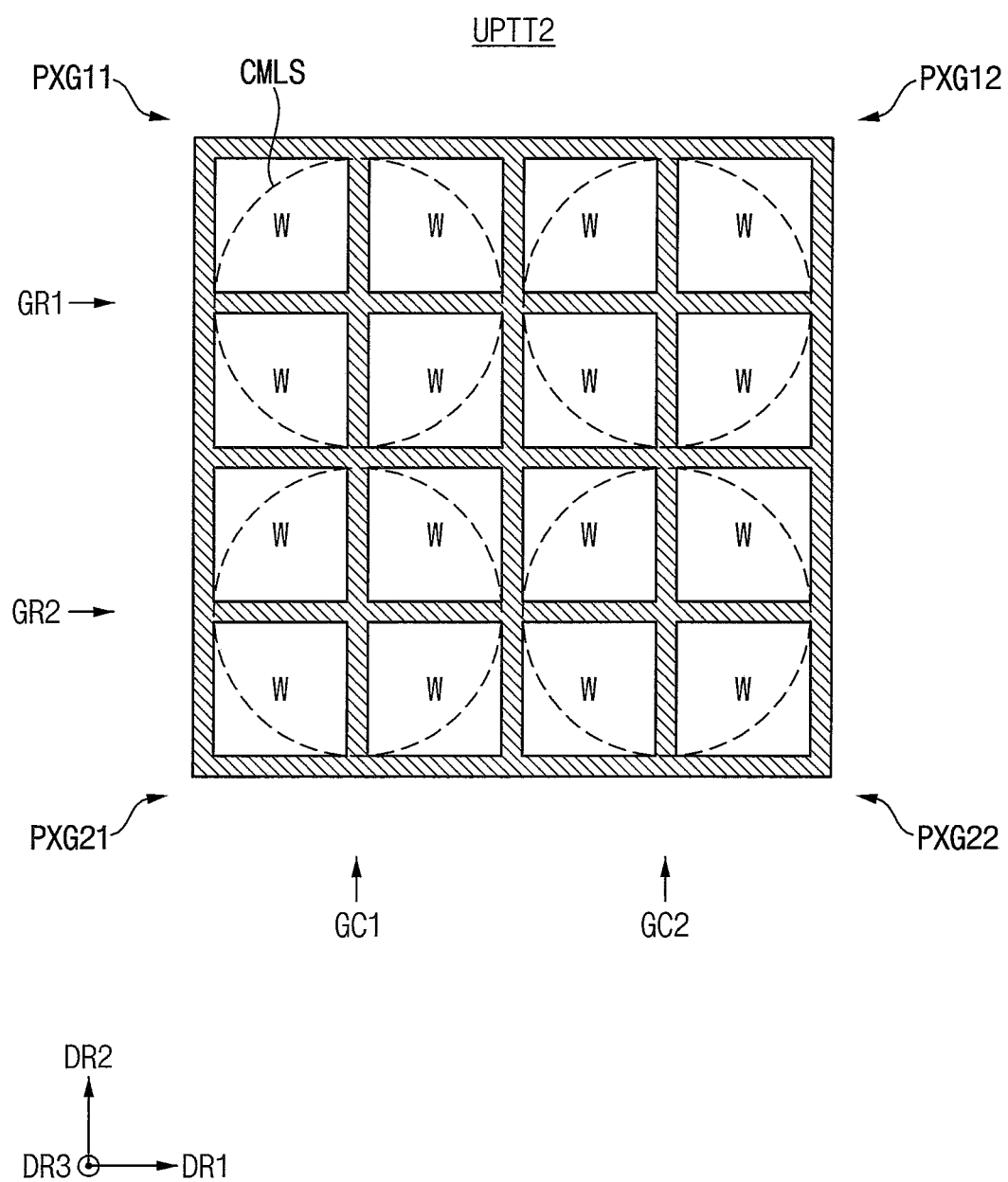

In some example embodiments of the present disclosure, as the unit pattern UPTT2 illustrated in FIG. 16B, each of the first through fourth pixel groups PXG11~PXG22 may include four white pixels W.

Figure 16C:
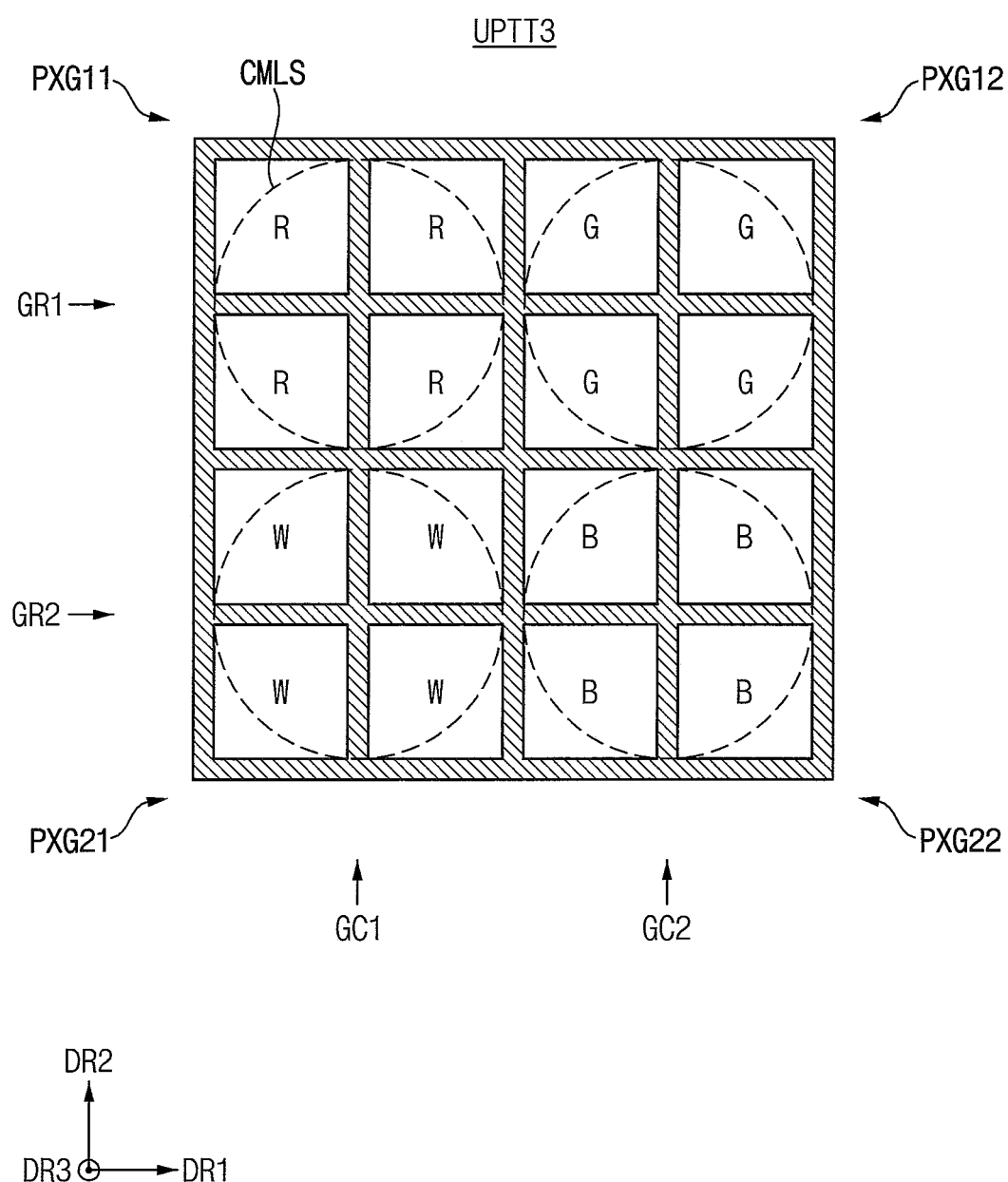

In some example embodiments of the present disclosure, as the unit pattern UPTT3 illustrated in FIG. 16C, the first pixel group PXG11 may include four red pixels R, the second pixel group PXG12 may include four green pixels G, the third pixel group PXG21 may include four white pixels W, and the fourth pixel group PXG22 may include four blue pixels B.

Figure 16D:
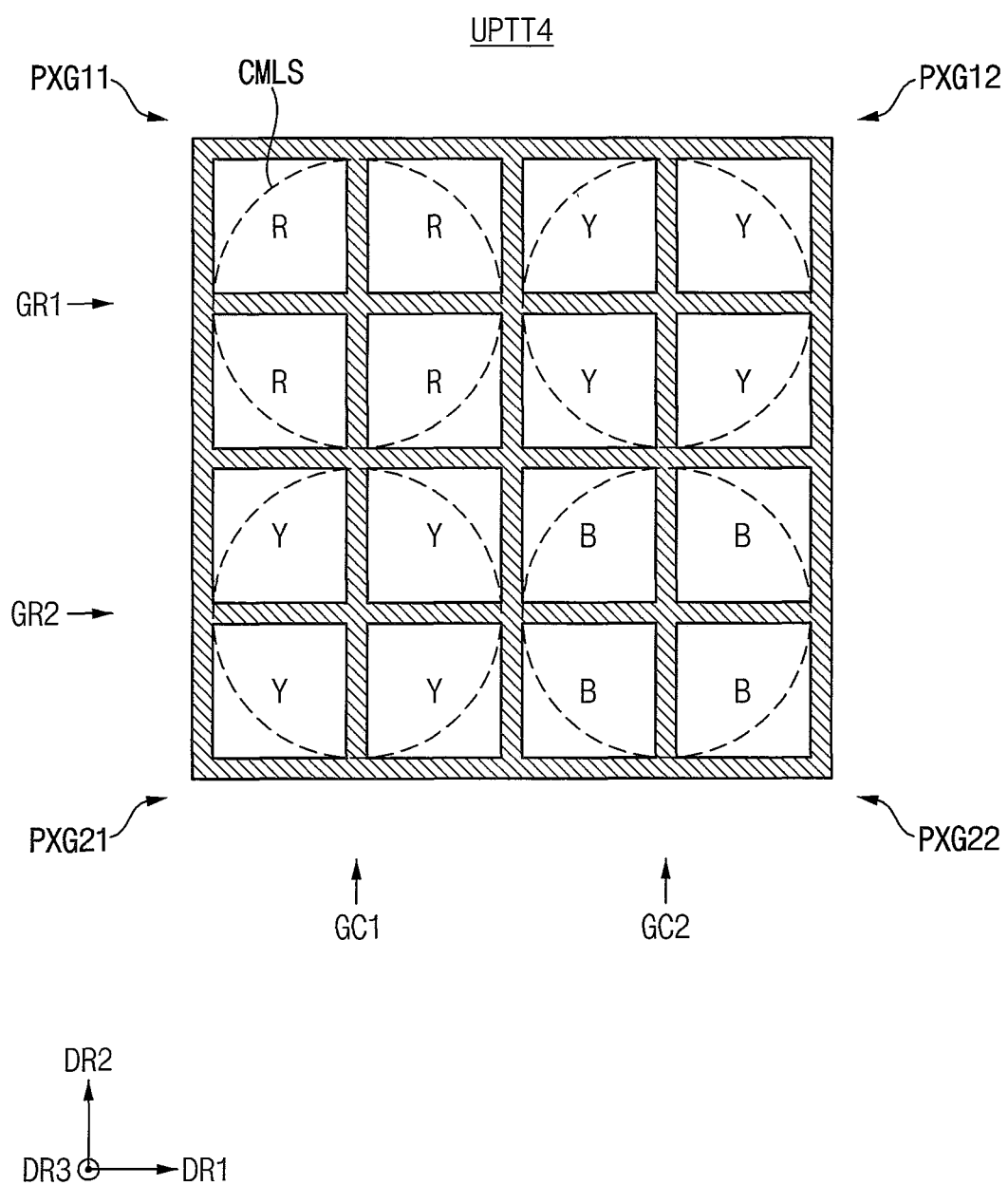

In some example embodiments of the present disclosure, as the unit pattern UPTT4 illustrated in FIG. 16D, the first pixel group PXG11 may include four red pixels R, each of the second and third pixel groups PXG12 and PXG21 may include four yellow pixels Y, and the fourth pixel group PXG22 may include four blue pixels B.

Figure 16E:
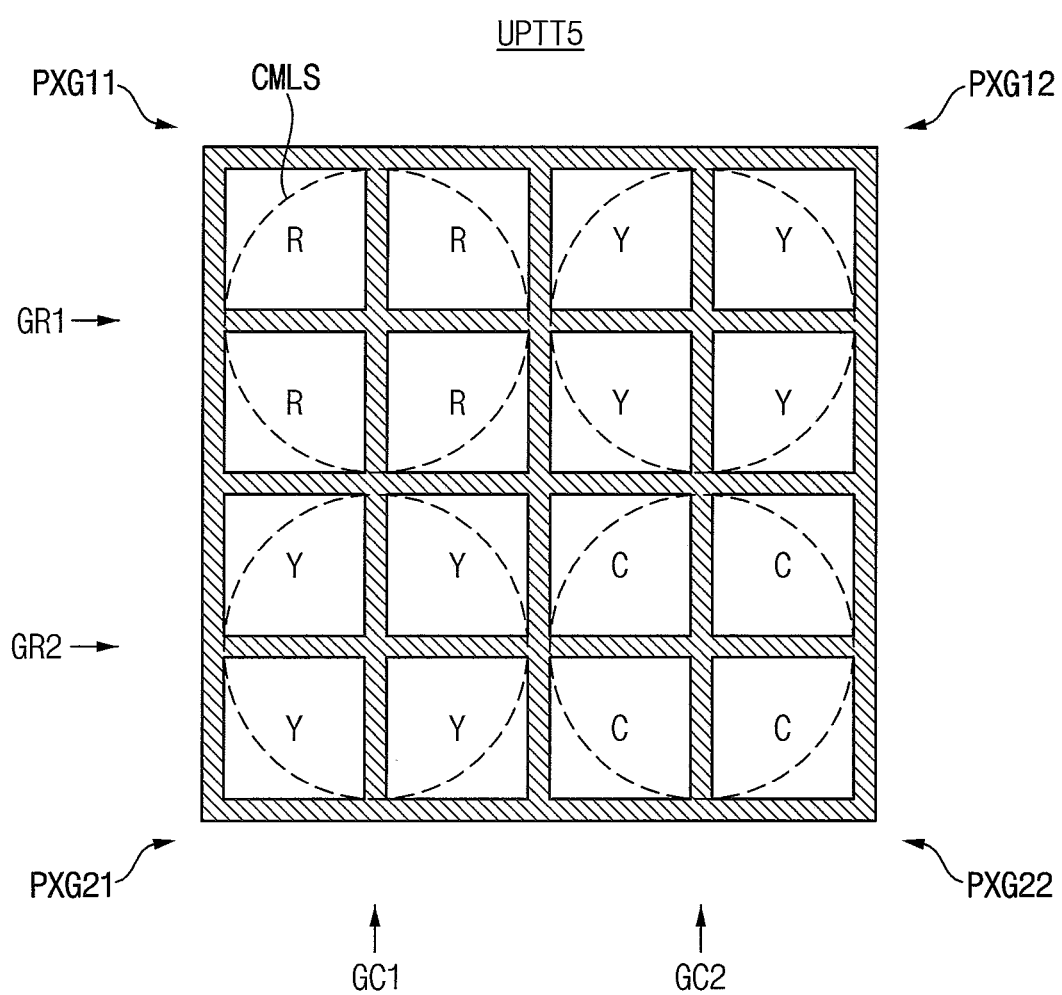

In some example embodiments of the present disclosure, as the unit pattern UPTT5 illustrated in FIG. 16E, the first pixel group PXG11 may include four red pixels R, each of the second and third pixel groups PXG12 and PXG21 may include four yellow pixels Y, and the fourth pixel group PXG22 may include four cyan pixels C.

Figure 17A:
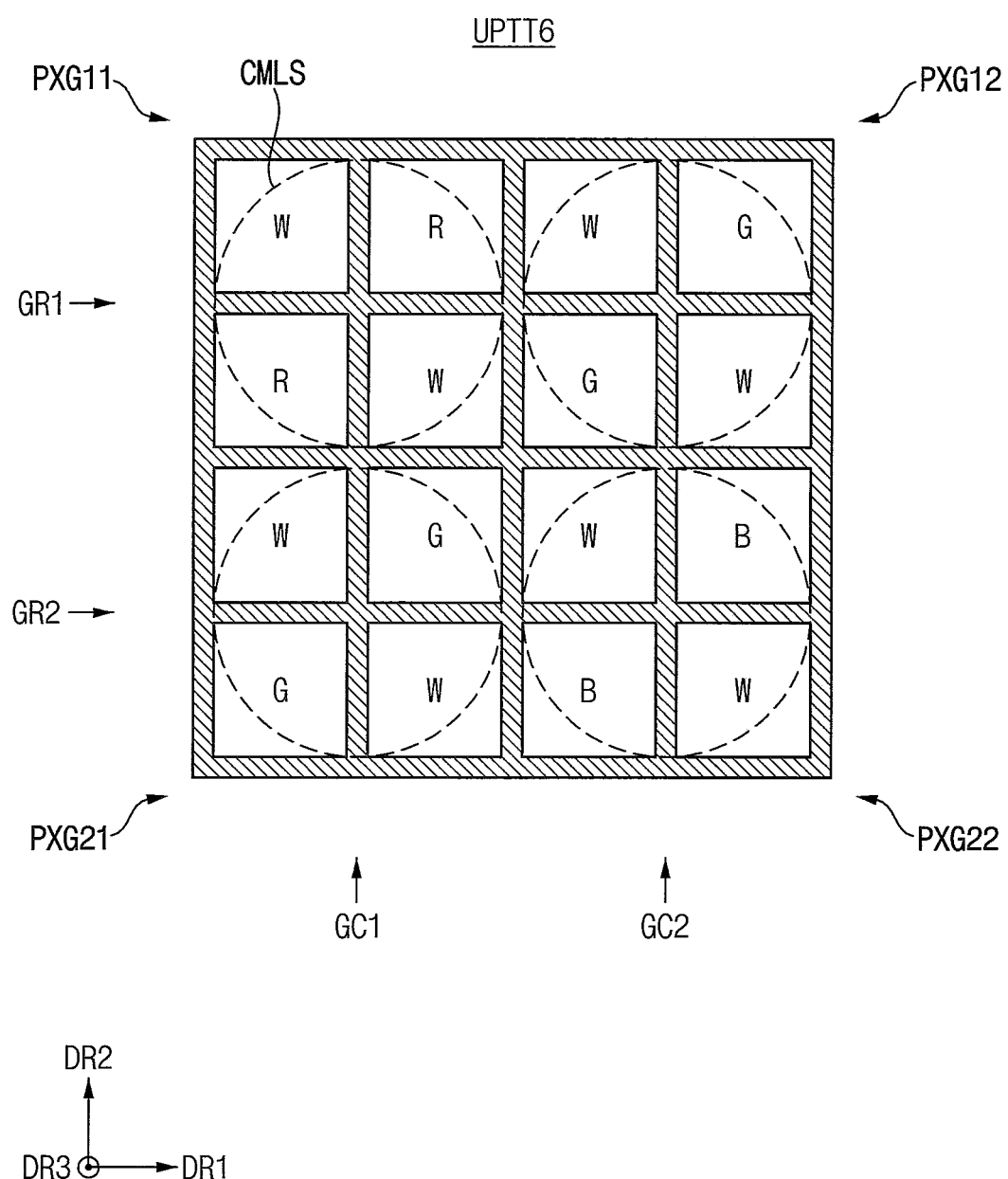

In some example embodiments of the present disclosure, as the unit pattern UPTT6 illustrated in FIG. 17A, the first pixel group PXG11 may include two red pixels R and two white pixels W, each of the second and third pixel groups PXG12 and PXG21 may include two green pixels G and two white pixels W, and the fourth pixel group PXG22 may include two blue pixels B and two white pixels W.

Figure 17B:
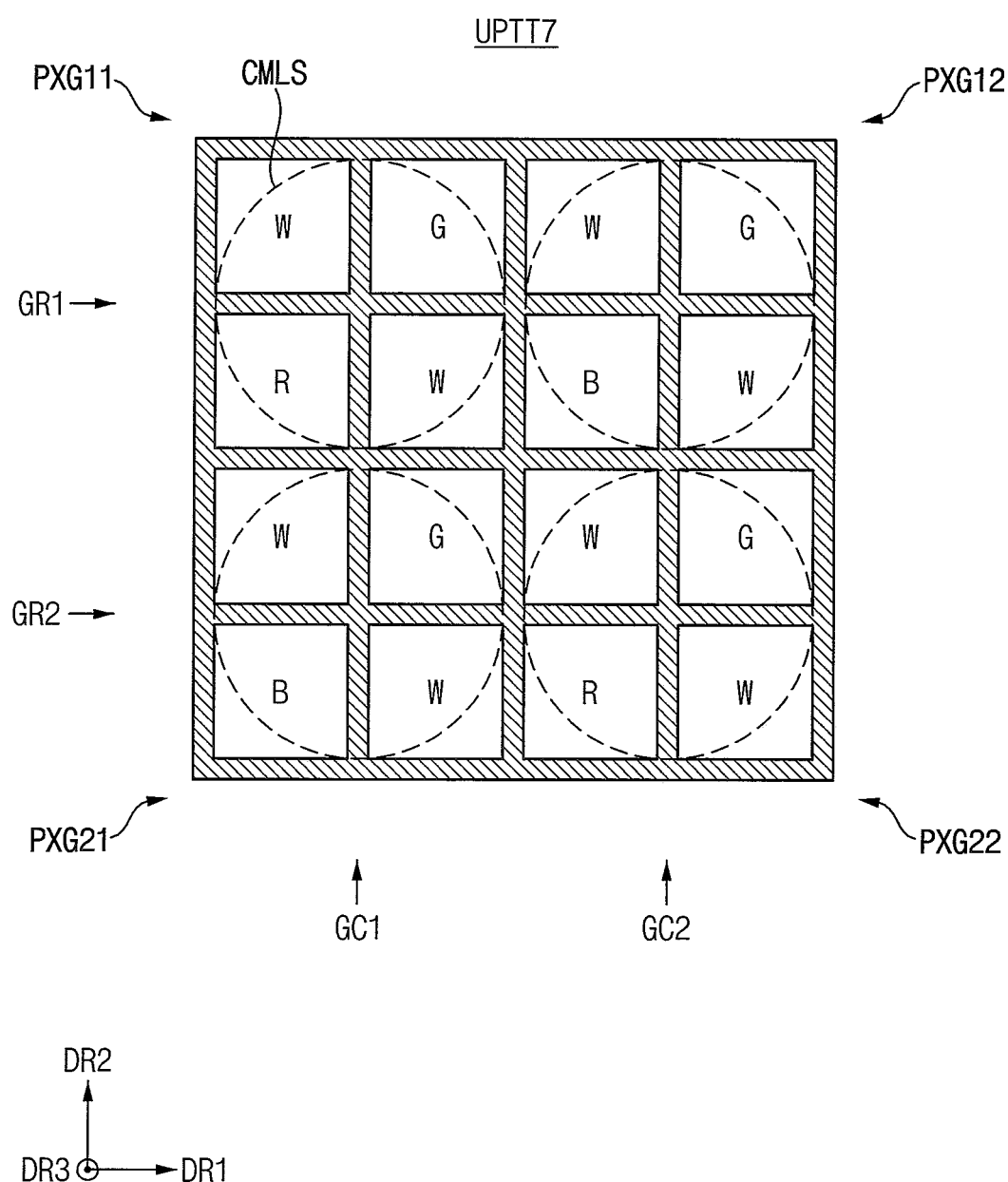

In some example embodiments of the present disclosure, as the unit pattern UPTT7 illustrated in FIG. 17B, each of the first and fourth pixel groups PXG11 and PXG22 may include two white pixels W, one green pixel G and one red pixel R, each of the second and third pixel groups PXG12 and PXG21 may include two white pixels W, one green pixel G and one blue pixel B.

Figure 18A:
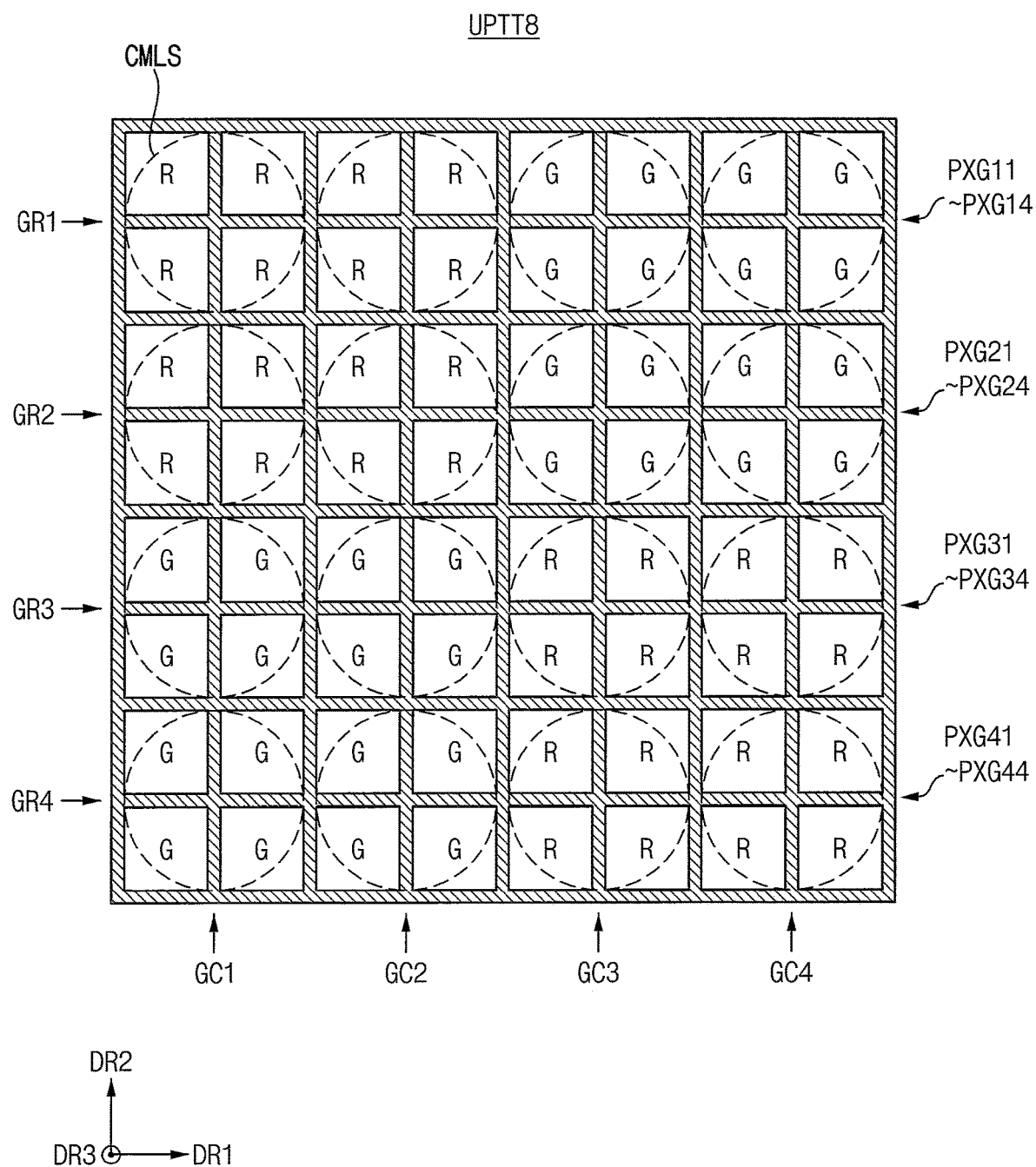
FIGS. 18A, 18B and 18C are plane views illustrating a unit pattern of a 8*8 size included in a pixel array according to example embodiments of the present disclosure.
Figure 18B:
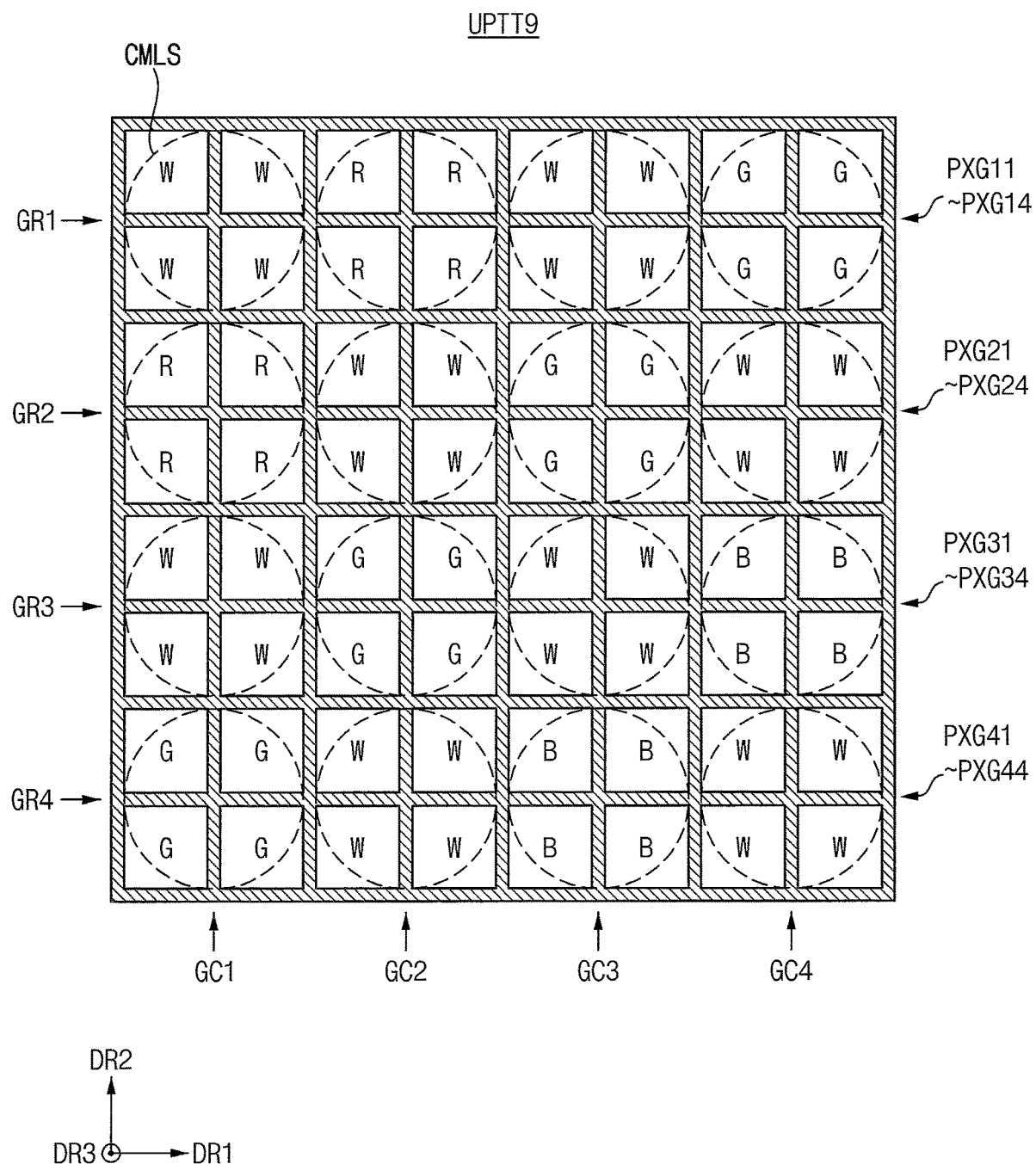
Figure 18C:
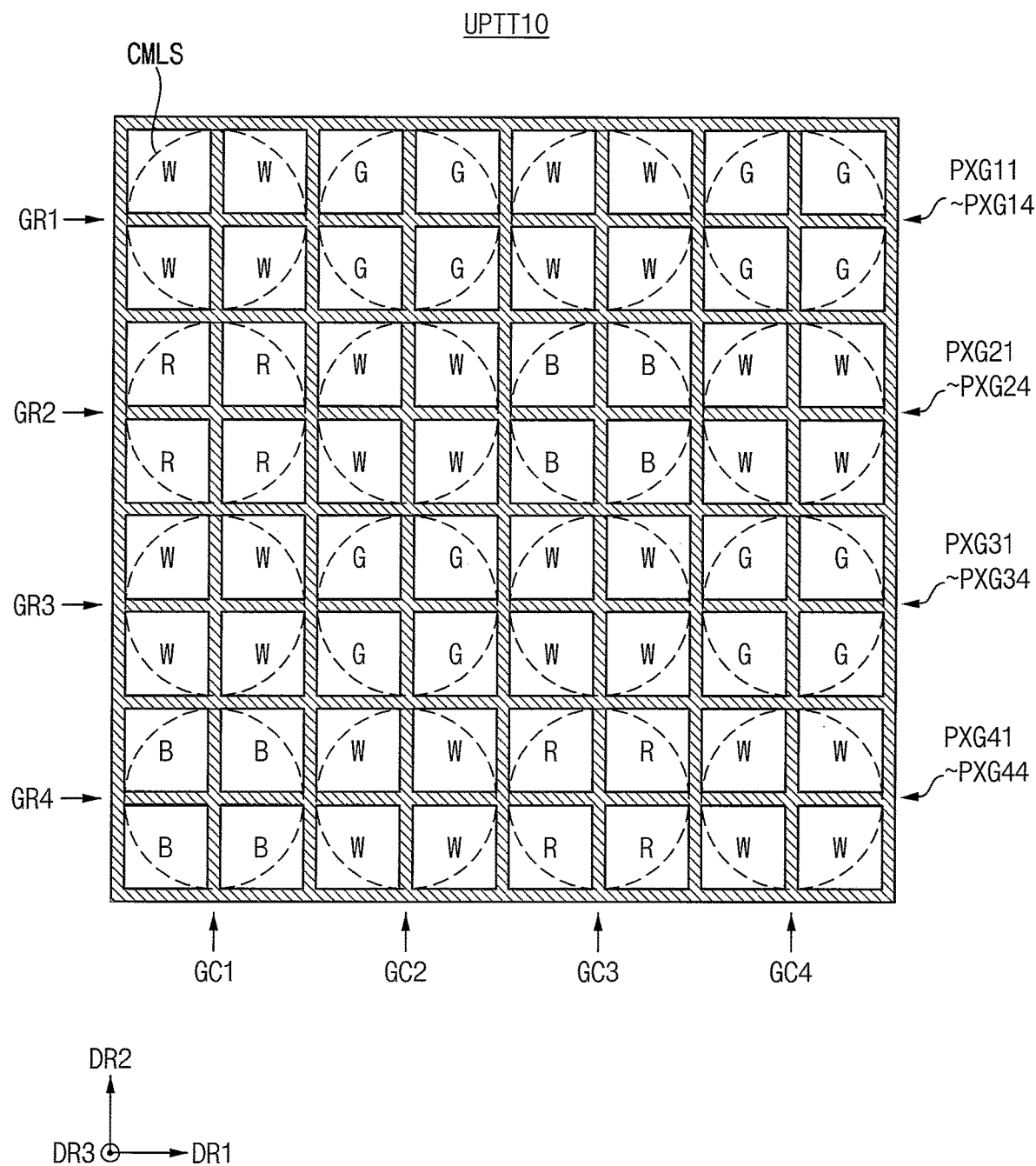

FIGS. 18A through 18C are plane views illustrating of a unit pattern of a 8*8 size included in a pixel array according to example embodiments of the present disclosure.

Referring to FIGS. 18A through 18C, each of unit patterns UPTT8~UPTT10 having a 8*8 size may include first through sixteenth pixel groups PXG11~PXG44 arranged in a matrix form of first through fourth group rows GR1~GR4 and first through fourth group columns GC1-GC4. The first through fourth pixel groups PXG11, PXG12, PXG21 and PXG22 may be arranged in a matrix form of the first and second group rows GR1 and GR2 and the first and second group columns GC1 and GC2. The fifth through eighth pixel groups PXG13, PXG14, PXG23 and PXG24 may be arranged in a matrix form of the first and second group rows GR1 and GR2 and the third and fourth group columns GC3 and GC4. The ninth through twelfth pixel groups PXG31, PXG32, PXG41 and PXG42 may be arranged in a matrix form of the third and fourth group rows GR3 and GR4 and the first and second group columns GC1 and GC2. The thirteenth through sixteenth pixel groups PXG33, PXG34, PXG43 and PXG44 may be arranged in a matrix form of the third and fourth group rows GR3 and GR4 and the third and fourth group columns GC3 and GC4. Each of the first through sixteenth pixel groups PGX11~PGX44 may include four unit pixels arranged in a matrix form of two pixel rows and two pixel columns.

In some example embodiments of the present disclosure, as the unit pattern UPTT8 illustrated in FIG. 18A, each of the first through fourth pixel groups PXG11, PXG12, PXG21 and PXG22 may include four red pixels R, each of the fifth through twelfth pixel groups PXG13, PXG14, PXG23, PXG24, PXG31, PXG32, PXG41 and PXG42 may include four green pixels Q and each of the thirteenth through sixteenth pixel groups PXG33, PXG34, PXG43 and PXG44 may include four red pixels R.

In some example embodiments of the present disclosure, as the unit pattern UPTT9 illustrated in FIG. 18B, each of the first, fourth, fifth, eighth, ninth, twelfth, thirteenth and sixteenth pixel groups PXG11, PXG22, PXG13, PXG24, PXG31, PXG42, PXG33 and PXG44 may include four white pixels W, each of the second and third pixel groups PXG12 and PXG21 may include four red pixels R, each of the sixth, seventh, tenth and eleventh pixel groups PXG14, PXG23, PXG32 and PXG41 may include four green pixels Q and each of the thirteenth and fifteenth pixel groups PXG34 and PXG43 may include four blue pixels B.

In some example embodiments of the present disclosure, as the unit pattern UPTT10 illustrated in FIG. 18C, each of the first, fourth, fifth, eighth, ninth, twelfth, thirteenth and sixteenth pixel groups PXG11, PXG22, PXG13, PXG24, PXG31, PXG42, PXG33 and PXG44 may include four white pixels W, each of the third and fifteenth pixel groups PXG21 and PXG43 may include four red pixels R, each of the second, sixth, tenth and fourteenth pixel groups PXG12, PXG14, PXG32 and PXG34 may include four green pixels (and each of the seventh and eleventh pixel groups PXG23 and PXG41 may include four blue pixels B.

Figure 19A:
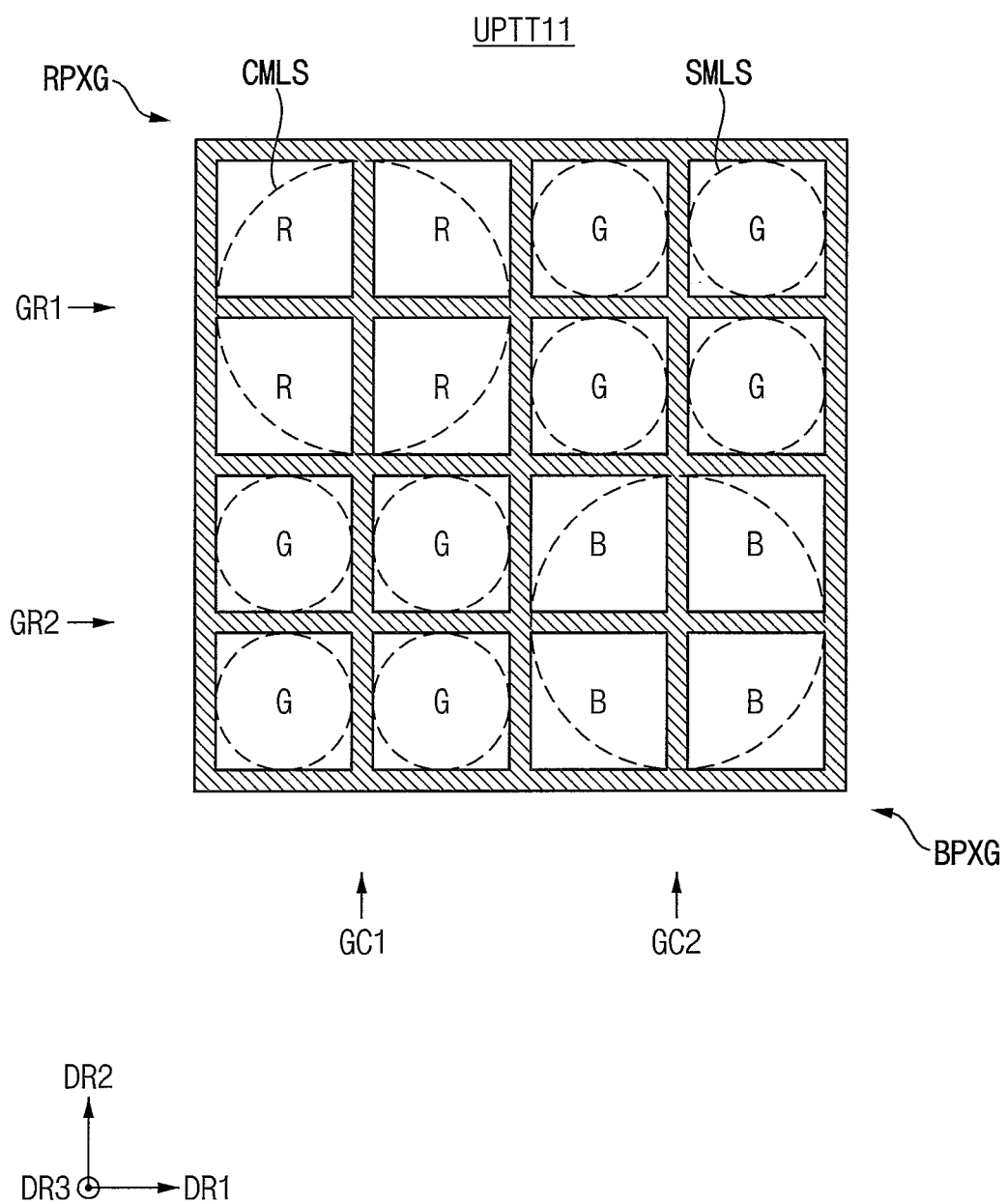
FIGS. 19A and 19B are plane views illustrating a unit pattern including pixel groups and unit pixels included in a pixel array according to example embodiments of the present disclosure.
Figure 19B:
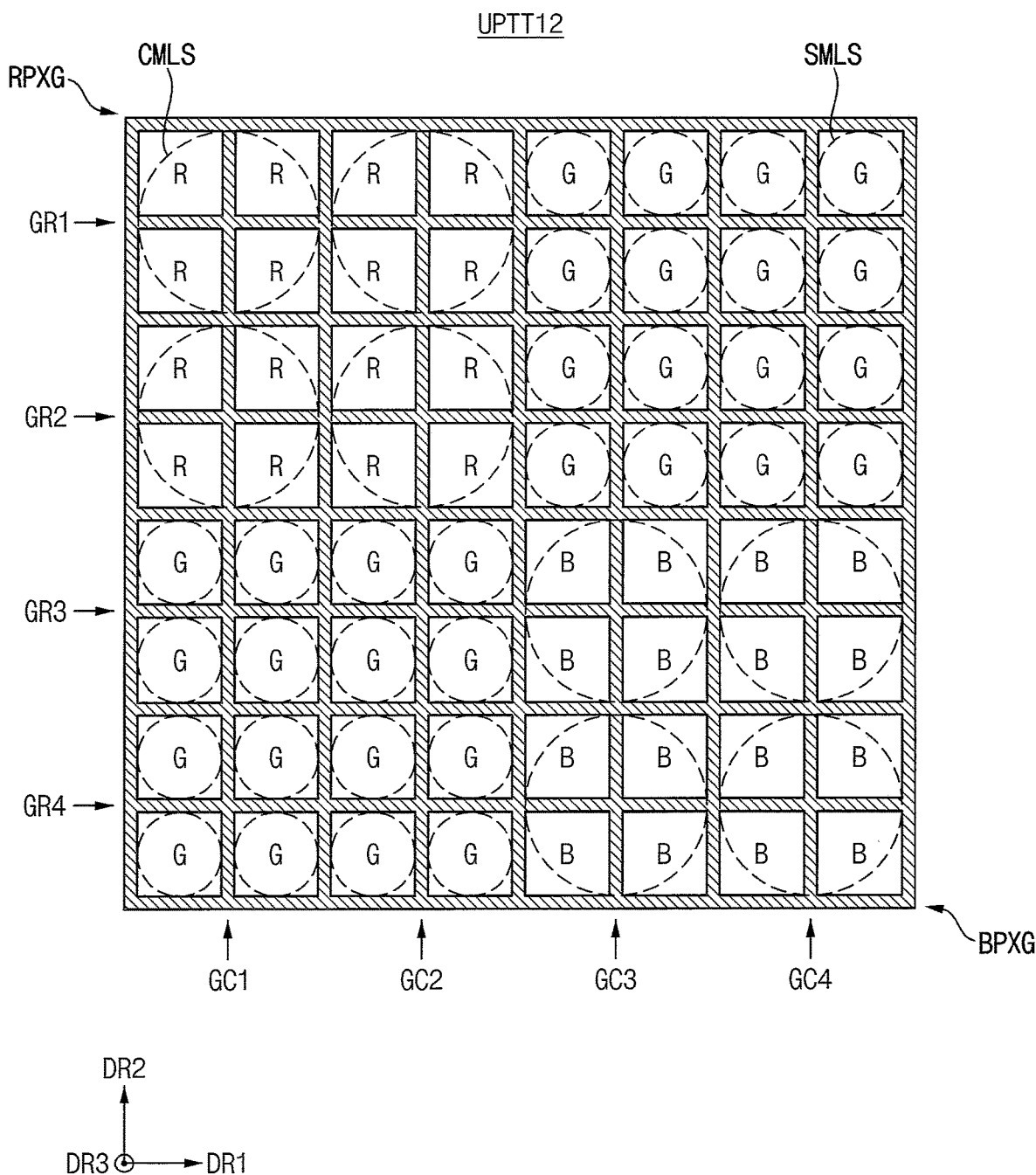

FIGS. 19A and 19B are plane views illustrating a unit pattern including pixel groups and unit pixels included in a pixel array according to example embodiments of the present disclosure.

Referring to FIGS. 19A and 19B, each of unit patterns UPTT11 and UPT12 having a mixed structure may include at least one red pixel group RPXG, at least one blue pixel group BPXG, and a plurality of green pixels G Each red pixel group RPXG may include four red pixels R arranged in a matrix form of two pixel rows and two pixel columns and focused by a single common microlens CMLS. Each blue pixel group BPXG may include four blue pixels B arranged in a matrix form of two pixel rows and two pixel columns and focused by a single common microlens CMLS. Each green pixel G may be focused by a single microlens SMLS. In other words, in FIG. 19A, two common microlenses CMLS are provided and eight single microlenses SMLS are provided.

In some example embodiments of the present disclosure, as illustrated in FIG. 19A, the unit pattern UPT11 may include the one red pixel group RPXG disposed in the first group row GR1 and the first group column GC1, the one blue pixel group BPXG disposed in the second group row GR2 and the second group column GC2, the four green pixels G arranged in a matrix form in the first group row GR1 and the second group column GC2, and the four green pixels G arranged in a matrix form in the second group row GR2 and the first group column GC1.

In some example embodiments of the present disclosure, as illustrated in FIG. 19B, the unit pattern UPT12 may include the four red pixel groups RPXG arranged in a matrix form of first and second group rows GR1 and GR2 and the first and second group columns GC1 and GC2, the four blue pixel groups BPXG arranged in a matrix form of third and fourth group rows GR3 and GR4 and the third and fourth group columns GC3 and GC4, the sixteen green pixels G arranged in a matrix form in the first and second group rows GR1 and GR2 and the third and fourth group columns GC3 and GC4, and the sixteen green pixels G arranged in a matrix form in the third and fourth group rows GR3 and GR4 and the first and second group columns GC1 and GC2.

In comparison with the unit patterns UPTT1 and UPTT8 of FIGS. 16A and 18A, each common microlens CMLS corresponding to the four green pixels G sharing the same color filter in each green pixel group may be substituted with the four individual microlenses SMLS in the unit patterns UPTT11 and UPTT12 of FIGS. 19A and 19B. As such, the performance of auto focusing and the image resolution may be properly determined by adjusting the ratio and the arrangement of pixel groups focused by the common microlens CMLS and the individual unit pixels focused by the individual microlens SMLS.

Figure 20A:
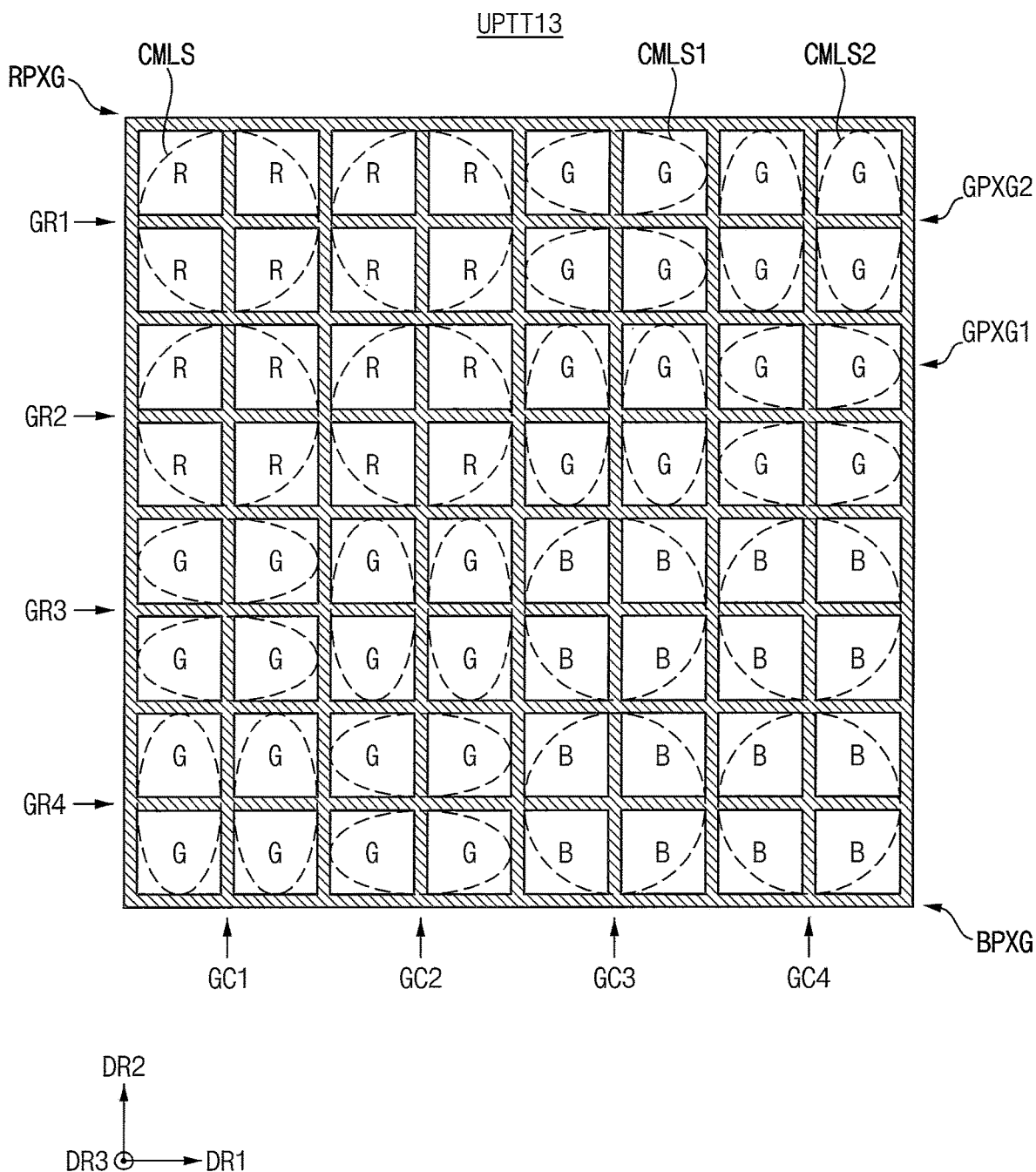
FIGS. 20A, 20B and 20C are plane views illustrating a unit pattern including pixel groups of different sizes included in a pixel array according to example embodiments of the present disclosure.
Figure 20B:
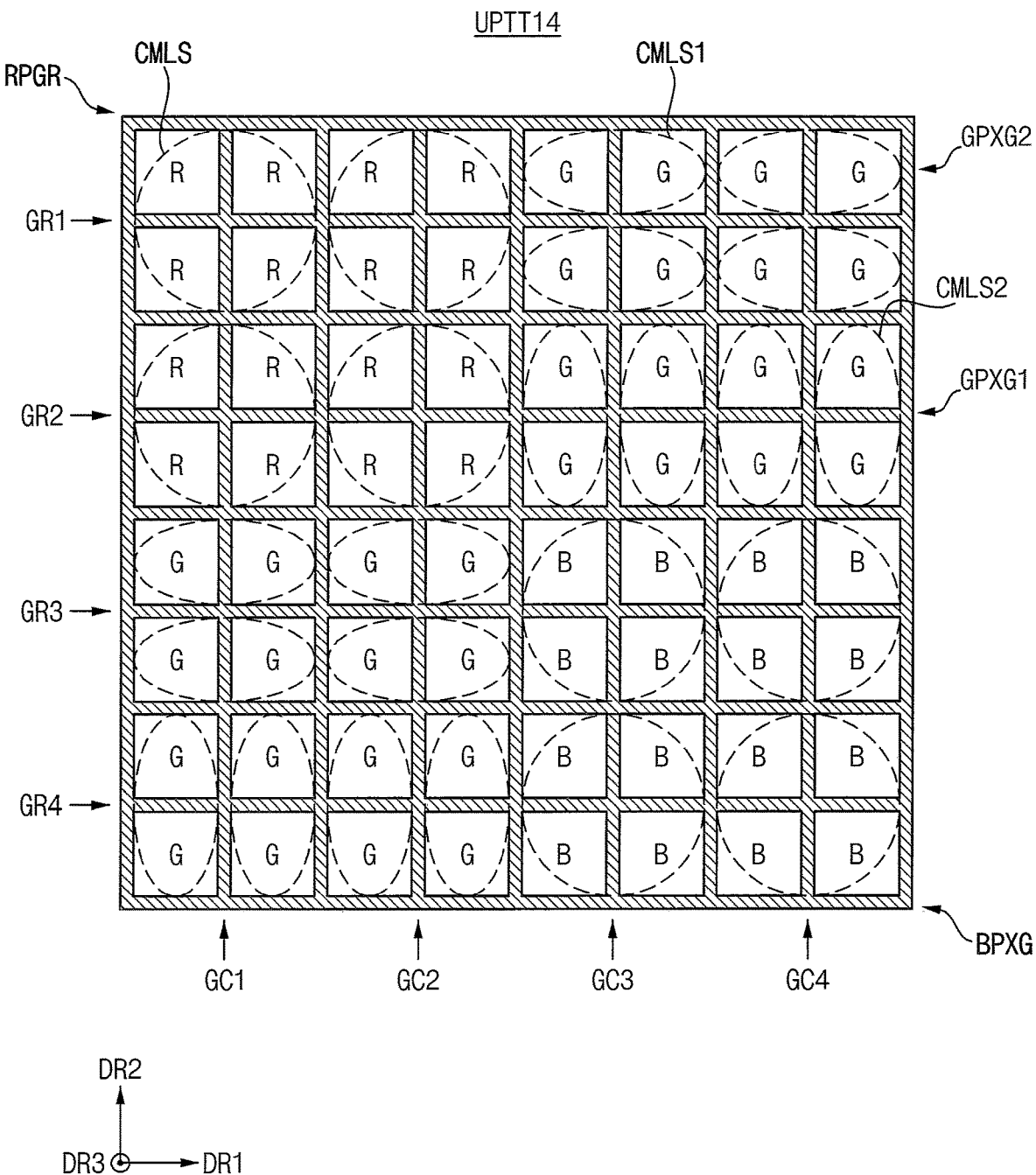
Figure 20C:
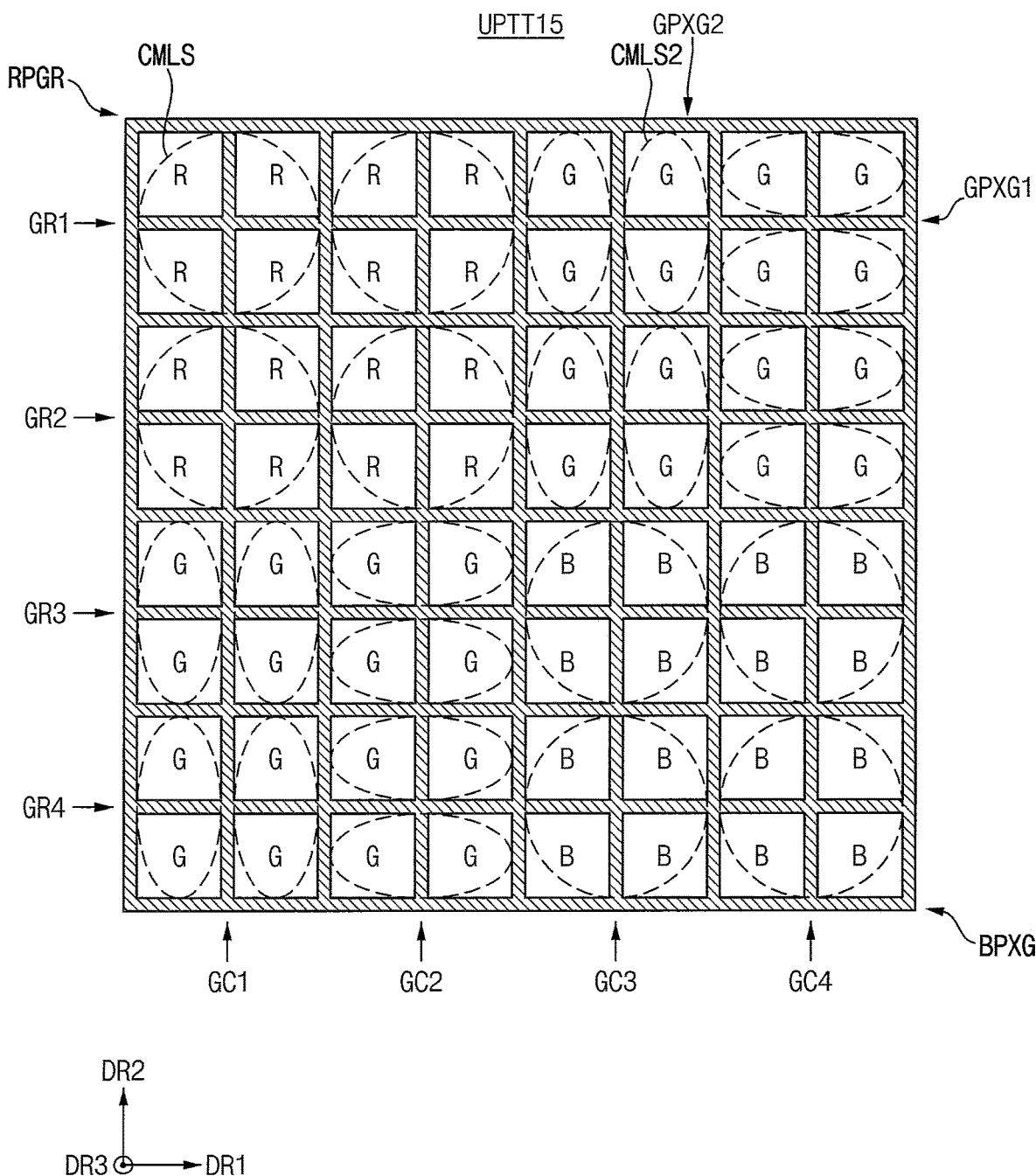

FIGS. 20A through 20C are plane views illustrating a unit pattern including pixel groups of different sizes included in a pixel array according to example embodiments of the present disclosure.

Referring to FIGS. 20A and 20C, each of unit patterns UPTT13 through UPTT15 having a mixed structure may include at least one red pixel group RPXG, at least one blue pixel group BPXG, at least one row green pixel group GPXG1 and at least one column green pixel group GPXG2. Each red pixel group RPXG may include four red pixels R arranged in a matrix form of two pixel rows and two pixel columns and focused by a single common microlens CMLS. Each blue pixel group BPXG may include four blue pixels B arranged in a matrix form of two pixel rows and two pixel columns and focused by a single common microlens CMLS. Each row green pixel group GPXG1 may include two green pixels G arranged in a matrix form of one pixel row and two pixel columns and focused by a single common microlens CMLS1 of an ellipse shape having a major axis in the first horizontal direction DR1. Each column green pixel group GPXG2 may include two green pixels G arranged in a matrix form of two pixel rows and one pixel column and focused by a single common microlens CMLS2 of an ellipse shape having a major axis in the second horizontal direction DR2. Two row green pixel groups GPXG1, which are arranged adjacent in the second horizontal direction DR2, may form one pair, and column green pixel groups GPXG2, which are arranged adjacent in the first horizontal direction DR1, may form one pair.

In some example embodiments of the present disclosure, as the unit pattern UPTT13 illustrated in FIG. 20A, two pairs of the row green pixel groups GPXG1 may be arranged adjacent in one diagonal direction and two pairs of the column green pixel groups GPXG2 may be arranged adjacent in the other diagonal direction.

In some example embodiments of the present disclosure, as the unit pattern UPTT14 illustrated in FIG. 20B, two pairs of the row green pixel groups GPXG1 may be arranged adjacent in the first horizontal direction DR1, and two pairs of the column green pixel groups GPXG2 may be arranged adjacent in the first horizontal direction DR1.

In some example embodiments of the present disclosure, as the unit pattern UPTT15 illustrated in FIG. 20C, two pairs of the row green pixel groups GPXG1 may be arranged adjacent in the second horizontal direction DR2, and two pairs of the column green pixel groups GPXG2 may be arranged adjacent in the second horizontal direction DR2.

In comparison with the unit patterns UPTT1 and UPTT8 of FIGS. 16A and 18A, each common microlens CMLS corresponding to the four green pixels G sharing the same color filter in each green pixel group GPXG may be substituted with the two common microlens CMLS1 or CMLS2 in the unit patterns UPTT13 through UPTT15 of FIGS. 20A through 20C. As such, the performance of auto focusing and the image resolution may be properly determined by adjusting the ratio and the arrangement of pixel groups focused by the common microlens CMLS, CMLS1 and CMLS2 of the various sizes.

Figure 21:
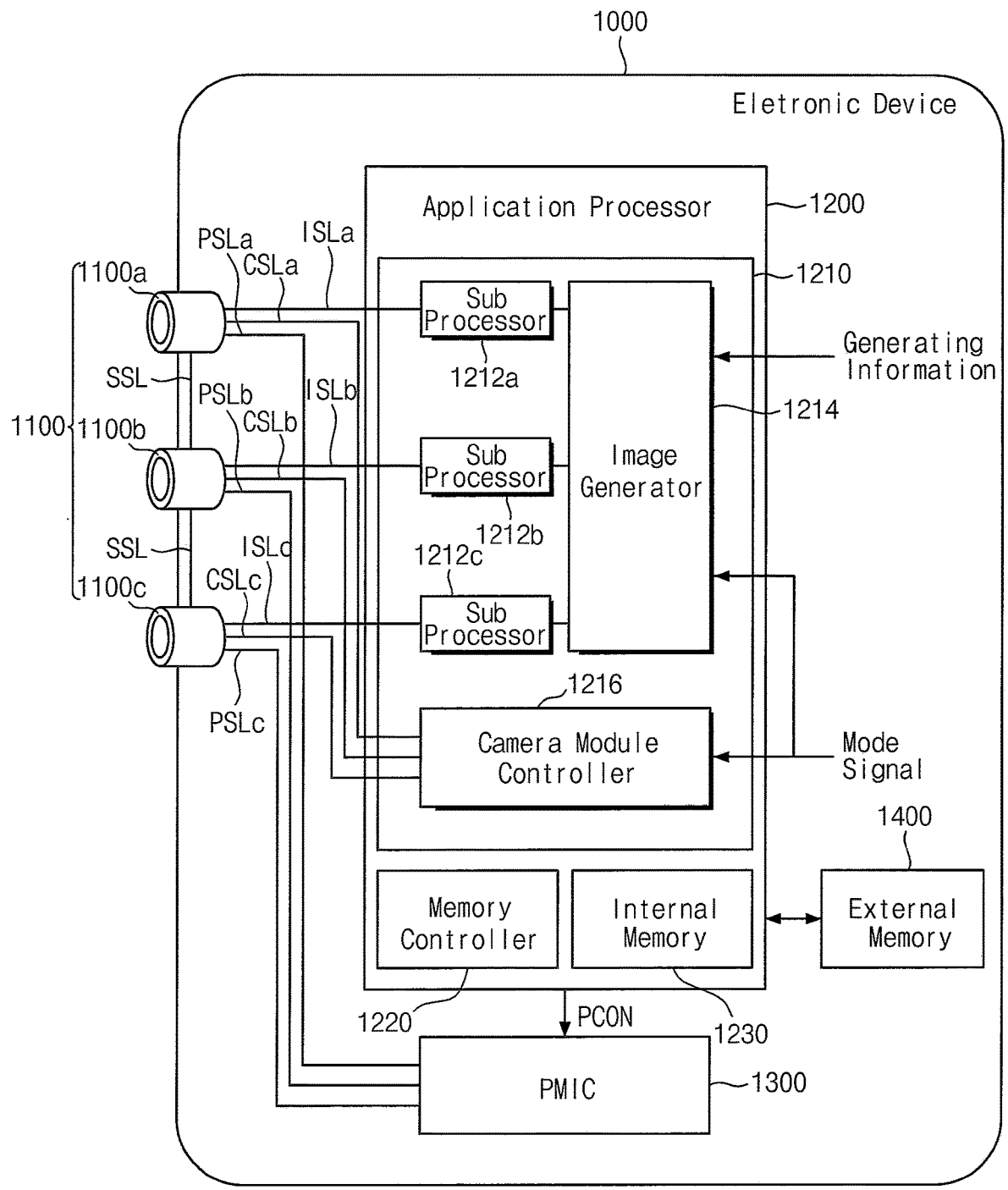
FIG. 21 is a block diagram illustrating an electronic device according to example embodiments of the present disclosure.
Figure 22:
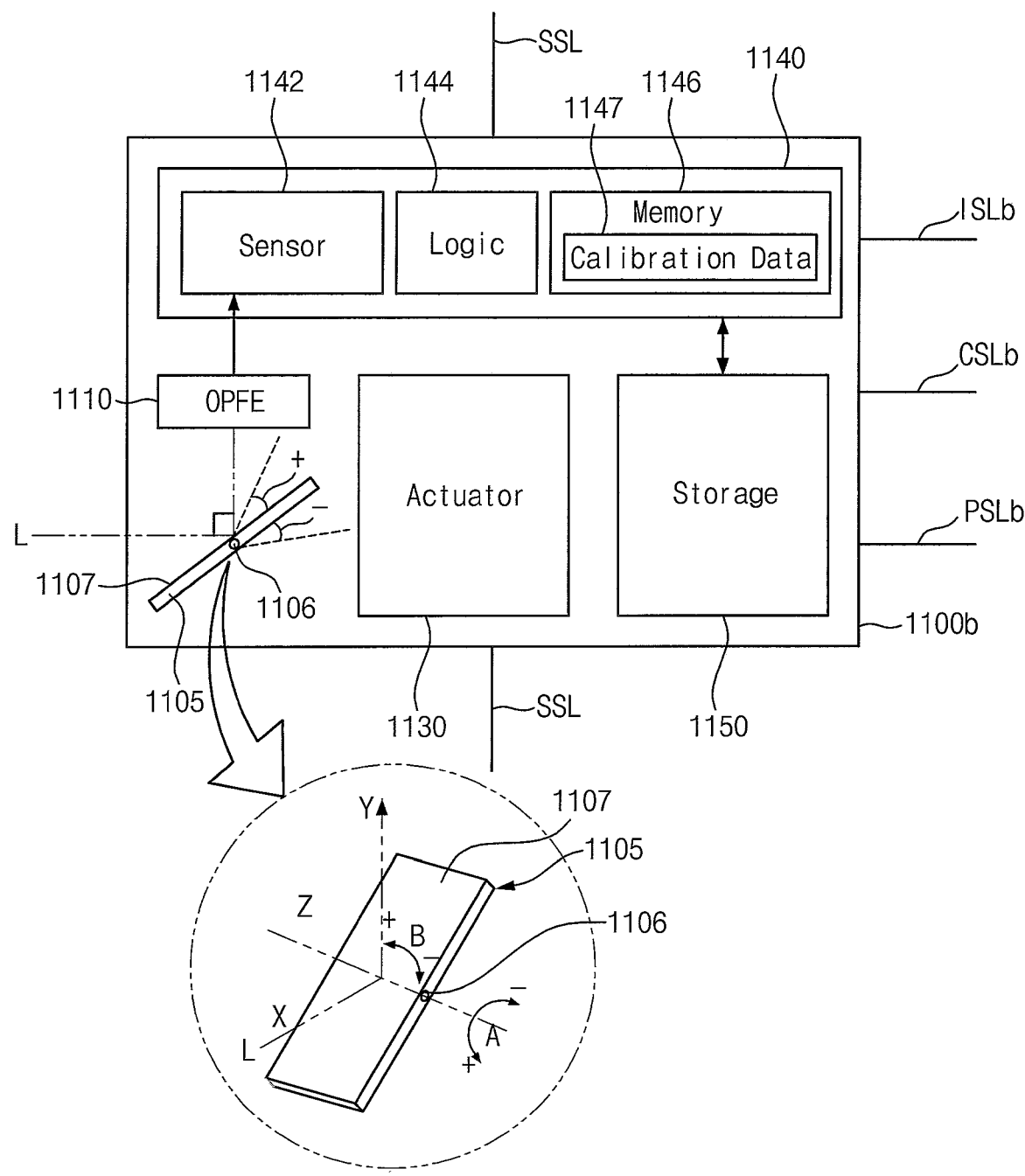
FIG. 22 is a block diagram illustrating a camera module included in the electronic device of FIG. 21.

FIG. 21 is a block diagram illustrating an electronic device according to example embodiments of the present disclosure, and FIG. 22 is a block diagram illustrating a camera module included in the electronic device of FIG. 21.

Referring to FIG. 21, an electronic device 1000 may include a camera module group 1100, and application processor 1200, a power management integrated circuit (PMIC) 1300 and an external memory 1400.

The camera module group 1100 may include a plurality of camera modules 1100a, 1100b and 1100c. FIG. 21 illustrates the three camera modules 1100a, 1100b and 1100c as an example, but example embodiments of the present disclosure are not limited to a particular number of camera modules. According to example embodiments of the present disclosure, the camera module group 1100 may include two camera modules, and four or more camera modules.

Hereinafter, an example configuration of the camera module 1100b is described with reference to FIG. 22. According to example embodiments of the present disclosure, the same descriptions may be applied to the other camera modules 1100a and 1100c.

Referring to FIG. 22, the camera module 1100b may include a prism 1105, an optical path folding element (OPFE) 1110, an actuator 1130, an image sensing device 1140 and a storage device 1150.

The prism 1105 may include a reflection surface 1107 to change a path of a light L incident on the prism 1105.

In some example embodiments of the present disclosure, the prism 1105 may change the path of the light L incident in a first direction X to the path in a second direction Y perpendicular to the first direction X. In addition, the prism 1105 may rotate the reflection surface 1107 around a center axis 1106 and/or rotate the center axis 1106 in the B direction to align the path of the reflected light along the second direction Y. In addition, the OPFE 1110 may move in a third direction perpendicular to the first direction X and the second direction Y.

In some example embodiments of the present disclosure, a rotation angle of the prism 1105 may be smaller than 15 degrees in the positive (+) A direction and greater than 15 degrees in the negative (−) A direction, but example embodiments are not limited thereto.

In some example embodiments of the present disclosure, the prism 1105 may rotate within 20 degrees in the positive B direction and the negative B direction.

In some example embodiments of the present disclosure, the prism 1105 may move the reflection surface 1106 in the third direction Z that is in parallel with the center axis 1106.

The OPFE 1110 may include optical lenses that are divided into m groups where m is a positive integer. The m lens group may move in the second direction Y to change an optical zoom ratio of the camera module 1100b. For example, the optical zoom ratio may be changed in a range of 3K, 5K, and so on by moving the m lens group, when K is a basic optical zoom ratio of the camera module 1100b.

The actuator 1130 may move the OPFE 1110 or the optical lens to a specific position. For example, the actuator 1130 may adjust the position of the optical lens for accurate sensing such that an image sensor 1142 may be located at a position corresponding to a focal length of the optical lens.

The image sensing device 1140 may include the image sensor 1142, a control logic 1144 and a memory 1146. The image sensor 1142 may capture or sense an image using the light provided through the optical lens. The control logic 1144 may control overall operations of the camera module 1100b. For example, the control logic 1144 may provide control signals through control signal line CSLb to control the operation of the camera module 1100b.

The memory 1146 may store information such as calibration data 1147 for the operation of the camera module 1100b. For example, the calibration data 1147 may include information for generation of image data based on the provided light, such as information on the above-described rotation angle, a focal length, information on an optical axis, and so on. When the camera module 1100b is implemented as a multi-state camera having a variable focal length depending on the position of the optical lens, the calibration data 1147 may include multiple focal length values and auto-focusing values corresponding to the multiple states.

The storage device 1150 may store the image data sensed using the image sensor 1142. The storage device 1150 may be disposed outside of the image sensing device 1140, and the storage device 1150 may be stacked with a sensor chip comprising the image sensing device 1140. The storage device 1150 may be implemented with an electrically erasable programmable read-only memory (EEPROM), but example embodiments are not limited thereto.

Referring to FIGS. 21 and 22, each of the camera modules 1100a, 1100b and 1100c may include the actuator 1130. In this case, the camera modules 1100a, 1100b and 1100c may include the same or different calibration data 1147 depending on the operations of the actuators 1130.

In some example embodiments of the present disclosure, one camera module 1100b may have a folded lens structure included the above-described prism 1105 and the OPFE 1110, and the other camera modules 1100a and 1100b may have a vertical structure without the prism 1105 and the OPFE 1110.

In some example embodiments of the present disclosure, one camera module 1100c may be a depth camera configured to measure distance information of an object using an infrared light. In this case, the application processor 1200 may merge the distance information provided from the depth camera 1100c and image data provided from the other camera modules 1100a and 1100b to generate a three-dimensional depth image.

In some example embodiments of the present disclosure, at least two camera modules among the camera modules 1100a, 1100b and 1100c may have different field of views, for example, through different optical lenses.

In some example embodiments of the present disclosure, each of the camera modules 1100a, 1100b and 1100c may be separated physically from each other. In other words, the camera modules 1100a, 1100b and 1100c may each include a dedicated image sensor 1142.

The application processor 1200 may include an image processing device 1210, a memory controller 1220 and an internal memory 1230. The application processor 1200 may be separated from the camera modules 1100a, 1100b and 1100c. For example, the application processor 1200 may be implemented as one chip and the camera modules 1100a, 1100b and 1100c may implemented as another chip or other chips.

The image processing device 1210 may include a plurality of sub processors 1212a, 1212b and 1212c, an image generator 1214 and a camera module controller 1216.

The image data generated by the camera modules 1100a, 1100b and 1100c may be provided to the sub processors 1212a, 1212b and 1212c through distinct image signal lines ISLa, ISLb and ISLc, respectively. For example, the transfer of the image data may be performed using a camera serial interface (CSI) based on the mobile industry processor interface (MIPI), but example embodiments of the present disclosure are not limited thereto.

In some example embodiments of the present disclosure, one sub processor may be assigned commonly to two or more camera modules. In this case, a multiplexer may be used to transfer the image data selectively from one of the camera modules to the shared sub processor.

The image data from the sub processors 1212a, 1212b and 1212c may be provided to the image generator 1214. The image generator 1214 may generate an output image using the image data from the sub processors 1212a, 1212b and 1212c according to image generating information or a mode signal. For example, the image generator 1214 may merge at least a portion of the image data from the camera modules 1100a, 1100b and 1100c having the different fields of view to generate the output image according to the image generating information or the mode signal. In addition, the image generator 1214 may select, as the output image, one of the image data from the camera modules 1100a, 1100b and 1100c according to the image generating information or the mode signal.

In some example embodiments of the present disclosure, the image generating information may include a zoom factor or a zoom signal. In some example embodiments of the present disclosure, the mode signal may be a signal based on a selection of a user.

When the image generating information is the zoom factor and the camera modules 1100a, 1100b and 1100c have the different field of views, the image generator 1214 may perform different operations depending on the zoom signal. For example, when the zoom signal is a first signal, the image generator 1214 may merge the image data from the different camera modules to generate the output image. When the zoom signal is a second signal different from the first signal, the image generator 1214 may select, as the output image, one of image data from the camera modules 1100a, 1100b and 1100c.

In some example embodiments of the present disclosure, the image generator 1214 may receive the image data of different exposure times from the camera modules 1100a, 1100b and 1100c. In this case, the image generator 1214 may perform high dynamic range (HDR) processing with respect to the image data from the camera modules 1100a, 1100b and 1100c to generate the output image having the increased dynamic range.

The camera module controller 1216 may provide control signals to the camera modules 1100a, 1100b and 1100c. The control signals generated by the camera module controller 1216 may be provided to the camera modules 1100a, 1100b and 1100c through the distinct control signal lines CSLa, CSLb and CSLc, respectively.

In some example embodiments of the present disclosure, one of the camera modules 1100a, 1100b and 1100c may be designated as a master camera according to the image generating information of the mode signal, and the other camera modules may be designated as slave cameras.

The camera module acting as the master camera may be changed according to the zoom factor or an operation mode signal. For example, when the camera module 1100a has the wider field of view than the camera module 1100b and the zoom factor indicates a lower zoom magnification, the camera module 1100b may be designated as the master camera. In contrast, when the zoom factor indicates a higher zoom magnification, the camera module 1100a may be designated as the master camera.

In some example embodiments of the present disclosure, the control signals provided from the camera module controller 1216 may include a synch enable signal. For example, when the camera module 1100b is the master camera and the camera modules 1100a and 1100c are the slave cameras, the camera module controller 1216 may provide the synch enable signal to the camera module 1100b. The camera module 1100b may generate a synch signal based on the provided synch enable signal and provide the synch signal to the camera modules 1100a and 1100c through a synch signal line SSL. As such, the camera modules 1100a, 1100b and 1100c may transfer the synchronized image data to the application processor 1200 based on the synch signal.

In some example embodiments of the present disclosure, the control signals provided from the camera module controller 1216 may include information on the operation mode. The camera modules 1100a, 1100b and 1100c may operate in a first operation mode or a second operation mode based on the information from the camera module controller 1216.

In the first operation mode, the camera modules 1100a, 1100b and 1100c may generate image signals with a first speed (e.g., a first frame rate) and encode the image signals with a second speed higher than the first speed (e.g., a second frame rate higher than the first frame rate) to transfer the encoded image signals to the application processor 1200. The second speed may be lower than thirty times the first speed. The application processor 1200 may store the encoded image signals in the internal memory 1230 or the external memory 1400. The application processor 1200 may read out and decode the encoded image signals to provide display data to a display device. For example, the sub processors 1212a, 1212b and 1212c may perform the decoding operation and the image generator 1214 may process the decoded image signals.

In the second operation mode, the camera modules 1100a, 1100b and 1100c may generate image signals with a third speed lower than the first speed (e.g., the third frame rate lower than the first frame rate) to transfer the generated image signals to the application processor 1200. In other words, the image signals that are not encoded may be provided to the application processor 1200. The application processor 1200 may process the received image signals or store the receive image signals in the internal memory 1230 or the external memory 1400.

The PMIC 1300 may provide a power supply voltage to the camera modules 1100a, 1100b and 1100c, respectively. For example, the PMIC 1300 may provide, under control of the application processor 1200, a first power to the camera module 1100a through a power line PSLa, a second power to the camera module 1100b through a power line PSLb, and a third power to the camera module 1100c through a power line PSLc.

The PMIC 1300 may generate the power respectively corresponding to the camera modules 1100a, 1100b and 1100c and control power levels, in response to a power control signal PCON from the application processor 1200. The power control signal PCON may include information on the power depending on the operation modes of the camera modules 1100a, 1100b and 1100c. For example, the operation modes may include a low power mode in which the camera modules 1100a, 1100b and 1100c operate in low powers. The power levels of the camera modules 1100a, 1100b and 1100c may be the same as or different from each other. In addition, the power levels may be changed dynamically or adaptively.

As such, the pixel array and the image sensor according to example embodiments of the present disclosure may implement an auto focusing function and also enhance image quality by reducing cross-talk between the unit pixels using the plurality of unit pixels sharing the common microlens and trench structures extending from the upper surface of the semiconductor substrate to the lower surface of the semiconductor substrate.

The present disclosure may be applied to any electronic devices and systems including an image sensor. For example, the present disclosure may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a vehicle navigation device, a video phone, a monitoring system, an auto focusing system, a tracking system, a motion detection system, etc.

The foregoing is illustrative of example embodiments of the present disclosure and is not to be construed as limiting thereof. Although a few example embodiments have been described, those skilled in the art will readily appreciate that many modifications are possible in the example embodiments without materially departing from the present disclosure.

What is claimed is:
1. A pixel array, comprising:
a plurality of pixel groups, each pixel group comprising:
a plurality of unit pixels respectively including photoelectric conversion elements disposed in a semiconductor substrate;
trench structures disposed in the semiconductor substrate and extending in a vertical direction from a first surface of the semiconductor substrate to a second surface of the semiconductor substrate to electrically and optically separate the photoelectric conversion elements from each other; and
a microlens disposed above or below the semiconductor substrate, the microlens covering all of the photoelectric conversion elements in the plurality of unit pixels to focus an incident light to the photoelectric conversion elements, wherein the trench structures includes:
an inter-group trench structure separating the pixel group from other pixel groups; and
inter-pixel trench structures separating the plurality of unit pixels included in the pixel group from each other,
wherein the inter-pixel trench structures include:
a first inter-pixel trench structure extending in a first horizontal direction and connected to first and second opposite sides of the inter-group trench structure and extending in the vertical direction from the first surface of the semiconductor substrate to the second surface of the semiconductor substrate; and
a second inter-pixel trench structure extending in a second horizontal direction perpendicular to the first horizontal direction and connected to third and fourth opposite sides of the inter-group trench structure and extending in the vertical direction from the first surface of the semiconductor substrate to the second surface of the semiconductor substrate,
wherein a first portion of the first inter-pixel trench structure at a central region of the pixel group has a first end in contact with the second surface of the semiconductor substrate, extends in the vertical direction from the second surface of the semiconductor substrate to a region in the semiconductor substrate such that a second end of the first portion is spaced away from the first surface of the semiconductor substrate, and a first portion of the second inter-pixel trench structure at the central region of the pixel group extends in the vertical direction from the second surface of the semiconductor substrate to the region in the semiconductor substrate spaced away from the first surface of the semiconductor substrate, and
wherein a second portion of the first inter-pixel trench structure is adjacent to and in contact with the first portion of the first inter-pixel trench structure and has a first end in contact with the second surface of the semiconductor substrate and a second end in contact with the first surface of the semiconductor substrate.

2. The pixel array of claim 1, wherein each pixel group includes four unit pixels arranged in a matrix of two pixel rows and two pixel columns, and
wherein each pixel group further comprises:
a common floating diffusion region disposed at its respective central region, the common floating diffusion region being shared by the four unit pixels.

3. The pixel array of claim 2, further comprising:
conduction lines electrically connecting four common floating diffusion regions of four pixel groups that are arranged in a matrix of two group rows and two group columns.

4. The pixel array of claim 1, wherein each trench structure includes a trench filled with a transparent dielectric material.

5. The pixel array of claim 1, wherein each trench structure includes a trench having inner surfaces coated with a transparent dielectric material and an inner space filled with a material different from the transparent dielectric material.

6. The pixel array of claim 1, wherein the first trench structure has a structure or a composition different from the second trench structure.

7. The pixel array of claim 1, wherein the plurality of unit pixels included in each pixel group share a single color filter.

8. The pixel array of claim 1, wherein the pixel array is divided into unit patterns that are arranged repeatedly in a first horizontal direction and a second horizontal direction perpendicular to the first horizontal direction.

9. The pixel array of claim 8, wherein at least one of the unit patterns includes first, second, third and fourth pixel groups that are arranged in a matrix of two group rows and two group columns, and
wherein each of the first through fourth pixel groups includes four unit pixels arranged in a matrix of two pixel rows and two pixel columns.

10. The pixel array of claim 8, wherein the at least one of the unit patterns includes:
first, second, third and fourth pixel groups that are arranged in a matrix of a first group row, a second group row, a first group column and a second group column;
fifth, sixth, seventh and eighth pixel groups that are arranged in a matrix of the first group row, the second group row, a third group column and a fourth group column;
ninth, tenth, eleventh and twelfth pixel groups that are arranged in a matrix of a third group row, a fourth group row, the first group column and the second group column; and
thirteenth, fourteenth, fifteenth and sixteenth pixel groups that are arranged in a matrix of the third group row, the fourth group row, the third group column and the fourth group column, and
wherein each of the first through sixteenth pixel groups includes four unit pixels arranged in a matrix of two pixel rows and two pixel columns.

11. The pixel array of claim 8, wherein at least one of the unit patterns includes:
a red pixel group including four red pixels arranged in a matrix of two pixel rows and two pixel columns and focused by a single microlens;
a blue pixel group including four blue pixels arranged in a matrix of two pixel rows and two pixel columns and focused by a single microlens; and
a plurality of green pixels, each green pixel focused by an individual microlens.

12. The pixel array of claim 8, wherein at least one of the unit patterns includes:
a red pixel group including four red pixels arranged in a matrix of two pixel rows and two pixel columns and focused by a single microlens;
a blue pixel group including four blue pixels arranged in a matrix of two pixel rows and two pixel columns and focused by a single microlens;
a row green pixel group including two green pixels arranged in a matrix of one pixel row and two pixel columns and focused by a single microlens; and
a column green pixel group including two green pixels arranged in a matrix of two pixel rows and one pixel column and focused by a single microlens.

13. An image sensor, comprising:
a pixel array including a plurality of pixel groups configured to collect photo charges generated by an incident light;
a row driver configured to drive the pixel array row by row; and
a controller configured to control the pixel array and the row driver,
each pixel group comprising:
a plurality of unit pixels respectively including photoelectric conversion elements disposed in a semiconductor substrate;
trench structures disposed in the semiconductor substrate and extending in a vertical direction from an upper surface of the semiconductor substrate to a lower surface of the semiconductor substrate to separate the photoelectric conversion elements from each other; and a microlens overlapping the semiconductor substrate, the microlens covering all of the photoelectric conversion elements in the plurality of unit pixels, wherein the trench structures include:

an inter-group trench structure separating the pixel group from other pixel groups;

a first inter-pixel trench structure extending in a first horizontal direction and connected to first and second opposite sides of the inter-group trench structure; and a second inter-pixel trench structure extending in a second horizontal direction perpendicular to the first horizontal direction and connected to third and fourth opposite sides of the inter-group trench structure, wherein a first portion of the first inter-pixel trench structure at a central region of the pixel group has a first end in contact with the second surface of the semiconductor substrate, extends in the vertical direction from the second surface of the semiconductor substrate to a region in the semiconductor substrate such that a second end of the first portion opposite to the first end in the vertical direction is spaced away from the first surface of the semiconductor substrate, and a first portion of the second inter-pixel trench structure at the central region of the pixel group extends in the vertical direction from the second surface of the semiconductor substrate to the region in the semiconductor substrate spaced away from the first surface of the semiconductor substrate, wherein second portions of the first inter-pixel trench structure adjacent to and in contact with the first portion of the first inter-pixel trench structure, extend in the vertical direction from the first surface of the semiconductor substrate to the second surface of the semiconductor substrate, and second portions of the second inter-pixel trench structure at the regions other than the central region of the pixel group extend in the vertical direction from the first surface of the semiconductor substrate to the second surface of the semiconductor substrate, and wherein first ends of the second portions of the first inter-pixel trench structure are in direct contact with the second surface of the semiconductor substrate and second ends of the second portions of the first inter-pixel trench structure opposite the first ends of the second portions of the first inter-pixel trench structure are in direct contact with the first surface of the semiconductor substrate.

14. A pixel array, comprising:

a plurality of pixel groups, each pixel group comprising:
 a plurality of unit pixels respectively including photoelectric conversion elements disposed in a semiconductor substrate;
 trench structures disposed in the semiconductor substrate and extending in a vertical direction from a first surface of the semiconductor substrate to a second surface of the semiconductor substrate to electrically and optically separate the photoelectric conversion elements from each other; and
 a microlens disposed above or below the semiconductor substrate, the microlens covering all of the photoelectric conversion elements in the plurality of unit pixels to focus an incident light to the photoelectric conversion elements, wherein the trench structures includes:

an inter-group trench structure separating the pixel group from other pixel groups;

a first inter-pixel trench structure extending in a first horizontal direction and connected to first and second opposite sides of the inter-group trench structure; and a second inter-pixel trench structure extending in a second horizontal direction perpendicular to the first horizontal direction and connected to third and fourth opposite sides of the inter-group trench structure, wherein a first portion of the first inter-pixel trench structure at a central region of the pixel group has a first end in contact with the second surface of the semiconductor substrate, extends in the vertical direction from the second surface of the semiconductor substrate to a region in the semiconductor substrate such that a second end of the first portion opposite to the first end in the vertical direction is spaced away from the first surface of the semiconductor substrate, and a first portion of the second inter-pixel trench structure at the central region of the pixel group extends in the vertical direction from the second surface of the semiconductor substrate to the region in the semiconductor substrate spaced away from the first surface of the semiconductor substrate, wherein second portions of the first inter-pixel trench structure adjacent to and in contact with the first portion of the first inter-pixel trench structure extend in the vertical direction from the first surface of the semiconductor substrate to the second surface of the semiconductor substrate, and second portions of the second inter-pixel trench structure at the regions other than the central region of the pixel group extend in the vertical direction from the first surface of the semiconductor substrate to the second surface of the semiconductor substrate, and wherein first ends of the second portions of the first inter-pixel trench structure are in direct contact with the second surface of the semiconductor substrate and second ends of the second portions of the first inter-pixel trench structure opposite the first ends of the second portions of the first inter-pixel trench structure are in direct contact with the first surface of the semiconductor substrate.

* * * * *